(12) United States Patent
Yamazaki et al.

(10) Patent No.: US 9,490,370 B2
(45) Date of Patent: Nov. 8, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Kiyoshi Kato, Kanagawa (JP); Shuhei Nagatsuka, Kanagawa (JP); Takanori Matsuzaki, Kanagawa (JP); Hiroki Inoue, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/873,278

(22) Filed: Oct. 2, 2015

(65) Prior Publication Data

US 2016/0027784 A1 Jan. 28, 2016

Related U.S. Application Data

(63) Continuation of application No. 13/900,581, filed on May 23, 2013, now Pat. No. 9,153,589, which is a continuation of application No. 12/978,805, filed on Dec. 27, 2010, now Pat. No. 8,450,783.

(30) Foreign Application Priority Data

Dec. 28, 2009 (JP) ................................ 2009-298891
Jan. 15, 2010 (JP) ................................ 2010-007519
Jul. 15, 2010 (JP) ................................ 2010-160946

(51) Int. Cl.
*H01L 29/12* (2006.01)
*H01L 29/786* (2006.01)
(Continued)

(52) U.S. Cl.
CPC ....... *H01L 29/7869* (2013.01); *G11C 16/0425* (2013.01); *H01L 27/105* (2013.01);
(Continued)

(58) Field of Classification Search
None
See application file for complete search history.

(56) References Cited

U.S. PATENT DOCUMENTS 4,466,081 A 8/1984 Masuoka
4,935,896 A 6/1990 Matsumura et al.
(Continued)

FOREIGN PATENT DOCUMENTS

CN 101164168 A 4/2008
CN 101258607 A 9/2008
(Continued)

OTHER PUBLICATIONS

Asakuma.N et al., "Crystallization and Reduction of Sol-Gel-Derived Zinc Oxide Films by Irradiation Ultraviolet Lamp", Journal of Sol-Gel Science and Technology, 2003, vol. 26, pp. 181-184.
(Continued)

*Primary Examiner* — Fei Fei Yeung Lopez
(74) *Attorney, Agent, or Firm* — Fish & Richardson P.C.

(57) ABSTRACT

The semiconductor device includes a source line, a bit line, a signal line, a word line, memory cells connected in parallel between the source line and the bit line, a first driver circuit electrically connected to the source line and the bit line through switching elements, a second driver circuit electrically connected to the source line through a switching element, a third driver circuit electrically connected to the signal line, and a fourth driver circuit electrically connected to the word line. The memory cell includes a first transistor including a first gate electrode, a first source electrode, and a first drain electrode, a second transistor including a second gate electrode, a second source electrode, and a second drain electrode, and a capacitor. The second transistor includes an oxide semiconductor material.

27 Claims, 26 Drawing Sheets

(51) Int. Cl.
  *H01L 27/115*   (2006.01)
  *H01L 29/788*   (2006.01)
  *H01L 29/792*   (2006.01)
  *G11C 16/04*    (2006.01)
  *H01L 27/105*   (2006.01)
  *H01L 27/12*    (2006.01)
  *H01L 27/108*   (2006.01)
  *H01L 27/11*    (2006.01)
  *H01L 49/02*    (2006.01)

(52) U.S. Cl.
  CPC ... *H01L 27/10802* (2013.01); *H01L 27/10805* (2013.01); *H01L 27/1156* (2013.01); *H01L 27/11551* (2013.01); *H01L 27/11563* (2013.01); *H01L 27/11568* (2013.01); *H01L 27/1225* (2013.01); *H01L 29/788* (2013.01); *H01L 29/7881* (2013.01); *H01L 29/78693* (2013.01); *H01L 29/792* (2013.01); *H01L 27/108* (2013.01); *H01L 27/11* (2013.01); *H01L 27/115* (2013.01); *H01L 27/11517* (2013.01); *H01L 28/40* (2013.01)

(56) References Cited

U.S. PATENT DOCUMENTS

| | | |
|---|---|---|
| 5,208,773 A | 5/1993 | Okitaka et al. |
| 5,349,366 A | 9/1994 | Yamazaki et al. |
| 5,731,856 A | 3/1998 | Kim et al. |
| 5,744,864 A | 4/1998 | Cillessen et al. |
| 5,770,483 A | 6/1998 | Kadosh et al. |
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,445,026 B1 | 9/2002 | Kubota et al. |
| 6,512,687 B1 | 1/2003 | Chen et al. |
| 6,515,892 B1 | 2/2003 | Itoh et al. |
| 6,536,013 B2 | 3/2003 | Kobayashi et al. |
| 6,563,174 B2 | 5/2003 | Kawasaki et al. |
| 6,646,300 B2 | 11/2003 | Ishii et al. |
| 6,727,522 B1 | 4/2004 | Kawasaki et al. |
| 6,762,951 B2 | 7/2004 | Itoh et al. |
| 6,825,525 B2 | 11/2004 | Ishii et al. |
| 6,876,569 B2 | 4/2005 | Itoh et al. |
| 7,009,243 B2 | 3/2006 | Ishii et al. |
| 7,023,721 B2 | 4/2006 | Itoh et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,476,613 B2 | 1/2009 | Kim |
| 7,489,290 B2 | 2/2009 | Shin |
| 7,501,293 B2 | 3/2009 | Ito et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 7,755,126 B2 | 7/2010 | Kondo |
| 7,786,548 B2 | 8/2010 | Osano et al. |
| 7,791,074 B2 | 9/2010 | Iwasaki |
| 7,859,889 B2 | 12/2010 | Kameshiro et al. |
| 7,935,582 B2 | 5/2011 | Iwasaki |
| 8,008,137 B2 | 8/2011 | Wu et al. |
| 8,207,756 B2 | 6/2012 | Shionoiri et al. |
| 8,432,187 B2 | 4/2013 | Kato et al. |
| 8,513,662 B2 | 8/2013 | Yabuta et al. |
| 8,530,246 B2 | 9/2013 | Ofuji et al. |
| 8,566,502 B2 | 10/2013 | Vaghani |
| 8,610,187 B2 | 12/2013 | Yamazaki et al. |
| 8,659,941 B2 | 2/2014 | Kamata et al. |
| 9,123,574 B2 | 9/2015 | Yamazaki et al. |
| 2001/0028059 A1 | 10/2001 | Emma et al. |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0128574 A1 | 7/2003 | Itoh et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0100835 A1 | 5/2004 | Sugibayashi et al. |
| 2004/0127038 A1 | 7/2004 | Carcia et al. |
| 2004/0170050 A1 | 9/2004 | Itoh et al. |
| 2005/0017302 A1 | 1/2005 | Hoffman |
| 2005/0128803 A1 | 6/2005 | Luk et al. |
| 2005/0162894 A1 | 7/2005 | Itoh et al. |
| 2005/0199959 A1 | 9/2005 | Chiang et al. |
| 2005/0199967 A1 | 9/2005 | Hoffman |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118844 A1 | 6/2006 | Kijima et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018163 A1 | 1/2007 | Chiang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0111245 A1 | 5/2008 | Osano et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |

(56) References Cited

U.S. PATENT DOCUMENTS

| | | |
|---|---|---|
| 2008/0258143 A1 | 10/2008 | Kim et al. |
| 2008/0296568 A1 | 12/2008 | Ryu et al. |
| 2008/0308804 A1 | 12/2008 | Akimoto et al. |
| 2008/0315193 A1 | 12/2008 | Kim et al. |
| 2009/0001436 A1 | 1/2009 | Kondo |
| 2009/0002590 A1 | 1/2009 | Kimura |
| 2009/0045397 A1 | 2/2009 | Iwasaki |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0078939 A1* | 3/2009 | Yamazaki ......... H01L 21/67144 257/59 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0278122 A1 | 11/2009 | Hosono et al. |
| 2009/0280600 A1 | 11/2009 | Hosono et al. |
| 2009/0315026 A1 | 12/2009 | Jeong et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0148178 A1 | 6/2010 | Godo et al. |
| 2010/0193785 A1 | 8/2010 | Kimura |
| 2010/0276689 A1 | 11/2010 | Iwasaki |
| 2010/0279462 A1 | 11/2010 | Iwasaki |
| 2011/0076790 A1 | 3/2011 | Ofuji et al. |
| 2011/0101351 A1 | 5/2011 | Yamazaki |
| 2011/0128777 A1 | 6/2011 | Yamazaki et al. |
| 2011/0147737 A1 | 6/2011 | Yamazaki et al. |
| 2011/0156027 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175081 A1 | 7/2011 | Goyal et al. |
| 2011/0175087 A1 | 7/2011 | Yamazaki et al. |
| 2011/0176348 A1 | 7/2011 | Yamazaki et al. |
| 2012/0049185 A1 | 3/2012 | Kimura |
| 2012/0295399 A1 | 11/2012 | Kim et al. |
| 2013/0134418 A1 | 5/2013 | Hayashi et al. |
| 2013/0200369 A1 | 8/2013 | Yamazaki et al. |
| 2014/0175431 A1 | 6/2014 | Yamazaki et al. |
| 2015/0287832 A1 | 10/2015 | Hayashi et al. |
| 2015/0364477 A1 | 12/2015 | Yamazaki et al. |

FOREIGN PATENT DOCUMENTS

| | | |
|---|---|---|
| CN | 101859711 A | 10/2010 |
| DE | 4108996 | 9/1991 |
| EP | 1737044 A | 12/2006 |
| EP | 1835535 A | 9/2007 |
| EP | 1965426 A | 9/2008 |
| EP | 2226847 A | 9/2010 |
| JP | 57-105889 A | 7/1982 |
| JP | 60-198861 A | 10/1985 |
| JP | 62-060191 A | 3/1987 |
| JP | 62-230043 A | 10/1987 |
| JP | 62-274773 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-268184 A | 11/1988 |
| JP | 03-272087 A | 12/1991 |
| JP | 05-251705 A | 9/1993 |
| JP | 06-251588 A | 9/1994 |
| JP | 06-260498 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-053164 A | 2/2001 |
| JP | 2001-053167 A | 2/2001 |
| JP | 2001-093989 A | 4/2001 |
| JP | 2001-230329 A | 8/2001 |
| JP | 2002-076356 A | 3/2002 |
| JP | 2002-093924 A | 3/2002 |
| JP | 2002-094029 A | 3/2002 |
| JP | 2002-289859 A | 10/2002 |
| JP | 2002-368141 A | 12/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 3781270 | 5/2006 |
| JP | 2007-073563 A | 3/2007 |
| JP | 2007-103918 A | 4/2007 |
| JP | 2007-122758 A | 5/2007 |
| JP | 2007-173515 A | 7/2007 |
| JP | 2007-294897 A | 11/2007 |
| JP | 2009-004787 A | 1/2009 |
| JP | 2009-016368 A | 1/2009 |
| JP | 2009-158663 A | 7/2009 |
| JP | 2009-206508 A | 9/2009 |
| JP | 2009-252283 A | 10/2009 |
| JP | 2009-535819 | 10/2009 |
| JP | 2009-276387 A | 11/2009 |
| JP | 2009-277702 A | 11/2009 |
| JP | 2010-183108 A | 8/2010 |
| KR | 95-0000501 | 1/1995 |
| KR | 2008-0053355 A | 6/2008 |
| KR | 2008-0077903 A | 8/2008 |
| TW | 508588 | 11/2002 |
| WO | WO-00/70682 | 11/2000 |
| WO | WO-2004/114391 | 12/2004 |
| WO | WO-2007/029844 | 3/2007 |
| WO | WO-2007/072628 | 6/2007 |
| WO | WO-2008/027392 | 3/2008 |
| WO | WO-2009/096608 | 8/2009 |
| WO | WO-2009/139482 | 11/2009 |
| WO | WO-2009/139483 | 11/2009 |
| WO | WO-2011/074392 | 6/2011 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Janotti.A et al., "Oxygen Vacancies in ZnO", Appl. Phys. Lett. (Applied Physics Letters) , 2005, vol. 87, pp. 122102-1-122102-3.

Janotti.A et al., "Native Point Defects in ZnO", Phys. Rev. B (Physical Review. B), Oct. 4, 2007, vol. 76, No. 16, pp. 165202-1-165202-22.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temeratures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Phsyics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J.

(56) References Cited

OTHER PUBLICATIONS

Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.
Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.
Shukuri.S et al., "A Complementary Gain Cell Technology for sub-1 V Supply DRAMs ", IEDM 92: Technical Digest of International Electron Devices Meeting, Dec. 13, 1992, pp. 1006-1008.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/JP2010/072065) Dated Mar. 15, 2011.
Written Opinion (Application No. PCT/JP2010/072065) Dated Mar. 15, 2011.
International Search Report (Application No. PCT/JP2010/072064) Dated Mar. 15, 2011.
Written Opinion (Application No. PCT/JP2010/072064) Dated Mar. 15, 2011.
Taiwanese Office Action (Application No. 99145815) Dated Nov. 21, 2014.
Chinese Office Action (Application No. 201080059557.2) Dated Dec. 24, 2014.
Taiwanese Office Action (Application No. 099144997) Dated Jul. 17, 2015.
European Search Report (Application No. 10840857.6) Dated Jun. 8, 2016.
Taiwanese Office Action (Application No. 104121318) Dated Jul. 4, 2016.

\* cited by examiner

SEMICONDUCTOR DEVICE

CROSS-REFERENCE TO RELATED APPLICATIONS

This application is a continuation of U.S. application Ser. No. 13/900,581, filed May 23, 2013, now allowed, which is a continuation of U.S. application Ser. No. 12/978,805, filed Dec. 27, 2010, now U.S. Pat. No. 8,450,783, which claims the benefit of foreign priority applications filed in Japan as Serial No. 2009-298891 on Dec. 28, 2009, Serial No. 2010-007519 on Jan. 15, 2010, and Serial No. 2010-160946 on Jul. 15, 2010, all of which are incorporated by reference.

TECHNICAL FIELD

The invention disclosed herein relates to a semiconductor device employing a semiconductor element and a manufacturing method thereof.

BACKGROUND ART

Storage devices employing semiconductor elements are roughly classified into two categories: a volatile storage device that loses stored data when power supply stops, and a non-volatile storage device that retains stored data even when power is not supplied.

A typical example of a volatile storage device is a dynamic random access memory (DRAM). A DRAM stores data in such a manner that a transistor included in a memory element is selected and electric charge is stored in a capacitor.

When data is read from a DRAM, electric charge in a capacitor is lost on the above-described principle; thus, another writing operation is necessary whenever data is read out. Moreover, a transistor included in a memory element has a leakage current (off-state current) between a source and a drain in an off state and electric charge flows into or out of a capacitor even if the transistor is not selected, whereby a data holding period is short. For that reason, another writing operation (refresh operation) is necessary at predetermined intervals, and it is difficult to sufficiently reduce power consumption. Furthermore, since stored data is lost when power supply stops, an additional storage device utilizing a magnetic material or an optical material is needed in order to hold the data for a long time.

Another example of a volatile storage device is a static random access memory (SRAM). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data storing time is extremely long (almost permanent) and refresh operation which is necessary in a volatile storage device is not needed (e.g., see Patent Document 1).

However, a gate insulating layer included in a storage element deteriorates by tunneling current generated in writing, so that the memory element stops its function after a predetermined number of writing operations. In order to reduce adverse effects of this problem, a method in which the number of writing operations for memory elements is equalized is employed, for example. However, a complicated peripheral circuit is needed to realize this method. Even when such a method is employed, the fundamental problem of lifetime is not resolved. In other words, a flash memory is not suitable for applications in which data is frequently rewritten.

In addition, high voltage is necessary for holding electric charge in the floating gate or removing the electric charge, and a circuit therefor is required. Further, it takes a relatively long time to inject or remove electric charge, and it is not easy to perform writing and erasing at higher speed.

REFERENCE

Patent Document

[Patent Document 1] Japanese Published Patent Application No. S57-105889

DISCLOSURE OF INVENTION

In view of the foregoing problems, an object of one embodiment of the invention disclosed herein is to provide a semiconductor device with a novel structure in which stored data can be retained even when power is not supplied, and does not have a limitation on the number times of writing.

In the disclosed invention, a semiconductor device is forming using a purified oxide semiconductor. The transistor formed using a purified oxide semiconductor has an extremely small leakage current, so that data can be stored for a long time.

One embodiment of the disclosed invention is a semiconductor device including a source line, a bit line, a signal line, a word line, memory cells connected in parallel between the source line and the bit line, a first driver circuit which is electrically connected to the source line through a first switching element and electrically connected to the bit line through a second switching element, a second driver circuit which is electrically connected to the source line through a third switching element, a third driver circuit which is electrically connected to the signal line, and a fourth driver circuit which is electrically connected to the word line. The memory cell includes a first transistor including a first gate electrode, a first source electrode, and a first drain electrode, a second transistor including a second gate electrode, a second source electrode, and a second drain electrode, and a capacitor. The first transistor is formed using a semiconductor material other than an oxide semiconductor. The second transistor is formed using an oxide semiconductor material. The first gate electrode, one of the second source electrode and the second drain electrode, and one of electrodes of the capacitor are electrically connected to each other. The source line, the first source electrode, and the other of the second source electrode and the second drain electrode are electrically connected to each other. The bit line and the first drain electrode are electrically connected to each other. The signal line and the second gate electrode are electrically connected to each other. The word line and the other of the electrodes of the capacitor are electrically connected to each other.

Another embodiment of the disclosed invention is a semiconductor device including a source line, a bit line, a signal line, a word line, memory cells connected in parallel between the source line and the bit line, a first driver circuit which is electrically connected to the source line through a first switching element and electrically connected to the bit line through a second switching element, a second driver circuit which is electrically connected to the bit line through a third switching element, a third driver circuit which is electrically connected to the signal line, and a fourth driver circuit which is electrically connected to the word line. The memory cell includes a first transistor including a first gate electrode, a first source electrode, and a first drain electrode, a second transistor including a second gate electrode, a second source electrode, and a second drain electrode, and a capacitor. The first transistor is formed using a semiconductor material other than an oxide semiconductor. The second transistor is formed using an oxide semiconductor material. The first gate electrode, one of the second source electrode and the second drain electrode, and one of electrodes of the capacitor are electrically connected to each other. The source line and the first source electrode are electrically connected to each other. The bit line, the other of the second source electrode and the second drain electrode, and the first drain electrode are electrically connected to each other. The signal line and the second gate electrode are electrically connected to each other. The word line and the other of the electrodes of the capacitor are electrically connected to each other.

Another embodiment of the disclosed invention is a semiconductor device including n (n is a natural number) bit lines, n2 (n2 is the smallest natural number greater than or equal to n/2) source lines, m (m is a natural number) signal lines, m word lines, (m×n) memory cells connected in parallel between the source lines and the bit lines, a first driver circuit which is electrically connected to the source line through a first switching element and electrically connected to the bit line through a second switching element, a second driver circuit which is electrically connected to the bit line through a third switching element, a third driver circuit which is electrically connected to the signal line, and a fourth driver circuit which is electrically connected to the word line. One source line is shared by adjacent two memory cells in the same row. Each of the memory cells includes a first transistor including a first gate electrode, a first source electrode, and a first drain electrode, a second transistor including a second gate electrode, a second source electrode, and a second drain electrode, and a capacitor. The first transistor is formed using a semiconductor material other than an oxide semiconductor. The second transistor is formed using an oxide semiconductor material. The first gate electrode, one of the second source electrode and the second drain electrode, and one of electrodes of the capacitor are electrically connected to each other. The source line and the first source electrode are electrically connected to each other. The bit line, the first drain electrode, and the other of the second source electrode and the second drain electrode are electrically connected to each other. The signal line and the second gate electrode are electrically connected to each other. The word line and the other of the electrodes of the capacitor are electrically connected to each other.

In the above, a structure can be employed in which a control signal of the first switching element is de-asserted in writing data and asserted during reading data. A control signal of the second switching element is de-asserted in writing data and asserted during reading data. A control signal of the third switching element is asserted in writing data and de-asserted during reading data.

Further, in the above, the first transistor can have a structure in which a first channel formation region formed using a semiconductor material other than an oxide semiconductor, impurity regions provided so that the first channel formation region is sandwiched therebetween, a first gate insulating layer over the channel formation region, the first gate electrode over the first gate insulating layer, and the first source electrode and the first drain electrode which are electrically connected to the impurity regions are included. Furthermore, as the semiconductor material other than an oxide semiconductor, single crystal silicon can be used. Moreover, it is preferable that the first transistor operate at higher speed than the second transistor.

Further, in the above, the second transistor can have a structure in which the second source electrode and the second drain electrode which are provided above the first transistor, a second channel formation region which is formed using an oxide semiconductor material and is electrically connected to the second source electrode and the second drain electrode, a second gate insulating layer over the second channel formation region, and a second gate electrode over the second gate insulating layer are included.

In the above, the capacitor can include the second source electrode or the second drain electrode, an oxide semiconductor layer, the second gate insulating layer, and an electrode for the capacitor over the second gate insulating layer.

Note that although the transistor is formed using an oxide semiconductor material in the above, the disclosed invention is not limited to this. A material which can realize the off-current characteristics equivalent to those of the oxide semiconductor material, such as a wide gap material like silicon carbide (more specifically, a semiconductor material with an energy gap Eg larger than 3 eV) may be used.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely small, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

Further, in a semiconductor device according to the disclosed invention, high voltage is not needed to write data, and deterioration of the element does not become a problem. For example, unlike a conventional non-volatile memory, it is not necessary to inject and extract electrons into and from a floating gate, so that a problem such as deterioration of a gate insulating layer does not occur at all. That is, the semiconductor device according to the disclosed invention has no limitation on the number of times of rewriting, which is a problem of a conventional non-volatile memory, and reliability thereof is drastically improved. Further, writing of data is performed depending on an on state and an off state of the transistor, so that high-speed operation can be easily realized. Additionally, there is an advantage that operation for erasing data is not needed.

Since a transistor including a material other than an oxide semiconductor can operate at sufficiently high speed, when it is combined with a transistor including an oxide semiconductor, a semiconductor device can perform operation (e.g., reading data) at sufficiently high speed. Further, a transistor including a material other than an oxide semiconductor can preferably realize a variety of circuits (e.g., a logic circuit or a driver circuit) which require high speed operation.

A semiconductor device with a novel feature can be realized by including both the transistor including a material other than an oxide semiconductor and the transistor including an oxide semiconductor.

BRIEF DESCRIPTION OF DRAWINGS

In the accompanying drawings:
FIG. 2 is a circuit diagram of a semiconductor device.

BEST MODE FOR CARRYING OUT THE INVENTION

Figures 1, 1A:
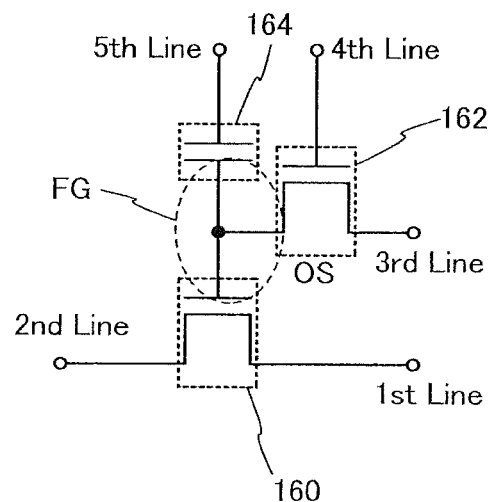
FIGS. 1A-1 and 1A-2 are circuit diagrams of a semiconductor device.

Hereinafter, examples of embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments and examples.

Note that for the easy understanding, the position, size, range, and the like of each component illustrated in the drawings and the like are not actual ones in some cases. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a circuit configuration and operation of a semiconductor device according to one embodiment of the disclosed invention will be described with reference to FIGS. 1A-1 and 1A-2. Note that in each of circuit diagrams, "OS" may be written beside a transistor in order to indicate that the transistor includes an oxide semiconductor.

In the semiconductor device illustrated in FIG. 1A-1, a first wiring (a 1st Line) is electrically connected to a source electrode of a transistor 160, and a second wiring (a 2nd Line) is electrically connected to a drain electrode of the transistor 160. A gate electrode of the transistor 160 and one of a source electrode and a drain electrode of a transistor 162 are electrically connected to one of electrodes of a capacitor 164. A third wiring (a 3rd Line) is electrically connected to the other of the source electrode and the drain electrode of the transistor 162, and a fourth wiring (a 4th Line) is electrically connected to a gate electrode of the transistor 162. A fifth wiring (a 5th Line) is electrically connected to the other of the electrodes of the capacitor 164.

Here, a transistor including an oxide semiconductor is used as the transistor 162. A transistor including an oxide semiconductor has a characteristic of a significantly small off-state current. Therefore, when the transistor 162 is turned off, a potential of the gate electrode of the transistor 160 can be held for an extremely long time. Provision of the capacitor 164 facilitates holding of electric charge given to the gate electrode of the transistor 160 and reading of stored data.

Note that the transistor 162 including an oxide semiconductor has a channel length (L) of greater than or equal to 10 nm and less than or equal to 1000 nm; therefore, power consumption is small and operation speed is extremely high.

The semiconductor device illustrated in FIG. 1A-1 utilizes a characteristic in which the potential of the gate electrode of the transistor 160 can be held, thereby writing, storing, and reading data as follows.

First, writing and storing of data will be described. A potential of the fourth wiring is set to a potential at which the transistor 162 is turned on, so that the transistor 162 is turned on. Accordingly, a potential of the third wiring is supplied to the gate electrode of the transistor 160 and the capacitor 164. That is, predetermined electric charge is given to the gate electrode of the transistor 160 (writing). Here, one of electric charges for supply of two different potentials (hereinafter referred to as a low-level electric charge and a high-level electric charge) is given to the gate electrode of the transistor 160. After that, the potential of the fourth wiring is set to a potential which allows the transistor 162 to be turned off, so that the transistor 162 is turned off. Thus, the electric charge given to the gate electrode of the transistor 160 is held (holding).

Since the off-state current of the transistor 162 is significantly small, the electric charge of the gate electrode of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of electric charge held in the gate electrode of the transistor 160. This is because in general, when the transistor 160 is an n-channel transistor, an apparent threshold voltage $V_{th\_H}$ in the case where the high-level electric charge is given to the gate electrode of the transistor 160 is lower than an apparent threshold voltage $V_{th\_L}$ in the case where the low-level electric charge is given to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby electric charge given to the gate electrode of the transistor 160 can be determined. For example, in the case where the high-level electric charge is given in writing, when the potential of the fifth wiring is set to $V_0$ ($>V_{th\_H}$), the transistor 160 is turned on. In the case where the low-level electric charge is given in writing, even when the potential of the fifth wiring is set to $V_0$ ($<V_{th\_L}$), the transistor 160 remains in an off state. Therefore, the stored data can be read with the use of the potential of the second wiring.

Note that in the case where memory cells are arrayed to be used, only data of desired memory cells is needed to be read. Thus, in order that data of predetermined memory cells may be read and data of the other memory cells may not be read, a potential which allows the transistor 160 to be turned off regardless of a state of the gate electrode, that is, a potential lower than $V_{th\_H}$ may be applied to fifth wirings of the memory cells whose data is not to be read, in the case where the transistors 160 are connected in parallel between the memory cells. Further, in the case where the transistors 160 are connected in series between the memory cells, a potential which allows the transistor 160 to be turned on regardless of a state of the gate electrode, that is, a potential higher than $V_{th\_L}$ may be applied to fifth wirings of the memory cells whose data is not to be read.

Next, rewriting of data will be described. Rewriting of data is performed in a manner similar to that of the writing and holding of data. That is, the potential of the fourth wiring is set to a potential which allows the transistor 162 to be turned on, whereby the transistor 162 is turned on. Accordingly, the potential of the third wiring (potential related to new data) is supplied to the gate electrode of the transistor 160 and the capacitor 164. After that, the potential of the fourth wiring is set to a potential which allows the transistor 162 to be turned off, whereby the transistor 162 is turned off. Accordingly, electric charge related to new data is given to the gate electrode of the transistor 160.

In the semiconductor device according to the disclosed invention, data can be directly rewritten by another writing of data as described above. Therefore, extracting of electric charge from a floating gate with the use of a high voltage, which is needed in a flash memory or the like, is not necessary and thus, reduction in operation speed, which is attributed to erasing operation, can be suppressed. In other words, high-speed operation of the semiconductor device can be realized.

Note that the source electrode or the drain electrode of the transistor 162 is electrically connected to the gate electrode of the transistor 160, thereby having an effect similar to that of a floating gate of a floating gate transistor used for a nonvolatile memory element. Therefore, a portion in the drawing where the source electrode or the drain electrode of the transistor 162 is electrically connected to the gate electrode of the transistor 160 is called a floating gate portion FG in some cases. When the transistor 162 is off, the floating gate portion FG can be regarded as being embedded in an insulator and thus electric charge is held in the floating gate portion FG. The amount of off-state current of the transistor 162 including an oxide semiconductor is smaller than or equal to one hundred thousandth of the amount of off-state current of a transistor including silicon or the like; thus, loss of the electric charge accumulated in the floating gate portion FG due to a leakage current of the transistor 162 is negligible. That is, with the transistor 162 including an oxide semiconductor, a nonvolatile memory device which can store data without being supplied with power can be realized.

For example, when the off-state current of the transistor 162 is 10 zA/μm (1 zA (zeptoampere) is $1\times10^{-21}$ A) or less at room temperature and the capacitance value of the capacitor 164 is approximately 10 fF, data can be stored for $10^4$ seconds or longer. Needless to say, the storage time depends on transistor characteristics and the capacitance value.

Further, in that case, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limitation on the number of times of writing in principle. Furthermore, a high voltage needed for writing or erasing in a conventional floating gate transistor is not necessary.

Figures 1, 1A, 2:
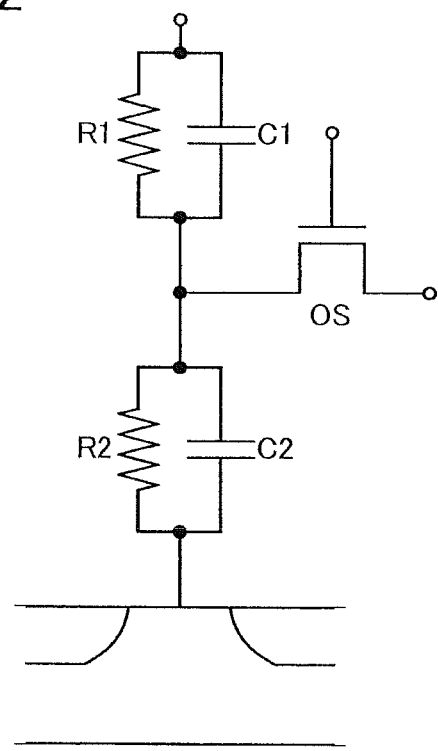
Figure 2:
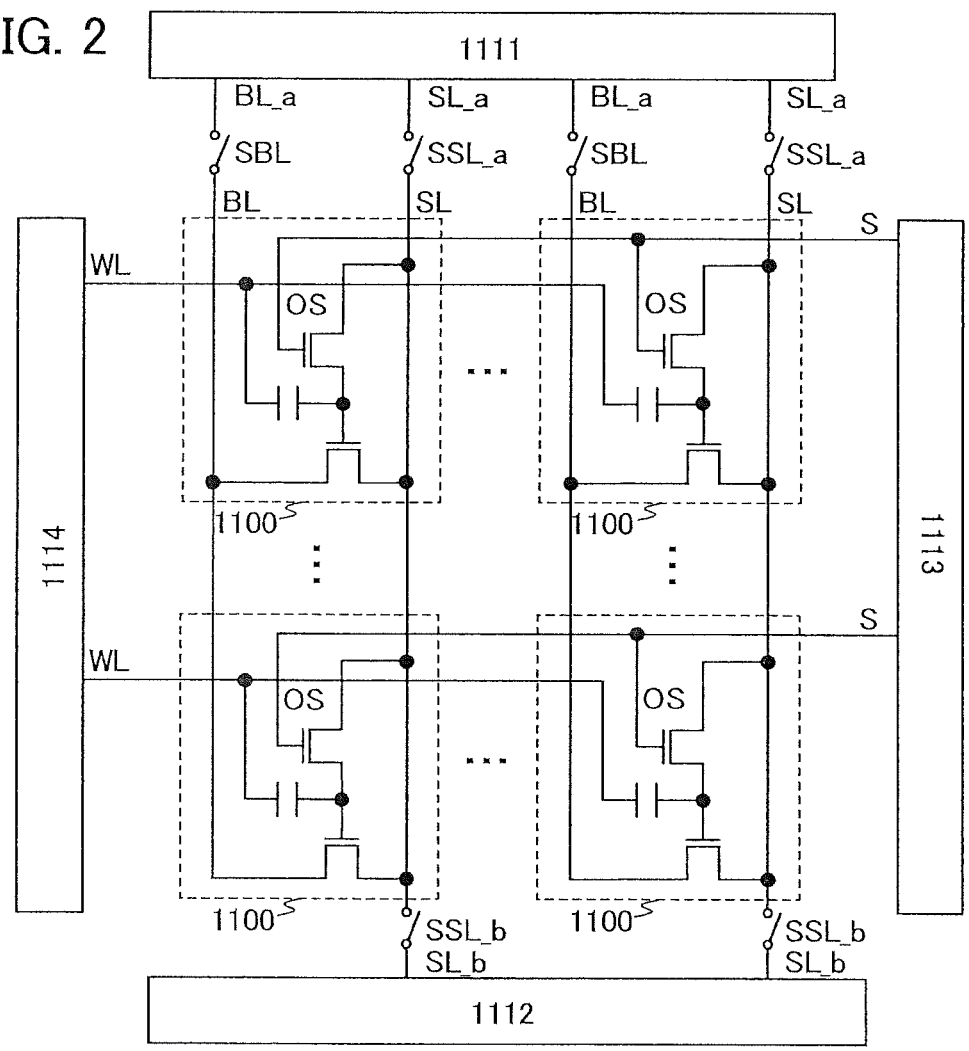

The components such as transistors in the semiconductor device in FIG. 1A-1 can be regarded as including a resistor and a capacitor as shown in FIG. 1A-2. That is, in FIG. 1A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance value C2 corresponds to the capacitance value of so-called gate capacitance (capacitance formed between the gate electrode and the source electrode or the drain electrode and capacitance formed between the gate electrode and the channel formation region).

An electric charge holding period (also referred to as a data storing period) is determined mainly by an off-state current of the transistor 162 under the conditions that gate leakage of the transistor 162 is sufficiently small and that R1 is greater than or equal to ROS and R2 is greater than or equal to ROS, where the resistance value (also referred to as effective resistance) between the source electrode and the drain electrode in the case where the transistor 162 is off is ROS.

On the other hand, when the conditions are not met, it is difficult to sufficiently secure the holding period even if the off-state current of the transistor 162 is small enough. This is because a leakage current other than the off-state current of the transistor 162 (e.g., a leakage current generated between the source electrode and the gate electrode) is large. Thus, it can be said that the semiconductor device disclosed in this embodiment desirably satisfies the above relation.

It is desirable that C1 is larger than or equal to C2. When C1 is larger, variation in the potential of the fifth wiring can be suppressed when the potential of the floating gate portion FG is controlled by the fifth wiring (e.g., at the time of reading).

When the above relation is satisfied, a more preferable semiconductor device can be realized. Note that R1 and R2 are controlled by gate insulating layers of the transistor 160 and the transistor 162. This is also applied to C1 and C2. Therefore, the material, the thickness, and the like of the gate insulating layers are desirably set as appropriate so that the above relation is satisfied.

In the semiconductor device described in this embodiment, the floating gate portion FG has an effect similar to that of a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of factors inhibiting high integration of the semiconductor device. The factor is attributed to a basic principle of a flash memory, in which a tunneling current flows in applying a high electrical field.

Further, because of the above principle of a flash memory, deterioration of an insulating film proceeds and thus another problem of the limit on the number of times of rewriting (approximately $10^4$ to $10^5$ times) occurs.

The semiconductor device according to the disclosed invention is operated by switching of a transistor including an oxide semiconductor and does not use the above-described principle of electric charge injection by a tunneling current. That is, a high electrical field for electric charge injection is not necessary unlike a flash memory. Accordingly, it is not necessary to consider an influence of a high electrical field from a control gate on an adjacent cell, which facilitates high integration.

Further, electric charge injection by a tunneling current is not utilized, which means that there is no cause for deterioration of a memory cell. In other words, the semiconductor device according to the disclosed invention has higher durability and reliability than a flash memory.

In addition, it is also advantageous that a high electrical field is unnecessary and a large peripheral circuit (such as a booster circuit) is unnecessary, as compared to a flash memory.

In the case where the relative permittivity $\epsilon r1$ of the insulating layer included in the capacitor 164 is different from the relative permittivity $\epsilon r2$ of the insulating layer included in the transistor 160, it is easy to satisfy that C1 greater than or equal to C2 while the relation 2·S2 is greater than or equal to S1 (desirably, S2 is greater than or equal to S1) is satisfied where S1 is the area of the insulating layer include in the capacitor 164 and S2 is the area of the insulating layer included in a gate capacitor of the transistor 160. That is, it is easy to satisfy that C1 greater than or equal to C2 while reducing the area of the insulating layer included in the capacitor 164. Specifically, for example, a film formed of a high-k material such as hafnium oxide or a stack of a film formed of a high-k material such as hafnium oxide and a film formed of an oxide semiconductor is used for the insulating layer included in the capacitor so that $\epsilon r1$ can be set to 10 or more, preferably 15 or more, and silicon oxide is used for the insulating layer included in the gate capacitor so that $\epsilon r2$ can be set to 3 to 4.

Combination of such structures enables higher integration of the semiconductor device according to the disclosed invention.

Note that an n-channel transistor in which electrons are majority carriers is used in the above description; it is needless to say that a p-channel transistor in which holes are majority carriers can be used instead of the n-channel transistor.

As described above, a semiconductor device according to one embodiment of the disclosed invention has a nonvolatile memory cell including a writing transistor where a leakage current (off-state current) between a source and a drain in an off state is small, a reading transistor formed of a semiconductor material different from that of the writing transistor, and a capacitor.

The off-state current of the writing transistor is 100 zA ($1 \times 10^{-19}$ A) or less, preferably 10 zA ($1 \times 10^{-20}$ A) or less, more preferably 1 zA ($1 \times 10^{-21}$ A) or less at ambient temperature (e.g., 25° C.). In the case of general silicon, it is difficult to achieve a small off-state current as described above. However, in a transistor obtained by processing an oxide semiconductor under an appropriate condition, a small off-state current can be achieved. Therefore, a transistor including an oxide semiconductor is preferably used as the writing transistor.

In addition, a transistor including an oxide semiconductor has a small subthreshold swing (S value), so that the switching rate can be sufficiently high even if mobility is relatively low. Therefore, by using the transistor as the writing transistor, rising of a writing pulse given to the floating gate portion FG can be very sharp. Further, an off-state current is small and thus, the amount of electric charge held in the floating gate portion FG can be reduced. That is, by using a transistor including an oxide semiconductor as a writing transistor, rewriting of data can be performed at high speed.

As for the reading transistor, although there is no limitation on off-state current, it is desirable to use a transistor which operates at high speed in order to increase the reading rate. For example, a transistor with a switching rate of 1 nanosecond or faster is preferably used as the reading transistor.

Data is written to the memory cell by turning on the writing transistor so that a potential is supplied to a node where one of a source electrode and a drain electrode of the writing transistor, one of electrodes of the capacitor, and a gate electrode of the reading transistor are electrically connected to each other, and then turning off the writing transistor so that the predetermined amount of electric charge is held in the node. Here, the off-state current of the writing transistor is extremely small; thus, the electric charge supplied to the node is held for a long time. When an off-state current is, for example, substantially 0, refresh operation needed for a conventional DRAM can be unnecessary or the frequency of refresh operation can be significantly low (for example, about once a month or a year). Accordingly, power consumption of a semiconductor device can be reduced sufficiently.

Further, data can be rewritten directly by overwriting of new data to the memory cell. For that reason, erasing operation which is necessary for a flash memory or the like is not needed, so that a reduction in operation speed due to erasing operation can be prevented. In other words, high-speed operation of the semiconductor device can be realized. Moreover, a high voltage necessary for a conventional floating gate transistor to write and erase data is unnecessary; thus, power consumption of the semiconductor device can be further reduced. The highest voltage applied to the memory cell according to this embodiment (the difference between the highest potential and the lowest potential applied to respective terminals of the memory cell at the same time) can be 5 V or lower, preferably 3 V or lower, in each memory cell in the case where data of two stages (one bit) is written.

The memory cell provided in the semiconductor device according to the disclosed invention may include at least the writing transistor, the reading transistor, and the capacitor. Further, the memory cell can operate even when the area of the capacitor is small. Accordingly, the area of each memory cell can be sufficiently small as compared to an SRAM which requires six transistors in each memory cell, for example; thus, the memory cells can be arranged in a semiconductor device at high density.

In a conventional floating gate transistor, electric charge travels in a gate insulating film (tunnel insulating film) during writing operation, so that deterioration of the gate insulating film (tunnel insulating film) cannot be avoided. In contrast, in the memory cell according to one embodiment of the present invention, data is written by switching operation of a writing transistor; therefore, the deterioration of a gate insulating film, which has been traditionally recognized as a problem, can be neglected. This means that there is no limitation on the number of times of writing in principle and writing durability is very high. For example, in the memory cell according to one embodiment of the present invention, the current-voltage characteristic is not degraded even after data is written $1 \times 10^9$ or more times (one billion or more times).

Further, in the case of using a transistor including an oxide semiconductor as the writing transistor of the memory cell, the current-voltage characteristic of the memory cell is not degraded even at, for example, a high temperature of 150° C. because an oxide semiconductor has a wide energy gap of 3.0 to 3.5 eV and includes extremely few thermally excited carriers.

The present inventors have succeeded in finding for the first time that a transistor including an oxide semiconductor has excellent characteristics in that the characteristics are not deteriorated even at a high temperature of 150° C. and off-state current is smaller than or equal to 100 zA which is extremely small. One embodiment of the disclosed invention is to provide a semiconductor device having a novel feature by using a transistor having such excellent characteristics as the writing transistor of the memory cell.

As described above, the structures, methods, and the like described in this embodiment can be combined as appropriate with any of the structures, methods, and the like described in the other embodiments.

Embodiment 2

In this embodiment, an application example of the semiconductor device described in the above embodiment will be described. Specifically, an example of a semiconductor device in which the semiconductor devices described in the above embodiment are arranged in matrix will be described.

FIG. 2 is an example of a circuit diagram of a semiconductor device including memory capacity of m×n bits.

The semiconductor device according to one embodiment of the present invention includes a memory cell array where m word lines WL, m signal lines S, n bit lines BL, n source lines SL and a plurality of memory cells 1100 arranged in matrix of m (rows) (in a vertical direction)×n (columns) (in a horizontal direction) (m and n are natural numbers), and peripheral circuits of a first driver circuit 1111, a second driver circuit 1112, a third driver circuit 1113, and a fourth driver circuit 1114. Here, the structure described in the foregoing embodiment (the structure illustrated in FIG. 1A-1) is applied to the memory cell 1100.

Each of the memory cells 1100 includes a first transistor, a second transistor, and a capacitor. A gate electrode of the first transistor, one of a source electrode and a drain electrode of the second transistor, and one of electrodes of the capacitor are electrically connected to one another. The source line SL, a source electrode of the first transistor, and the other of the source electrode and the drain electrode of the second transistor are electrically connected to one another. The bit line BL and a drain electrode of the first transistor are electrically connected to each other. The signal line S and a gate electrode of the second transistor are electrically connected to each other. The word line WL and the other of the electrodes of the capacitor are electrically connected to each other. That is, the source line SL corresponds to the first wiring (1st Line) and the third wiring (3rd Line) in the structure illustrated in FIG. 1A-1, the bit line BL corresponds to the second wiring (2nd Line), the signal line S corresponds to the fourth wiring (4th Line), and the word line WL corresponds to the fifth wiring (5th Line).

Further, the memory cells 1100 are connected in parallel between the source line SL and the bit line BL. For example, the memory cell 1100 (i,j) of an i-th row and a j-th column (i is an integer which is greater than or equal to 1 and less than or equal to m, and j is an integer which is greater than or equal to 1 and less than or equal to n) is electrically connected to the source lines SL(j), the bit lines BL(j), the word lines WL(i), and the signal lines S(i).

The source line SL and the bit line BL are electrically connected to the first driver circuit 1111 through switching elements. The source line SL is electrically connected to the second driver circuit 1112 through a switching element. The signal line S is electrically connected to the third driver circuit 1113. The word line WL is electrically connected to the fourth driver circuit 1114. Note that here, the first driver circuit 1111, the second driver circuit 1112, the third driver circuit 1113, and the fourth driver circuit 1114 are separately provided; however, the disclosed invention is not limited to this. A driver circuit having any one or some of the functions may alternatively be used.

Figure 3:
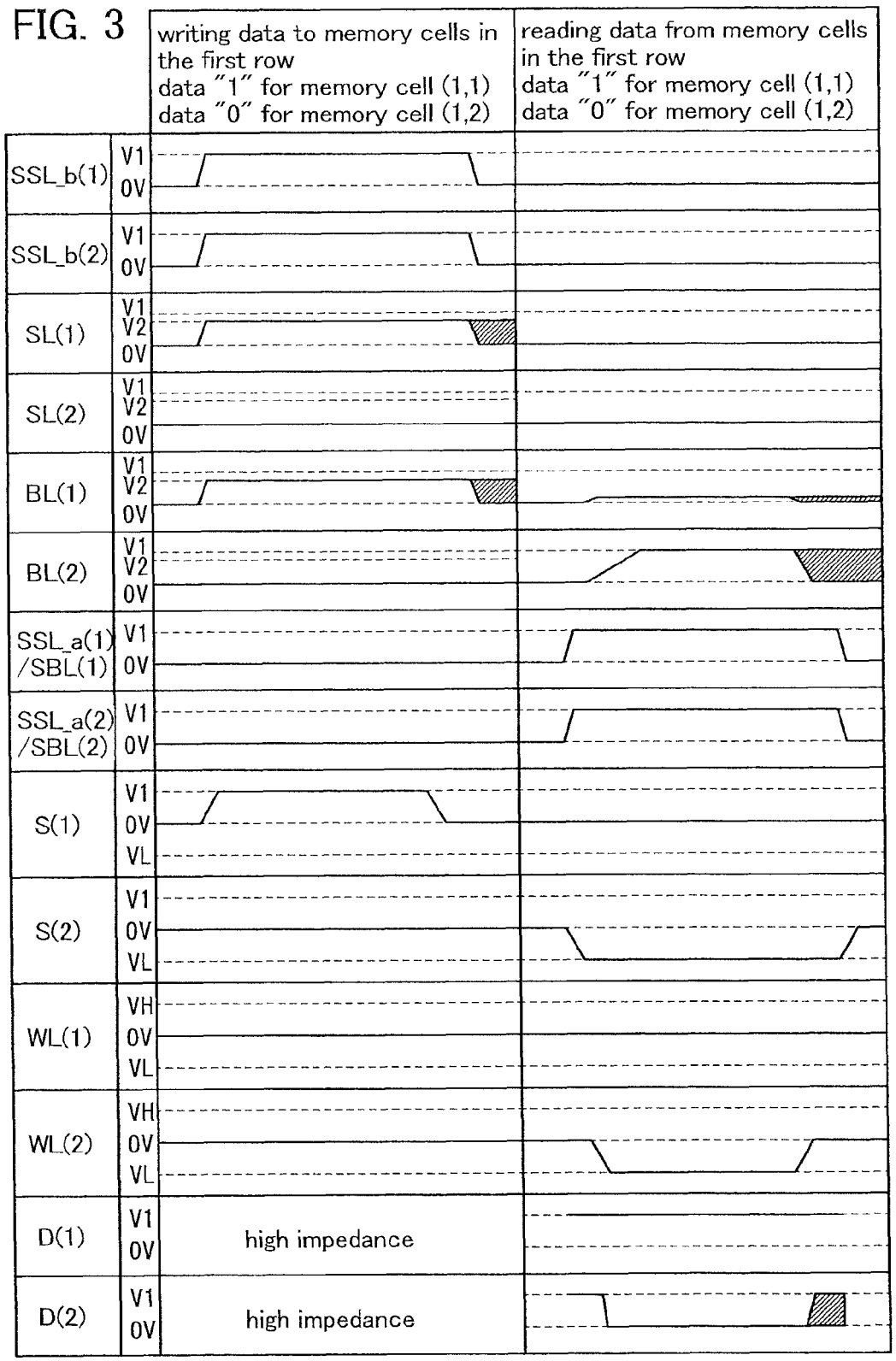
FIG. 3 is a timing chart.

Next, writing operation and reading operation will be described. FIG. 3 is an example of a timing chart of writing operation and reading operation.

Although operation of a semiconductor device of a memory cell array of two rows and two columns will be described for simplification, the disclosed invention is not limited to this.

Writing data to the memory cell 1100 (1,1) and the memory cell 1100 (1,2) which are in the first row and reading data from the memory cell 1100 (1,1) and the memory cell 1100 (1,2) which are in the first row will be described. Note that in the following description, it is assumed that data to be written to the memory cell 1100 (1,1) is "1" and data to be written to the memory cell 1100 (1,2) is "0".

First, the writing will be described. A potential V1 is supplied to the signal line S(1) of the first row, so that the second transistors of the first row are turned on. Further, a potential 0 V is supplied to the signal line S(2) of the second row, so that the second transistors of the second row are turned off.

Next, control signals SSL_b(1) and SSL_b(2) of switching elements are asserted (activated) by application of the potential V1, and terminals SL_b(1) and SL_b(2) of the second driver circuit 1112 are electrically connected to a source line SL(1) and a source line SL(2), respectively. Here, a potential V2 is supplied to the SL_b(1) and a potential 0 V is supplied to the SL_b(2).

As a result, the potential V2 and the potential 0 V are supplied to a floating gate portion FG of the memory cell 1100 (1,1) and a floating gate portion FG of the memory cell 1100 (1,2), respectively. Here, the potential V2 is higher than the threshold voltage of the first transistor. Then, the potential of the signal line S(1) of the first row is set to 0 V, so that the second transistors of the first row are turned off. Thus, the writing is completed. It is preferable that the potential V2 be substantially equal to the potential V1 or lower than or equal to the potential V1.

Note that the word lines WL(1) and WL(2) are at a potential 0 V during writing operation. Further, control signals SSL_a(1), SSL_a(2), SBL(1), and SBL(2) of switching elements are de-asserted (inactivated). Furthermore, the potential of the signal line S(1) of the first row is set to 0 V before the potential of the SL_b(1) is changed. After writing, the threshold voltage of the memory cell is Vw0 in the case of data "0" and Vw1 in the case of data "1". Here, the threshold voltage of the memory cell means a voltage of a terminal electrically connected to the word line WL, which changes resistance between the source electrode and the drain electrode of the first transistor. Note that Vw0>0>Vw1 is satisfied.

Further, when the control signals SSL_a(1), SSL_a(2), SBL(1), and SBL(2) of the switching elements are de-asserted (inactivated), a potential is not supplied to the bit lines BL and the source lines SL from the first driver circuit 1111 but from the terminal SL_b of the second driver circuit 1112. Accordingly, the source lines SL are supplied with the same potential as the terminal SL_b. Furthermore, the bit lines BL are at the same potential as the source lines SL as long as any one of the first transistors of the memory cells electrically connected to the bit lines BL is in an on state, while the bit lines BL are in a floating state when all the first transistors are in an off state. The timing chart illustrated in FIG. 3 shows the case where the bit lines BL are at the same potential as the source lines SL.

Note that in this writing operation, although the control signals SBL(1) and SBL(2) of the switching elements are de-asserted (inactivated), the control signals SBL(1) and SBL(2) of the switching elements can be asserted (activated). In that case, a terminal BL_a(1) may be supplied with the same potential as the terminal SL_b(1) and a terminal BL_a(2) may be supplied with the same potential as the terminal SL_b(2).

Then, the reading will be described. Here, the bit line BL is electrically connected to a reading circuit illustrated in FIG. 4. In the reading circuit illustrated in FIG. 4, the bit line BL is electrically connected to a clocked inverter and a transistor which is diode-connected to a wiring supplied with the potential V1 through a switching element controlled by a read enable signal (RE signal).

First, a potential 0 V and the potential VL are supplied to the word line WL(1) of the first row and the word line WL(2) of the second row, respectively. The potential VL is lower than the threshold voltage Vw1. When the word line WL(1) is at a potential 0 V, in the first row, the first transistor of the memory cell in which data "0" is stored is off, and the first transistor of the memory cell in which data "1" is stored is on. When the word line WL(2) is at the potential VL, in the second row, the first transistors of the memory cells in which either data "0" or data "1" is stored is off.

Next, the control signals SSL_a(1), SSL_a(2), SBL(1), and SBL(2) of the switching elements are asserted (activated) by application of the potential V1. The terminal BL_a(1) and the terminal BL_a(2) of the first driver circuit 1111 are electrically connected to a bit line BL(1) and a bit line BL(2), respectively. A terminal SL_a(1) and a terminal SL_a(2) of the first driver circuit 1111 are electrically connected to the source line SL(1) and the source line SL(2), respectively. A potential 0 V is supplied to SL_a(1) and SL_a(2). Further, the read enable signal (RE signal) is made to be asserted (active state).

As a result, the transistor of the memory cell 1100 (1,1) between the terminal BL_a(1) and the terminal SL_a(1) is turned on, thereby having low resistance, and the transistor of the memory cell 1100 (1,2) between the terminal BL_a(2) and the terminal SL_a(2) is turned off, thereby having high resistance. Reading circuits electrically connected to the terminals BL_a(1) and BL_a(2) can read data based on a difference in resistance between the bit lines. Note that the control signals SSL_b(1) and SSL_b(2) of the switching elements are de-asserted.

Note that during reading operation, a potential 0 V and the potential VL are supplied to the signal line S(1) and the signal line S(2), respectively, so that all the second transistors are turned off. The potential of the floating gate portion FG of the first row is 0 V or V2; thus, the potential of the signal line S(1) is set to 0 V, whereby all the second transistors of can be turned off. On the other hand, the potential of the floating gate portion FG of the second row is lower than the potential at the time just after writing if the potential VL is supplied to the word line WL(2). Therefore, in order to prevent the second transistors of the second row from being turned on, the potential of the signal line S(2) is set to low (the potential VL) similarly to the potential of the word line WL(2). Thus, all the second transistors can be turned off.

Figure 4:
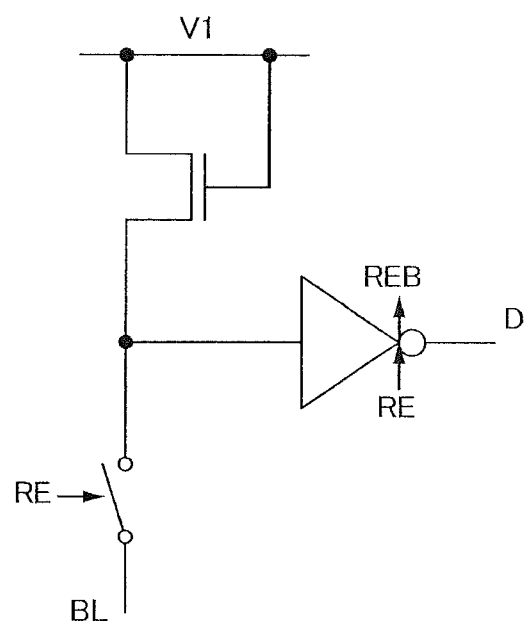
FIG. 4 is a circuit diagram of a semiconductor device.

Next, an output potential in the case where a circuit in FIG. 4 is used as a reading circuit will be described. Since the resistance between a terminal BL_a(1) and a terminal SL_a(1) is low, a low potential is supplied to a clocked inverter and an output D(1) is a signal High. Since the resistance between a terminal BL_a(2) and a terminal SL_a (2) is high, a high potential is supplied to the clocked inverter and an output D(2) is a signal Low.

The operation potentials can be set to V1=2 V, V2=1.5 V, VH=2V, and VL=−2 V, for example.

When a semiconductor device with the above structure is manufactured, the source lines SL function as wirings which supply potentials to floating gate portions of memory cells, so that the number of wirings in each of the memory cells can be reduced. Thus, the area of memory cells can be reduced and memory capacity per unit area of the semiconductor device can be increased.

Since the semiconductor device illustrated in FIG. 2 includes a semiconductor where a transistor formed by the semiconductor has extremely small off-state current, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

In addition, in the semiconductor device illustrated in FIG. 2, high voltage is not needed for writing data and there is no problem of deterioration of elements. Therefore, the semiconductor device illustrated in FIG. 2 does not have a limitation on the number of times of writing which is a problem in a conventional nonvolatile memory, and reliability thereof is drastically improved. Further, writing of data is performed depending on an on state and an off state of the transistor, so that high-speed operation can be easily realized. Additionally, there is an advantage that operation for erasing data is not needed.

Since a transistor including a material other than an oxide semiconductor can operate at sufficiently high speed, a semiconductor device can perform operation (e.g., reading data) at sufficiently high speed in combination of a transistor including an oxide semiconductor. Further, a transistor including a material other than an oxide semiconductor can preferably realize a variety of circuits (e.g., a logic circuit or a driver circuit) which require to operation at high speed.

Thus, a semiconductor device with a novel feature can be realized by including both the transistor including a material other than an oxide semiconductor and the transistor including an oxide semiconductor.

Figure 5:
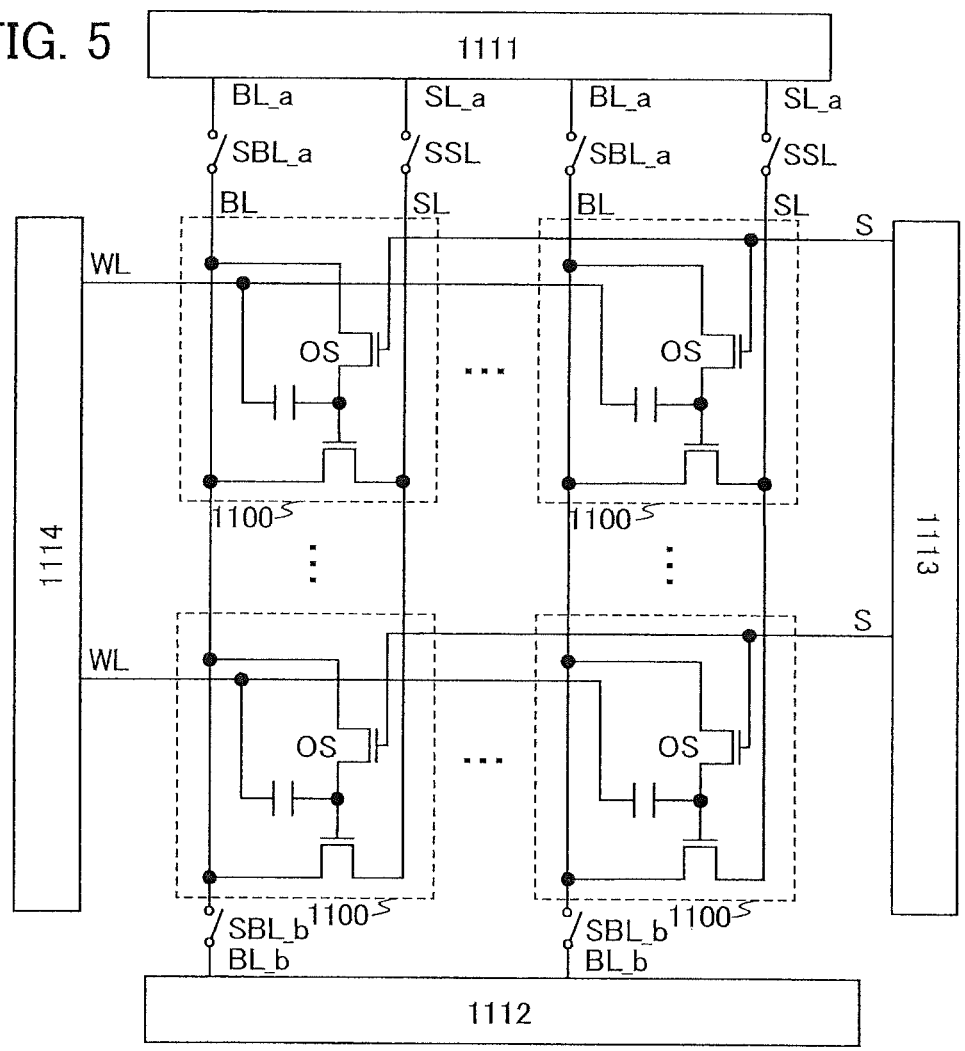
FIG. 5 is a circuit diagram of a semiconductor device.

Although the source line SL and the other of the source electrode and the drain electrode of the second transistor are electrically connected to each other as described above in this embodiment, the present invention is not limited thereto. As illustrated in a circuit diagram of a semiconductor device in FIG. 5, the bit line BL and the other of the source electrode and the drain electrode of the second transistor may be electrically connected to each other. In that case, not the source line SL but the bit line BL is electrically connected to the second driver circuit 1112 through the switching element. The structure of the semiconductor device illustrated in FIG. 5 is the same as the structure of the semiconductor device illustrated in FIG. 2 except that the bit line BL and the other of the source electrode and the drain electrode of the second transistor are electrically connected to each other and the bit line BL is electrically connected to the second driver circuit 1112 through the switching element.

As described above, the structures, methods, and the like described in this embodiment can be combined as appropriate with any of the structures, methods, and the like described in the other embodiments.

Embodiment 3

In this embodiment, another example of a semiconductor device in which the semiconductor devices described in the above embodiments are arranged in matrix will be described.

Figure 6:
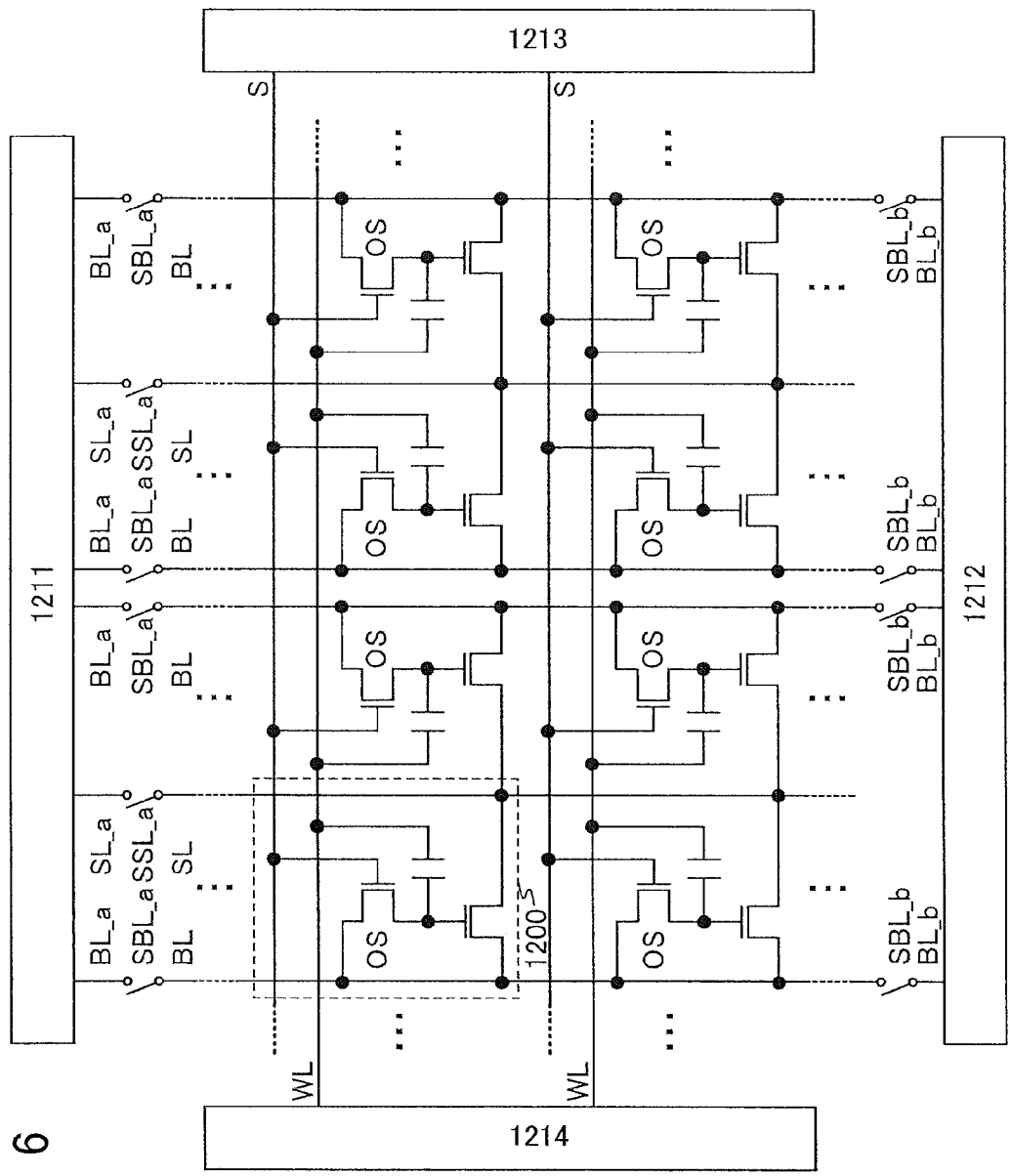
FIG. 6 is a circuit diagram of a semiconductor device.

FIG. 6 is an example of a circuit diagram of a semiconductor device including memory capacity of m×n bits.

The semiconductor device according to one embodiment of the present invention includes a memory cell array where m word lines WL, m signal lines S, n bit lines BL, n2 source lines SL, and a plurality of memory cells 1200 arranged in matrix of m (rows) (in a vertical direction)×n (columns) (in a horizontal direction) and peripheral circuits of a first driver circuit 1211, a second driver circuit 1212, a third driver circuit 1213, and a fourth driver circuit 1214 (m, n, and n2 are natural numbers and n2 is the smallest natural number which is greater than or equal to n/2). Here, the structure described in the foregoing embodiment (the structure illustrated in FIG. 1A-1) is applied to the memory cell 1200.

Each of the memory cells 1200 includes a first transistor, a second transistor, and a capacitor. A gate electrode of the first transistor, one of a source electrode and a drain electrode of the second transistor, and one of electrodes of the capacitor are electrically connected to one another. The source line SL and a source electrode of the first transistor are electrically connected to each other. The bit line BL, a drain electrode of the first transistor, and the other of the source electrode and the drain electrode of the second transistor are electrically connected to one another. The signal line S and a gate electrode of the second transistor are electrically connected to each other. The word line WL and the other of the electrodes of the capacitor are electrically connected to each other. That is, the source line SL corresponds to the first wiring (1st Line) in the structure illustrated in FIG. 1A-1, the bit line BL corresponds to the second wiring (2nd Line) and the third wiring (3rd Line), the signal line S corresponds to the fourth wiring (4th Line), and the word line WL corresponds to the fifth wiring (5th Line).

Further, the memory cells 1200 are connected in parallel between the source line SL and the bit line BL. For example, the memory cell 1200 of an i-th row and a j-th column (i,j) (i is an integer which is greater than or equal to 1 and less than or equal to m, and j is an integer which is greater than or equal to 1 and less than or equal to n) is electrically connected to the source line SL(j2), the bit line BL(j), the word line WL(i), and the signal line S(i) (j2 is the smallest natural number which is greater than or equal to j/2). In other words, a memory cell 1200 (i, 2k−1) and a memory cell 1200 (i, 2k), which are memory cells adjacent to each other, are electrically connected to the same source line SL(k) (k is a natural number which is greater than or equal to 1 and less than or equal to n/2).

The source line SL and the bit line BL are electrically connected to the first driver circuit 1211 through switching elements. The bit line BL is electrically connected to the second driver circuit 1212 through a switching element. The signal line S is electrically connected to the third driver circuit 1213. The word line WL is electrically connected to the fourth driver circuit 1214. Note that here, the first driver circuit 1211, the second driver circuit 1212, the third driver circuit 1213, and the fourth driver circuit 1214 are separately provided; however, the disclosed invention is not limited to this. A driver circuit having any one or some of the functions may alternatively be used.

Figure 7:
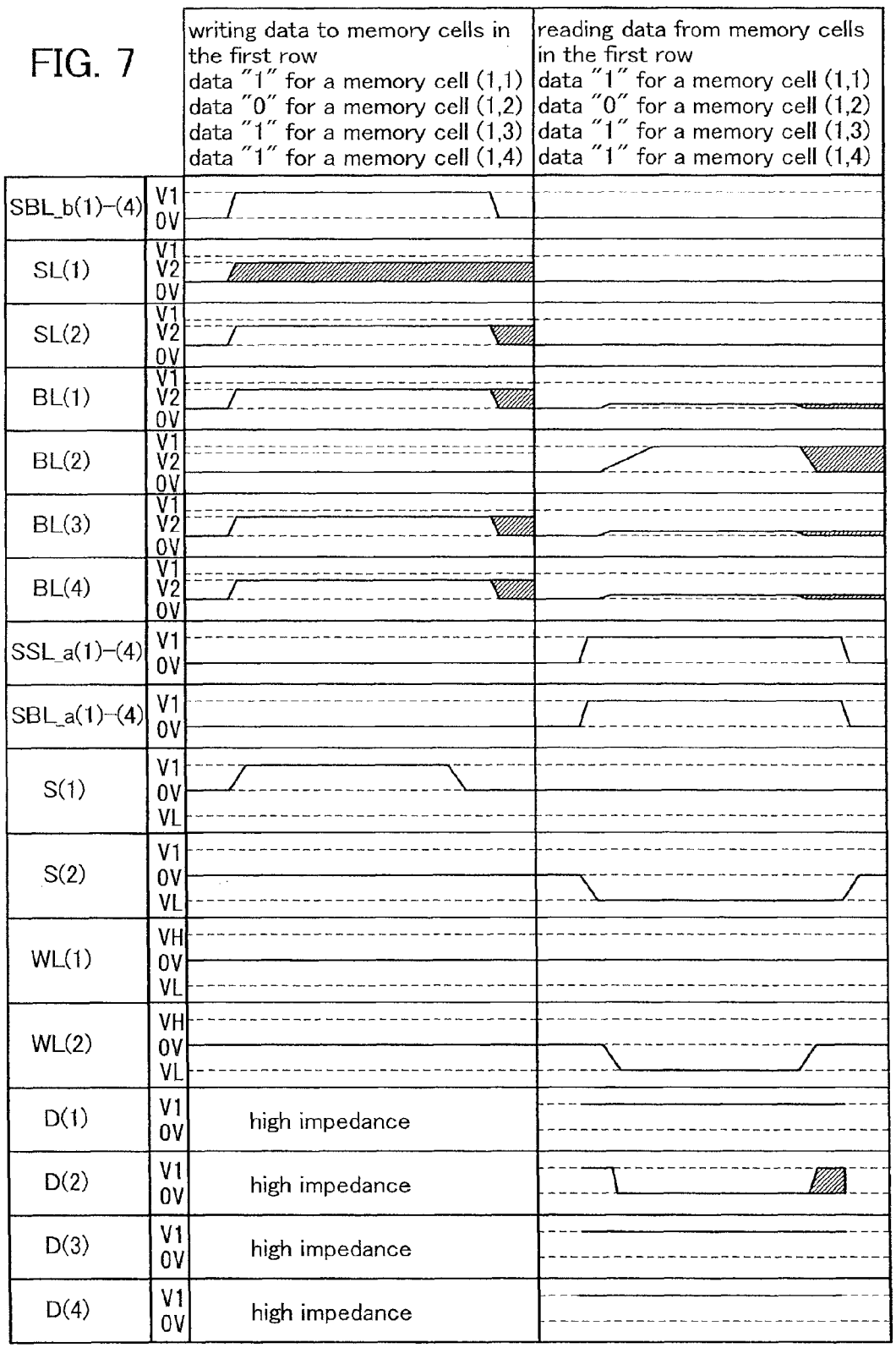
FIG. 7 is a timing chart.

Next, writing operation and reading operation will be described. FIG. 7 is an example of a timing chart of writing operation and reading operation.

Although operation of a semiconductor device of a memory cell array of two rows and four columns will be described for simplification, the disclosed invention is not limited to this.

First, writing data to the memory cell 1200 (1,1), the memory cell 1200 (1,2), the memory cell 1200 (1, 3), and the memory cell 1200 (1, 4) which are in the first row, and reading data from the memory cell 1200 (1,1), the memory cell 1200 (1,2), the memory cell 1200 (1,3), and the memory cell 1200 (1, 4) which are in the first row, will be described. Note that in the following description, it is assumed that data to be written to the memory cell 1200 (1,1) is "1", data to be written to the memory cell 1200 (1,2) is "0", data to be written to the memory cell 1200 (1,3) is "1", and data to be written to the memory cell 1200 (1, 4) is "1".

First, the writing operation will be described. A potential V1 is supplied to the signal line S(1) of the first row, so that the second transistors of the first row are turned on. Further, a potential 0 V is supplied to the signal line S(2) of the second row, so that the second transistors of the second row are turned off.

Next, control signals SBL_b(1) to SBL_b(4) of switching elements are asserted (activated) by application of the potential V1, and terminals BL_b(1) to BL_b(4) of the second driver circuit 1212 are electrically connected to bit lines BL(1) to BL(4), respectively. Here, a potential V2 is supplied to the terminal BL_b(1), a potential 0 V is supplied to the terminal BL_b(2), the potential V2 is supplied to the terminal BL_b(3), and the potential V2 is supplied to the terminal BL_b(4).

As a result, the potential V2 is supplied to a floating gate portion FG of the memory cell 1200 (1,1), the potential 0 V is supplied to a floating gate portion FG of the memory cell 1200 (1,2), the potential V2 is supplied to a floating gate portion FG of the memory cell 1200 (1,3), and the potential V2 is supplied to a floating gate portion FG of the memory cell 1200 (1,4). Here, the potential V2 is higher than the threshold voltage of the first transistors. Then, the potential of the signal line S(1) of the first row is set to the potential 0 V, so that the second transistors of the first row are turned off. Thus, the writing is completed. Here, when the writing is to be completed, the potential of the signal line S(1) of the first row is set to the potential 0 V before the potential of the terminal BL_b is changed. It is preferable that the potential V2 be substantially equal to the potential V1 or lower than or equal to the potential V1.

After writing, the threshold voltage of the memory cell is Vw0 in the case of data "0" and Vw1 in the case of data "1". Here, the threshold voltage of the memory cell means a voltage of a terminal electrically connected to the word line WL, which changes resistance between the source electrode and the drain electrode of the first transistor. Note that Vw0>0>Vw1 is satisfied.

Note that control signals SSL_a(1), SSL_a(2), and SBL_a (1) to SBL_a(4) of the switching elements are de-asserted (inactivated) during writing operation. Note that the word lines WL(1) and WL(2) are at a potential 0 V.

Further, when the control signals SSL_a(1), SSL_a(2), and SBL_a(1) to SBL_a(4) of switching elements are de-asserted (inactivated), a potential is not supplied from the first driver circuit 1211 to the bit lines BL and the source lines SL. The bit lines are supplied with a potential from the terminal BL_b of the second driver circuit 1212. Accordingly, the bit lines BL are supplied with the same potential as the terminal BL_b.

The source line SL is electrically connected to the bit line BL which is electrically connected to the memory cell with data "1" through the first transistor in an on state, and electrically connected to the bit line BL which is electrically connected to the memory cell with data "0" through the first transistor in an off state. That is, the source line SL(k) is in a floating state when all the memory cells electrically connected to the source line SL(k) have data "0", whereas in the case where the memory cell with data "1" is electrically connected to the bit line BL(2k−1) or the bit line BL(2k), the source line SL(k) has the same potential as the bit line BL electrically connected to the memory cell with data "1" in the other cases. Moreover, in the case where the memory cells with data "1" are electrically connected to the bit line BL(2k−1) and the bit line BL(2k), the source line SL(k) has a potential with a value between the value of the bit line BL(2k−1) and the value of the bit line BL(2k).

Then, the reading will be described. Here, the bit lines BL are electrically connected to the reading circuits illustrated in FIG. 4. The structure of the reading circuit illustrated in FIG. 4 is the same as that described in Embodiment 2.

First, a potential 0 V and the potential VL are supplied to the word line WL(1) of the first row and the word line WL(2) of the second row, respectively. The potential VL is lower than the threshold voltage Vw1. When the word line WL(1) is at a potential 0 V, in the first row, the first transistor of the memory cell in which data "0" is stored is off, and the first transistor of the memory cell in which data "1" is stored is on. When the word line WL(2) is at the potential VL, in the second row, the first transistors of the memory cells in which either data "0" or data "1" is stored is off.

Next, the control signals SSL_a(1), SSL_a(2), and SBL_a (1) to SBL_a(4) of the switching elements are asserted (activated) by application of the potential V1. The terminals BL_a(1) to BL_a(4) of the first driver circuit 1211 are electrically connected to the bit lines. The terminals SL_a(1) and SL_a(2) of the first driver circuit 1211 are electrically connected to the source lines. A potential 0 V is supplied to SL_a(1) and SL_a(2). Further, the read enable signal (RE signal) is made to be asserted (active state).

Note that the control signals SBL_b(1) to SBL_b(4) of the switching elements are de-asserted.

As a result, the transistor of the memory cell 1200 (1,1) between the terminal BL_a(1) and the terminal SL_a(1) is turned on, thereby having low resistance, and the transistor of the memory cell 1200 (1,2) between the terminal BL_a(2) and the terminal SL_a(1) is turned off, thereby having high resistance. The transistor of the memory cell 1200 (1,3) between the terminal BL_a(3) and the terminal SL_a(2) is turned on, thereby having low resistance, and the transistor of the memory cell 1200 (1,4) between the terminal BL_a(4) and the terminal SL_a(2) is turned on, thereby having low resistance. Reading circuits electrically connected to the terminals BL_a(1) to BL_a(4) can read data based on a difference in resistance between the bit lines.

Note that during reading operation, a potential 0 V and the potential VL are supplied to the signal line S(1) and the signal line S(2), respectively, so that all the second transistors are turned off. The potential of the floating gate portion FG of the first row is 0 V or V2; thus, the potential of the signal line S(1) is set to 0 V, whereby all the second transistors of can be turned off. On the other hand, the potential of the floating gate portion FG of the second row is lower than the potential at the time just after writing if the potential VL is supplied to the word line WL(2). Therefore, in order to prevent the second transistor from being turned on, the potential of the signal line S(2) is set to low (the potential VL) similarly to the potential of the word line WL(2). Thus, all the second transistors can be turned off.

An output potential in the case where a circuit illustrated in FIG. 4 is used as a reading circuit will be described. Since the resistance between a terminal BL_a(1) and a terminal SL_a(1) is low, a low potential is supplied to a clocked inverter and an output D(1) is a signal High. Since the resistance between a terminal BL_a(2) and a terminal SL_a(1) is high, a high potential is supplied to the clocked inverter and an output D(2) is a signal Low. Since the resistance between a terminal BL_a(3) and a terminal SL_a(2) is low, a low potential is supplied to a clocked inverter and an output D(3) is a signal High. Since the resistance between a terminal BL_a(4) and a terminal SL_a(2) is low, a low potential is supplied to a clocked inverter and an output D(4) is a signal High.

Next, writing operation of the semiconductor device with the structure illustrated in FIG. 6, which is different from the above writing operation, will be described. The data to be written is the same as described above. First, a potential V1 is supplied to the signal line S(1) of the first row, so that the second transistors of the first row are turned on. Further, a potential VL is supplied to the signal line S(2) of the second row, so that the second transistors of the second row are turned off.

Next, control signals SBL_b(1) to SBL_b(4) of switching elements are asserted (activated) by application of the potential V1, and terminals BL_b(1) to BL_b(4) of the second driver circuit 1212 are electrically connected to bit lines, respectively. Here, a potential V2 is supplied to the terminal BL_b(1), a potential 0 V is supplied to the terminal BL_b(2), the potential V2 is supplied to the terminal BL_b(3), and the potential V2 is supplied to the terminal BL_b(4).

As a result, the potential V2 is supplied to a floating gate portion FG of the memory cell 1200 (1,1), the potential 0 V is supplied to a floating gate portion FG of the memory cell 1200 (1,2), the potential V2 is supplied to a floating gate portion FG of the memory cell 1200 (1,3), and the potential V2 is supplied to a floating gate portion FG of the memory cell 1200 (1,4). Here, the potential V2 is higher than the threshold voltage of the first transistors. Then, the potential of the signal line S(1) of the first row is set to the potential 0 V, so that the second transistors of the first row are turned off. Thus, the writing is completed. Here, when the writing is to be completed, the potential of the signal line S(1) of the first row is set to the potential 0 V before the potential of the terminal BL_b is changed.

After writing, the threshold voltage of the memory cell is Vw0 in the case of data "0" and Vw1 in the case of data "1". Here, the threshold voltage of the memory cell means a voltage of a terminal electrically connected to the word line WL, which changes resistance between the source electrode and the drain electrode of the first transistor. Note that Vw0>0>Vw1 is satisfied.

Note that control signals SSL_a(1), SSL_a(2), and SBL_a(1) to SBL_a(4) of the switching elements are de-asserted (inactivated) during writing operation. The word line WL(1) is set to a potential 0 V and the word line WL(2) is set to a potential VL. When the word line WL(2) of the second row is at the potential VL, in the second row, the first transistors of the memory cells in which either data "0" or data "1" is stored are in an off state.

Further, when the control signals SSL_a(1), SSL_a(2), and SBL_a(1) to SBL_a(4) of switching elements are de-asserted (inactivated), a potential is not supplied from the first driver circuit 1211 to the bit lines BL and the source lines SL. The bit lines are supplied with a potential from the terminal BL_b of the second driver circuit 1212. Accordingly, the bit lines BL are supplied with the same potential as the terminal BL_b.

Since the first transistors of the memory cells in which writing is not performed are in an off state, relation between the source line SL and the bit line BL is determined by a memory cell of the row in which writing is performed. In the case where data "1" is written to the memory cell, the source line SL is electrically connected to the bit line BL through the first transistor in an on state. In the case where data "0" is written to the memory cell, the source line SL is electrically connected to the bit line BL through the first transistor in an off state. That is, the source line SL is in a floating state in the case where data "0" is written to two memory cells electrically connected to the source line SL. In the other cases, the source line SL is at the same potential as the bit line BL (the potential V2) electrically connected to the memory cell to which data "1" is written.

In this writing operation, the bit line BL(2k−1) and the bit line BL(2k) are electrically connected to each other through the transistor in an on state only when data "1" is written to the two memory cells, and the bit line BL(2k−1) and the bit line BL(2k) are at the potential V2. Accordingly, stationary current does not flow through the bit line BL in writing, whereby writing can be performed with low power consumption.

Although SSL_a(1) and SSL_a(2) are de-asserted (inactivated) in this writing operation, SSL_a(1) and SSL_a(2) can be asserted (activated). In that case, the terminal SL_a(1) may be supplied with a potential of the terminal BL_b(1) or a potential of the terminal SL_a(2), either of which is larger. Alternatively, the potential V2 may be supplied.

The operation potentials can be set to V1=2 V, V2=1.5 V, VH=2V, and VL=−2 V, for example.

When a semiconductor device with the above structure is manufactured, the bit lines BL function as wirings which supply potentials to floating gate portions of memory cells, so that the number of wirings in each of the memory cells can be reduced. Thus, the area of memory cells can be reduced and memory capacity per unit area of the semiconductor device can be increased.

Further, adjacent memory cells share one source line SL, whereby the number of the source lines SL can be reduced approximately by half. Thus, the area of memory cells can be reduced and memory capacity per unit area of the semiconductor device can be increased.

As in Embodiment 2, since the semiconductor device illustrated in FIG. 6 includes a semiconductor where a transistor formed by the semiconductor has extremely small off-state current, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

In addition, as in Embodiment 2, in the semiconductor device illustrated in FIG. 6, high voltage is not needed for writing data and there is no problem of deterioration of elements. Therefore, the semiconductor device illustrated in FIG. 6 does not have a limitation on the number of times of writing which is a problem in a conventional nonvolatile memory, and reliability thereof is drastically improved.

Further, writing of data is performed depending on an on state and an off state of the transistor, so that high-speed operation can be easily realized. Additionally, there is an advantage that operation for erasing data is not needed.

Since a transistor including a material other than an oxide semiconductor can operate at sufficiently high speed, a semiconductor device can perform operation (e.g., reading data) at sufficiently high speed in combination of a transistor including an oxide semiconductor. Further, a transistor including a material other than an oxide semiconductor can preferably realize a variety of circuits (e.g., a logic circuit or a driver circuit) which require to operation at high speed.

Thus, a semiconductor device with a novel feature can be realized by including both the transistor including a material other than an oxide semiconductor and the transistor including an oxide semiconductor.

As described above, the structures, methods, and the like described in this embodiment can be combined as appropriate with any of the structures, methods, and the like described in the other embodiments.

Embodiment 4

In this embodiment, a structure and a manufacturing method of a semiconductor device according to one embodiment of the disclosed invention will be described with reference to FIGS. 8A and 8B, FIGS. 9A to 9H, and FIGS. 10A to 10E.

<Cross-Sectional Structure and Planar Structure of Semiconductor Device>

Figure 8A:
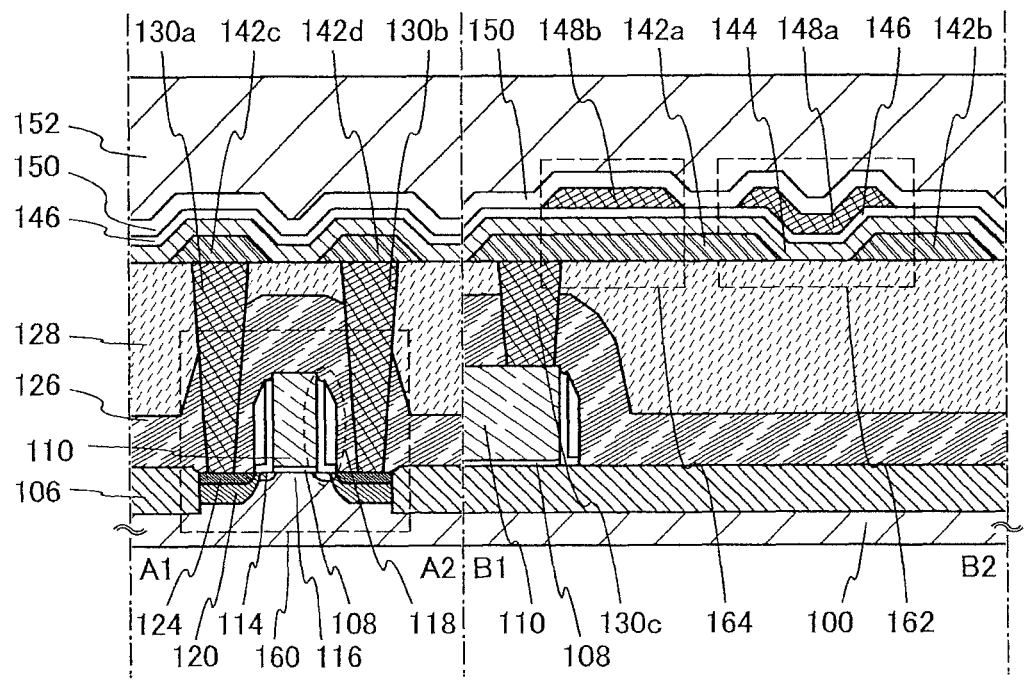
FIGS. 8A and 8B are a cross-sectional view and a plan view of a semiconductor device.
Figure 8B:
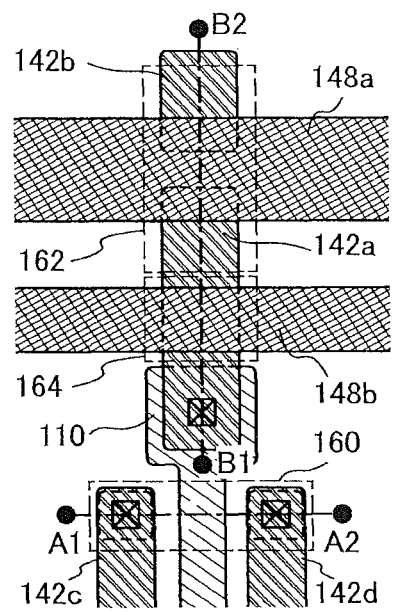

FIGS. 8A and 8B illustrate an example of a structure of a semiconductor device. FIG. 8A illustrates a cross section of the semiconductor device, and FIG. 8B illustrates a plan view of the semiconductor device. Here, FIG. 8A corresponds to a cross section along line A1-A2 and line B1-B2 in FIG. 8B. The semiconductor device illustrated in FIGS. 8A and 8B includes the transistor 160 including a material other than an oxide semiconductor in a lower portion, and the transistor 162 including an oxide semiconductor in an upper portion. A transistor including a material other than an oxide semiconductor can operate at high speed easily. On the other hand, a transistor including an oxide semiconductor can hold electric charge for a long time owing to its characteristics.

Although both of the transistors are n-channel transistors here, it is needless to say that p-channel transistors can be used. Since the technical nature of the disclosed invention is to use an oxide semiconductor in the transistor 162 so that data can be stored, it is not necessary to limit a specific structure of a semiconductor device to the structure described here.

The transistor 160 in FIGS. 8A and 8B includes a channel formation region 116 provided in a substrate 100 including a semiconductor material (e.g., silicon), impurity regions 114 and high-concentration impurity regions 120 (these regions are also collectively referred to simply as impurity regions) provided so that the channel formation region 116 is sandwiched therebetween, a gate insulating layer 108 provided over the channel formation region 116, a gate electrode 110 provided over the gate insulating layer 108, and a source or drain electrode 130a and a source or drain electrode 130b electrically connected to the impurity regions. A wiring 142c and a wiring 142d are provided over the source or drain electrode 130a and the source or drain electrode 130b, respectively. Note that as the semiconductor material, for example, silicon, germanium, silicon germanium, silicon carbide, gallium arsenide, or the like can be used, and a single crystal semiconductor is preferably used.

A sidewall insulating layer 118 is provided on a side surface of the gate electrode 110. The high-concentration impurity region 120 is positioned in a region of the substrate 100, which does not overlap with the sidewall insulating layer 118 when seen from a direction perpendicular to the surface of the substrate 100. A metal compound region 124 is positioned in contact with the high-concentration impurity region 120. An element isolation insulating layer 106 is provided over the substrate 100 so as to surround the transistor 160. An interlayer insulating layer 126 and an interlayer insulating layer 128 are provided so as to cover the transistor 160. Each of the source or drain electrode 130a and the source or drain electrode 130b is electrically connected to the metal compound region 124 through an opening formed in the interlayer insulating layer 126 and the interlayer insulating layer 128. That is, each of the source or drain electrode 130a and the source or drain electrode 130b is electrically connected to the high-concentration impurity region 120 and the impurity region 114 through the metal compound region 124. Further, an electrode 130c is electrically connected to the gate electrode 110 through an opening formed in the interlayer insulating layer 126 and the interlayer insulating layer 128. Note that the sidewall insulating layer 118 is not formed in some cases for integration of the transistor 160 or the like.

The transistor 162 in FIGS. 8A and 8B includes a source or drain electrode 142a and a source or drain electrode 142b which are provided over the interlayer insulating layer 128; an oxide semiconductor layer 144 which is electrically connected to the source or drain electrode 142a and the source or drain electrode 142b; a gate insulating layer 146 which covers the source or drain electrode 142a, the source or drain electrode 142b, and the oxide semiconductor layer 144; and a gate electrode 148a which is provided over the gate insulating layer 146 so as to overlap with the oxide semiconductor layer 144. Here, the gate electrode 110 of the transistor 160 is electrically connected to the source or drain electrode 142a of the transistor 162 through the electrode 130c.

Here, it is preferable that the oxide semiconductor layer 144 be purified by sufficient removal of impurities such as hydrogen or sufficient supply of oxygen. Specifically, the concentration of hydrogen in the oxide semiconductor layer 144 is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$, for example. Note that the concentration of hydrogen in the oxide semiconductor layer 144 is measured by secondary ion mass spectrometry (SIMS). Thus, in the oxide semiconductor layer 144 in which the hydrogen concentration is sufficiently reduced so that the oxide semiconductor layer is purified and defect levels in the energy gap due to oxygen deficiency are reduced by sufficient supply of oxygen, the carrier density is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer of channel width) at room temperature is 100 zA/μm (1 zA (zeptoampere) is $1 \times 10^{-21}$ A) or less, preferably 10 zA/μm or less. With the use of such an i-type (intrinsic) or substantially i-type oxide semiconductor, the transistor 162 which has extremely excellent off-state current characteristics can be obtained.

Note that in the transistor 162 in FIGS. 8A and 8B, the oxide semiconductor layer 144 is not processed into an island shape; therefore, contamination of the oxide semiconductor layer 144 due to etching in the processing can be prevented.

The capacitor 164 includes the source or drain electrode 142a, the oxide semiconductor layer 144, the gate insulating layer 146, and an electrode 148b. That is, the source or drain electrode 142a functions as one electrode of the capacitor 164, and the electrode 148b functions as the other electrode of the capacitor 164.

Note that in the capacitor 164 in FIGS. 8A and 8B, the oxide semiconductor layer 144 and the gate insulating layer 146 are stacked, whereby insulation between the source or drain electrode 142a and the electrode 148b can be sufficiently secured.

Note that in the transistor 162 and the capacitor 164, end portions of the source or drain electrode 142a and the source or drain electrode 142b are preferably tapered. Here, the taper angle is greater than or equal to 30° and less than or equal to 60°, for example. Note that the taper angle is a tilt angle formed by a side surface and a bottom surface of a layer having a tapered shape (e.g., the source or drain electrode 142a) in the case where the layer is observed from a direction perpendicular to a cross section (a plane perpendicular to the surface of a substrate). The end portions of the source or drain electrode 142a and the source or drain electrode 142b are tapered, whereby coverage with the oxide semiconductor layer 144 can be improved and disconnection can be prevented.

Further, an interlayer insulating layer 150 is provided over the transistor 162 and the capacitor 164, and an interlayer insulating layer 152 is provided over the interlayer insulating layer 150.

<Method for Manufacturing Semiconductor Device>

Next, an example of a method for manufacturing the semiconductor device will be described. First, a method for manufacturing the transistor 160 in the lower portion will be described below with reference to FIGS. 9A to 9H, and then a method for manufacturing the transistor 162 in the upper portion will be described with reference to FIGS. 10A to 10E.

<Method for Manufacturing Transistor in Lower Portion>

Figure 9A:
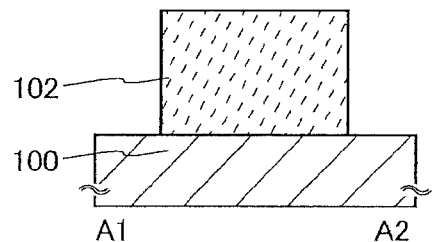
FIGS. 9A to 9H are cross-sectional views of a process of manufacturing a semiconductor device.

First, the substrate 100 including a semiconductor material is prepared (see FIG. 9A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon layer is provided on an insulating surface. In this specification and the like, the term "SOI substrate" also means a substrate where a semiconductor layer including a material other than silicon is provided on an insulating surface. That is, a semiconductor layer included in the "SOI substrate" is not limited to a silicon layer. Moreover, the SOI substrate can be a substrate having a structure in which a semiconductor layer is provided over an insulating substrate such as a glass substrate with an insulating layer positioned therebetween.

In particular, a single crystal semiconductor substrate, such as silicon, is used as the substrate 100 including a semiconductor material, whereby the reading operation of the semiconductor device described in Embodiment 2 or 3 can be performed at higher speed.

A protective layer 102 serving as a mask for forming an element isolation insulating layer is formed over the substrate 100 (see FIG. 9A). As the protective layer 102, an insulating layer formed using a material such as silicon oxide, silicon nitride, or silicon oxynitride can be used, for example. Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (in an exposed region) is removed by etching with the use of the protective layer 102 as a mask. Thus, a semiconductor region 104 isolated from the other semiconductor regions is formed (see FIG. 9B). As the etching, dry etching is preferably performed, but wet etching may be performed. An etching gas and an etchant can be selected as appropriate in accordance with a material of a layer to be etched.

Figure 9B:
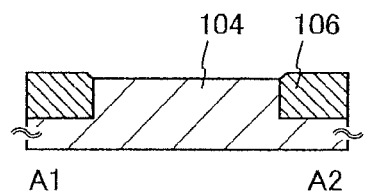

Then, an insulating layer is formed so as to cover the semiconductor region 104, and the insulating layer in a region overlapping with the semiconductor region 104 is selectively removed, so that the element isolation insulating layer 106 is formed (see FIG. 9B). The insulating layer is formed using silicon oxide, silicon nitride, silicon oxynitride, or the like. As a method for removing the insulating layer, there are etching treatment and polishing treatment such as CMP treatment, and any of them can be employed. Note that the protective layer 102 is removed after the formation of the semiconductor region 104 or after the formation of the element isolation insulating layer 106.

Next, an insulating layer is formed over the semiconductor region 104, and a layer including a conductive material is formed over the insulating layer.

The insulating layer serves as a gate insulating layer later, and the insulating layer preferably has a single-layer structure or a stacked structure using a film including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate (Hf-$Si_xO_y$ (x>0, y>0)) to which nitrogen is added, hafnium aluminate ($HfAl_xO_y$ (x>0, y>0)) to which nitrogen is added, and the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, and a spin coating method can be employed. Note that in this embodiment, an example of the case where the layer including a conductive material is formed using a metal material is described.

Figure 9C:
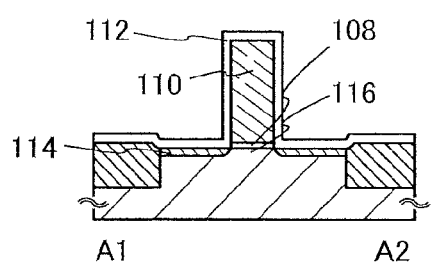

After that, the insulating layer and the layer including a conductive material are selectively etched, so that the gate insulating layer 108 and the gate electrode 110 are formed (see FIG. 9C).

Next, an insulating layer 112 that covers the gate electrode 110 is formed (see FIG. 9C). Then, the impurity regions 114 with a shallow junction depth are formed by adding phosphorus (P), arsenic (As), or the like to the semiconductor region 104 (see FIG. 9C). Note that phosphorus or arsenic is added here in order to form an n-channel transistor; an impurity element such as boron (B) or aluminum (Al) may be added in the case of forming a p-channel transistor. With the formation of the impurity regions 114, the channel formation region 116 is formed in the semiconductor region 104 below the gate insulating layer 108 (see FIG. 9C). Here, the concentration of the impurity added can be set as appropriate; however, the concentration is preferably increased when the size of a semiconductor element is extremely reduced. The step in which the impurity regions 114 are formed after the formation of the insulating layer 112 is employed here; alternatively, the insulating layer 112 may be formed after the formation of the impurity regions 114.

Figure 9D:
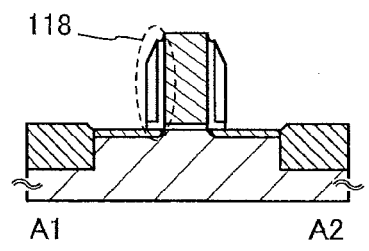
Figure 9E:
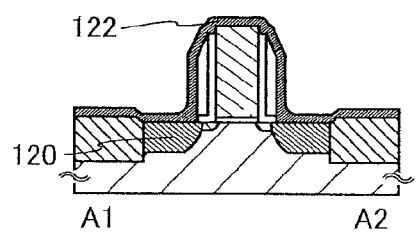
Figure 9F:
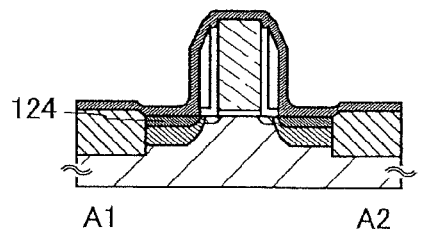

Next, the sidewall insulating layer 118 is formed (see FIG. 9D). An insulating layer is formed so as to cover the insulating layer 112 and then subjected to highly anisotropic etching treatment, whereby the sidewall insulating layer 118 can be formed in a self-aligned manner. At this time, it is preferable to etch the insulating layer 112 partly so that a top surface of the gate electrode 110 and top surfaces of the impurity regions 114 are exposed. Note that the sidewall insulating layer 118 is not formed in some cases for the purpose of high integration or the like.

Then, an insulating layer is formed so as to cover the gate electrode 110, the impurity regions 114, the sidewall insulating layer 118, and the like. Next, phosphorus (P), arsenic (As), or the like is added to regions where the insulating layer is in contact with the impurity regions 114, so that the high-concentration impurity regions 120 are formed (see FIG. 9E). After that, the insulating layer is removed, and a metal layer 122 is formed so as to cover the gate electrode 110, the sidewall insulating layer 118, the high-concentration impurity regions 120, and the like (see FIG. 9E). A variety of film formation methods such as a vacuum evaporation method, a sputtering method, and a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 9F). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce electric resistance and improve element characteristics. Note that the metal layer 122 is removed after the metal compound regions 124 are formed.

Figure 9G:
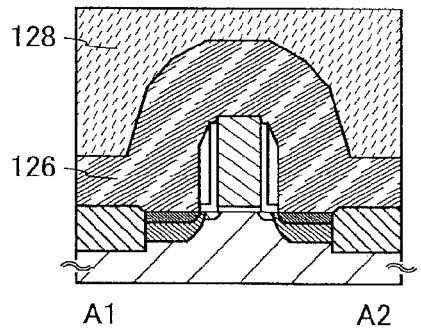

Then, the interlayer insulating layer 126 and the interlayer insulating layer 128 are formed so as to cover the components formed in the above steps (see FIG. 9G). The interlayer insulating layer 126 and the interlayer insulating layer 128 can be formed using a material including an inorganic insulating material such as silicon oxide, silicon oxynitride, silicon nitride, hafnium oxide, aluminum oxide, or tantalum oxide. Moreover, the interlayer insulating layer 126 and the interlayer insulating layer 128 can be formed using an organic insulating material such as polyimide or acrylic. Note that a stacked structure of the interlayer insulating layer 126 and the interlayer insulating layer 128 is employed here; however, one embodiment of the disclosed invention is not limited to this. A single-layer structure or a stacked structure including three or more layers can also be used. After the formation of the interlayer insulating layer 128, a surface thereof is preferably planarized by CMP treatment, etching treatment, or the like.

Figure 9H:
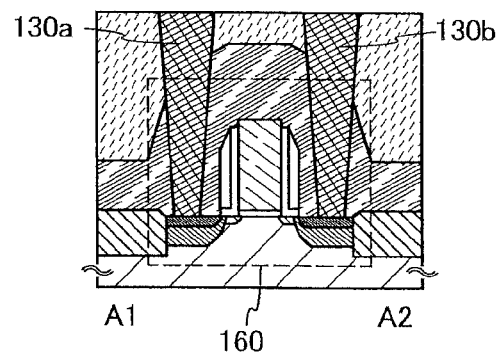

Then, openings that reach the metal compound regions 124 are formed in the interlayer insulating layers, and the source or drain electrode 130a and the source or drain electrode 130b are formed in the openings (see FIG. 9H). The source or drain electrode 130a and the source or drain electrode 130b can be formed in such a manner, for example, that a conductive layer is formed in a region including the openings by a PVD method, a CVD method, or the like and then part of the conductive layer is removed by etching treatment, CMP treatment, or the like.

Specifically, it is possible to employ a method, for example, in which a thin titanium film is formed in a region including the openings by a PVD method, a thin titanium nitride film is faulted by a CVD method, and then a tungsten film is formed so as to be embedded in the openings. Here, the titanium film formed by a PVD method has a function of reducing an oxide film (such as a natural oxide film) formed on a surface over which the titanium film is formed, thereby lowering the contact resistance with the lower electrodes or the like (the metal compound regions 124, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the source or drain electrode 130a and the source or drain electrode 130b are formed by removing part of the conductive layer, processing is preferably performed so that the surfaces are planarized. For example, when a thin titanium film or a thin titanium nitride film is formed in a region including the openings and then a tungsten film is formed so as to be embedded in the openings, excess tungsten, titanium, titanium nitride, or the like can be removed and the planarity of the surface can be improved by subsequent CMP treatment. The surface including the source or drain electrode 130a and the source or drain electrode 130b is planarized in such a manner, so that an electrode, a wiring, an insulating layer, a semiconductor layer, and the like can be favorably formed in later steps.

Note that only the source or drain electrode 130a and the source or drain electrode 130b in contact with the metal compound regions 124 are shown here; however, an electrode that is in contact with the gate electrode 110 and the like can also be formed in this step. There is no particular limitation on a material used for the source or drain electrode 130a and the source or drain electrode 130b, and a variety of conductive materials can be used. For example, a conductive material such as molybdenum, titanium, chromium, tantalum, tungsten, aluminum, copper, neodymium, or scandium can be used. In consideration of heat treatment performed later, it is preferable that the source or drain electrode 130a and the source or drain electrode 130b be formed using a material with heat resistance enough to withstand the heat treatment.

Through the above steps, the transistor 160 using the substrate 100 including a semiconductor material is formed (see FIG. 9H). The transistor 160 including a material other than an oxide semiconductor can operate at high speed.

Note that an electrode, a wiring, an insulating layer, or the like may be further formed after the above step. When the wiring has a multi-layer structure including a stacked structure of an interlayer insulating layer and a conductive layer, a highly integrated semiconductor device can be provided.

<Method for Manufacturing Transistor in Upper Portion>

Next, steps of manufacturing the transistor 162 over the interlayer insulating layer 128 will be described with reference to FIGS. 10A to 10E. Note that FIGS. 10A to 10E illustrate steps of manufacturing electrodes, the transistor 162, and the like over the interlayer insulating layer 128; therefore, the transistor 160 and the like positioned below the transistor 162 are omitted.

Figure 10A:
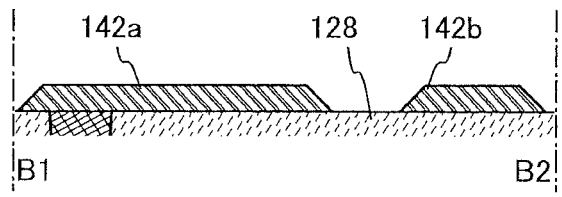
FIGS. 10A to 10E are cross-sectional views of a process of manufacturing a semiconductor device.

First, a conductive layer is forming over the interlayer insulating layer 128 and etched selectively, so that the source or drain electrode 142a and the source or drain electrode 142b are formed (see FIG. 10A).

The conductive layer can be formed by a PVD method typified by a sputtering method or a CVD method such as a plasma CVD method. As a material for the conductive layer, an element selected from aluminum, chromium, copper, tantalum, titanium, molybdenum, and tungsten; an alloy including any of these elements as a component; or the like can be used. Any of manganese, magnesium, zirconium, and beryllium, or a material including two or more of these in combination may be used. Aluminum combined with an element selected from titanium, tantalum, tungsten, molybdenum, chromium, neodymium, and scandium, or a material including two or more of these in combination may be used.

The conductive layer may have a single-layer structure or a stacked structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like can be given. Note that in the case where the conductive layer has the single-layer structure of a titanium film or a titanium nitride film, there is an advantage that the source or drain electrode 142a and the source or drain electrode 142b can be easily processed to be tapered.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

The conductive layer is preferably etched so that end portions of the source or drain electrode 142a and the source or drain electrode 142b are tapered. Here, the taper angle is preferably greater than or equal to 30° and less than or equal to 60°, for example. The etching is performed so that the end portions of the source or drain electrode 142a and the source or drain electrode 142b are tapered, whereby coverage with the gate insulating layer 146 formed later can be improved and disconnection can be prevented.

The channel length (L) of the transistor is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. The resolution of light exposure with extreme ultraviolet rays is high and the depth of focus is large. For these reasons, the channel length (L) of the transistor formed later can be greater than or equal to 10 nm and less than or equal to 1000 nm (1 µm), and the circuit can operate at higher speed. Moreover, power consumption of the semiconductor device can be reduced by miniaturization.

Note that an insulating layer functioning as a base may be provided over the interlayer insulating layer 128. The insulating layer can be formed by a PVD method, a CVD method, or the like.

Further, an insulating layer may be formed over the source or drain electrode 142a and the source or drain electrode 142b. By providing the insulating layer, parasitic capacitance formed between a gate electrode formed later and the source and drain electrodes 142a and 142b can be reduced.

Figure 10B:
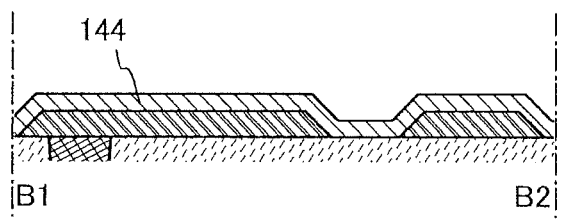

After that, the oxide semiconductor layer 144 is formed so as to cover the source or drain electrode 142a and the source or drain electrode 142b (see FIG. 10B).

As the oxide semiconductor layer 144, four-component metal oxide such as an In—Sn—Ga—Zn—O-based oxide semiconductor, three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor, an In—O-based oxide semiconductor, a Sn—O-based oxide semiconductor, a Zn—O-based oxide semiconductor, or the like can be used.

In particular, an In—Ga—Zn—O-based oxide semiconductor material has sufficiently high resistance when there is no electrical field and thus the off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, the one represented by $InGaO_3(ZnO)_m$, (m>0) is given. In addition, there is an oxide semiconductor material in which Ga is replaced by M and which is represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, Al can be Ga, Ga and Al, Ga and Fe, Ga and Ni, Ga and Mn, Ga and Co, or the like. Note that the above compositions are just examples obtained from a crystal structure.

As a target used for forming the oxide semiconductor layer 144 by a sputtering method, a target with a composition ratio of In:Ga:Zn=1:x:y (x is greater than or equal to 0, and y is greater than or equal to 0.5 and less than or equal to 5) is preferably used. For example, a target with a composition ratio of $In_2O_3:Ga_2O_3:ZnO=1:1:2$ [molar ratio] (x=1, y=1), or the like can be used. Alternatively, a target with a composition ratio of $In_2O_3:Ga_2O_3:ZnO=1:1:1$ [molar ratio] (x=1, y=0.5), a target with a composition ratio of $In_2O_3:Ga_2O_3:ZnO=1:1:4$ [molar ratio] (x=1, y=2), or a target with a composition ratio of $In_2O_3:Ga_2O_3:ZnO=1:0:2$ [molar ratio] (x=0, y=1) can be used.

In this embodiment, the oxide semiconductor layer 144 having an amorphous structure is formed by a sputtering method with the use of an In—Ga—Zn—O-based metal oxide target.

The relative density of the metal oxide in the metal oxide target is 80% or higher, preferably 95% or higher, more preferably 99.9% or higher. With the use of the metal oxide target with high relative density, the oxide semiconductor layer 144 can be formed to have a dense structure.

The atmosphere in which the oxide semiconductor layer 144 is formed is preferably a rare gas (typically argon) atmosphere, an oxygen atmosphere, or a mixed atmosphere including a rare gas (typically argon) and oxygen. Specifically, it is preferable to use, for example, an atmosphere of a high-purity gas from which an impurity such as hydrogen, water, a hydroxyl group, or hydride is removed so that the concentration is 1 ppm or lower (preferably the concentration is 10 ppb or lower).

In forming the oxide semiconductor layer 144, for example, an object to be processed is held in a treatment chamber that is kept under reduced pressure and the object to be processed is heated so that the temperature of the object to be processed is higher than or equal to 100° C. and lower than 550° C., preferably higher than or equal to 200° C. and lower than or equal to 400° C. Alternatively, the temperature of the object to be processed in the formation of the oxide semiconductor layer 144 may be room temperature. Then, moisture in the treatment chamber is removed, a sputtering gas from which hydrogen, water, and the like are removed is introduced, and the above target is used, so that the oxide semiconductor layer 144 is formed. By forming the oxide semiconductor layer 144 while heating the object to be processed, impurities in the oxide semiconductor layer 144 can be reduced. Further, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By performing evacuation with the use of a cryopump or the like, hydrogen, water, and the like can be removed from the treatment chamber; thus, the concentration of an impurity in the oxide semiconductor layer 144 can be reduced.

The oxide semiconductor layer 144 can be formed under the following conditions, for example: the distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because dust (such as powder substances formed at the time of film formation) can be reduced and the film thickness can be uniform. The thickness of the oxide semiconductor layer 144 is greater than or equal to 1 nm and less than or equal to 50 nm, preferably greater than or equal to 1 nm and less than or equal to 30 nm, more preferably greater than or equal to 1 nm and less than or equal to 10 nm. With the oxide semiconductor layer 144 having such a thickness, a short-channel effect which occurs along with miniaturization can be suppressed. Note that the appropriate thickness differs depending on the oxide semiconductor material to be used, the intended use of the semiconductor device, or the like; therefore, the thickness may be determined in accordance with the material, the intended use, or the like.

Note that before the oxide semiconductor layer 144 is formed by a sputtering method, a substance attached to a formation surface (e.g., a surface of the interlayer insulating layer 128) is preferably removed by reverse sputtering in which an argon gas is introduced and plasma is generated. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that a nitrogen atmosphere, a helium atmosphere, an oxygen atmosphere, or the like may be used instead of an argon atmosphere.

After that, heat treatment (first heat treatment) is preferably performed on the oxide semiconductor layer 144. By the first heat treatment, excessive hydrogen (including water and a hydroxyl group) in the oxide semiconductor layer 144 can be removed, the structure of the oxide semiconductor layer can be modified, and defect levels in the energy gap can be reduced. The temperature of the first heat treatment is, for example, higher than or equal to 300° C. and lower than 550° C. or higher than or equal to 400° C. and lower than or equal to 500° C.

The heat treatment can be performed in such a manner that, for example, the object to be processed is introduced into an electric furnace in which a resistance heating element or the like is used and heated at 450° C. for one hour in a nitrogen atmosphere. During the heat treatment, the oxide semiconductor layer 144 is not exposed to air to prevent entry of water and hydrogen.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed in the following manner. The object to be processed is put in an inert gas atmosphere that has been heated, heated for several minutes, and taken out of the inert gas atmosphere. GRTA treatment enables high-temperature heat treatment for a short time. Moreover, GRTA treatment can be employed even when the temperature exceeds the upper temperature limit of the object to be processed. Note that the inert gas may be switched to a gas including oxygen in the treatment. This is because defect levels in the energy gap due to oxygen deficiency can be reduced by performing the first heat treatment in an atmosphere including oxygen.

Note that as the inert gas atmosphere, an atmosphere that includes nitrogen or a rare gas (such as helium, neon, or argon) as a main component and does not include water, hydrogen, and the like is preferably used. For example, the purity of nitrogen or a rare gas such as helium, neon, or argon introduced into a heat treatment apparatus is higher than or equal to 6N (99.9999%), preferably higher than or equal to 7N (99.99999%) (that is, the concentration of an impurity is lower than or equal to 1 ppm, preferably lower than or equal to 0.1 ppm).

In any case, impurities are reduced by the first heat treatment so that the i-type (intrinsic) or substantially i-type oxide semiconductor layer 144 is obtained. Accordingly, a transistor having extremely excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can also be performed at the following timing: after the formation of the oxide semiconductor layer, after the formation of the gate insulating layer, after the formation of the gate electrode, or the like. Such dehydration treatment or dehydrogenation treatment may be performed once or plural times.

Figure 10C:
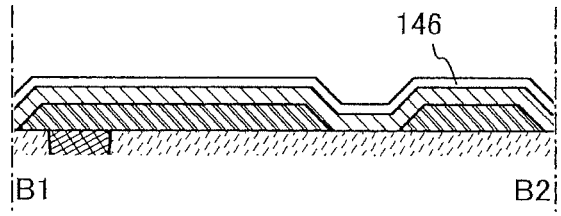

Next, the gate insulating layer 146 is formed in contact with the oxide semiconductor layer 144 (see FIG. 10C). The gate insulating layer 146 can be formed by a CVD method, a sputtering method, or the like. The gate insulating layer 146 is preferably formed so as to include silicon oxide, silicon nitride, silicon oxynitride, aluminum oxide, tantalum oxide, hafnium oxide, yttrium oxide, hafnium silicate (Hf-$Si_xO_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added, or the like. The gate insulating layer 146 may have a single-layer structure or a stacked structure. There is no particular limitation on the thickness of the gate insulating layer 146; in the case where the size of the semiconductor device is reduced, the gate insulating layer 146 is preferably thin in order to secure operation of the transistor. For example, in the case of using silicon oxide, the thickness can be greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate (HfSi$_x$O$_y$, (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 146, the thickness thereof can be increased for suppression of gate leakage with the electric characteristics maintained in a good condition. Note that a stacked structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistor. Moreover, in the case where the gate insulating layer 146 includes oxygen, oxygen is supplied to the oxide semiconductor layer 144 to compensate for oxygen deficiency in the oxide semiconductor layer 144, whereby an i-type (intrinsic) or substantially i-type oxide semiconductor layer can be formed.

Note that the second heat treatment is performed after the gate insulating layer 146 is formed in this embodiment; however, the timing of the second heat treatment is not particularly limited to this. For example, the second heat treatment may be performed after the gate electrode is formed. Furthermore, the first heat treatment and the second heat treatment may be successively performed, the first heat treatment may also serve as the second heat treatment, or the second heat treatment may also serve as the first heat treatment.

Figure 10D:
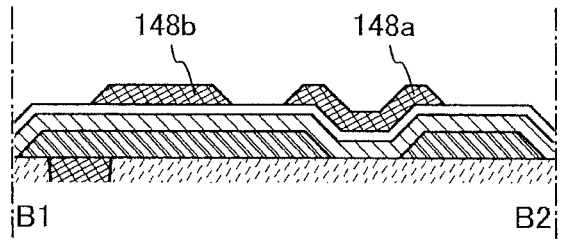

Next, over the gate insulating layer 146, the gate electrode 148a is formed in a region overlapping with the oxide semiconductor layer 144 and the electrode 148b is formed in a region overlapping with the source or drain electrode 142a (see FIG. 10D). The gate electrode 148a and the electrode 148b can be formed in such a manner that a conductive layer is formed over the gate insulating layer 146 and then etched selectively. The conductive layer to be the gate electrode 148a and the electrode 148b can be formed by a PVD method typified by a sputtering method or a CVD method such as a plasma CVD method. The details are similar to those of the source or drain electrode 142a or the like; thus, description thereof can be referred to.

Figure 10E:
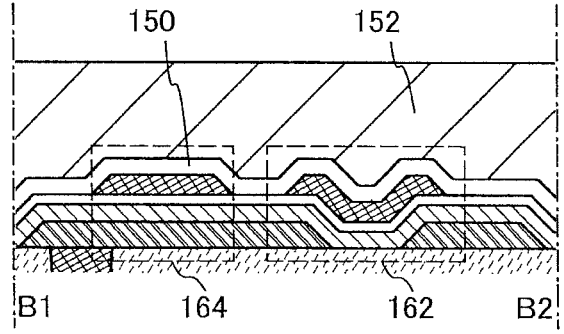

Next, the interlayer insulating layer 150 and the interlayer insulating layer 152 are formed over the gate insulating layer 146, the gate electrode 148a, and the electrode 148b (see FIG. 10E). The interlayer insulating layer 150 and the interlayer insulating layer 152 can be formed by a PVD method, a CVD method, or the like. The interlayer insulating layer 150 and the interlayer insulating layer 152 can be formed using a material including an inorganic insulating material such as silicon oxide, silicon oxynitride, silicon nitride, hafnium oxide, aluminum oxide, or tantalum oxide. Note that a stacked structure of the interlayer insulating layer 150 and the interlayer insulating layer 152 is employed in this embodiment; however, one embodiment of the disclosed invention is not limited to this. A single-layer structure or a stacked structure including three or more layers can also be employed. A structure in which an interlayer insulating layer is not provided may also be employed.

Note that the interlayer insulating layer 152 is preferably formed so as to have a planarized surface. By forming the interlayer insulating layer 152 so as to have a planarized surface, an electrode, a wiring, or the like can be favorably formed over the interlayer insulating layer 152 even in the case where the semiconductor device is reduced in size, for example. The interlayer insulating layer 152 can be planarized by a method such as chemical mechanical polishing (CMP) treatment.

Through the above steps, the transistor 162 including the purified oxide semiconductor layer 144 is completed (see FIG. 10E). The capacitor 164 is also completed.

The transistor 162 illustrated in FIG. 10E includes the oxide semiconductor layer 144; the source or drain electrode 142a and the source or drain electrode 142b which are electrically connected to the oxide semiconductor layer 144; the gate insulating layer 146 which covers the oxide semiconductor layer 144, the source or drain electrode 142a, and the source or drain electrode 142b; and the gate electrode 148a over the gate insulating layer 146. Further, the capacitor 164 includes the source or drain electrode 142a, the oxide semiconductor layer 144, the gate insulating layer 146 which covers the source or drain electrode 142a, and the electrode 148b over the gate insulating layer 146.

In the transistor 162 described in this embodiment, the oxide semiconductor layer 144 is purified and thus the hydrogen concentration thereof is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. The carrier density of the oxide semiconductor layer 144 is sufficiently low (e.g., lower than $1 \times 10^{12}$/cm$^3$, preferably lower than $1.45 \times 10^{10}$/cm$^3$) as compared to the carrier density of a general silicon wafer (approximately $1 \times 10^{14}$/cm$^3$). Accordingly, the off-state current of the transistor 162 is sufficiently small. For example, the off-state current (here, current per micrometer of channel width) of the transistor 162 at room temperature is 100 zA/μm (1 zA (zeptoampere) is $1 \times 10^{-21}$ A) or less, preferably 10 zA/μm or less.

With the use of the purified and intrinsic oxide semiconductor layer 144, the off-state current of a transistor can be sufficiently reduced. Further, with the use of such a transistor, a semiconductor device capable of retaining stored data for an extremely long time can be obtained.

As described above, the structures, methods, and the like described in this embodiment can be combined as appropriate with any of the structures, methods, and the like described in the other embodiments.

Embodiment 5

In this embodiment, a structure and a manufacturing method of a semiconductor device according to one embodiment of the disclosed invention, which are different from those of Embodiment 4, will be described with reference to FIGS. 11A and 11B and FIGS. 12A to 12D.

<Cross-Sectional Structure and Planar Structure of Semiconductor Device>

Figure 11A:
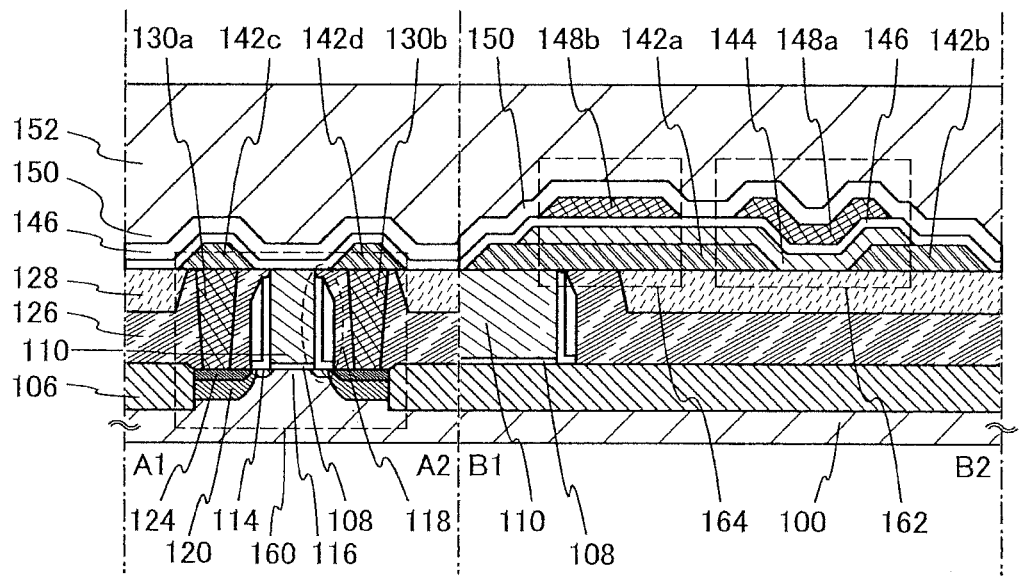
FIGS. 11A and 11B are a cross-sectional view and a plan view of a semiconductor device.
Figure 11B:
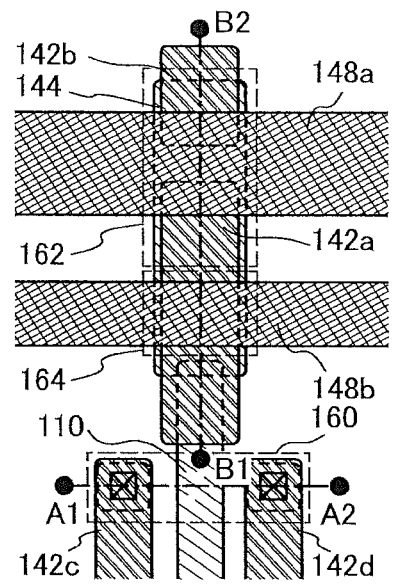

FIGS. 11A and 11B illustrate an example of a structure of a semiconductor device. FIG. 11A illustrates a cross section of the semiconductor device, and FIG. 11B illustrates a plan view of the semiconductor device. Here, FIG. 11A corresponds to a cross section along line A1-A2 and line B1-B2 in FIG. 11B. The semiconductor device illustrated in FIGS. 11A and 11B includes the transistor 160 including a material other than an oxide semiconductor in a lower portion, and the transistor 162 including an oxide semiconductor in an upper portion. A transistor including a material other than an oxide semiconductor can operate at high speed easily. On the other hand, a transistor including an oxide semiconductor can hold charge for a long time owing to its characteristics.

Although both of the transistors are n-channel transistors here, it is needless to say that p-channel transistors can be used. Since the technical nature of the disclosed invention is to use an oxide semiconductor in the transistor 162 so that data can be stored, it is not necessary to limit a specific structure of a semiconductor device to the structure described here.

The transistor 160 in FIGS. 11A and 11B includes the channel formation region 116 provided in the substrate 100 including a semiconductor material (e.g., silicon), the impurity regions 114 and the high-concentration impurity regions 120 (these regions are also collectively referred to simply as impurity regions) provided so that the channel formation region 116 is sandwiched therebetween, the gate insulating layer 108 provided over the channel formation region 116, the gate electrode 110 provided over the gate insulating layer 108, and the source or drain electrode 130a and the source or drain electrode 130b electrically connected to the impurity regions. Further, a wiring 142c and a wiring 142d are provided over the source or drain electrode 130a and the source or drain electrode 130b. Note that as the semiconductor material, for example, silicon, germanium, silicon germanium, silicon carbide, gallium arsenide, or the like can be used, and a single crystal semiconductor is preferably used.

The sidewall insulating layer 118 is provided on a side surface of the gate electrode 110. The high-concentration impurity region 120 is positioned in a region of the substrate 100 that does not overlap with the sidewall insulating layer 118 when seen from a direction perpendicular to the surface of the substrate 100. The metal compound region 124 is positioned in contact with the high-concentration impurity region 120. The element isolation insulating layer 106 is provided over the substrate 100 so as to surround the transistor 160. An opening is provided over the gate electrode 110, and the interlayer insulating layer 126 and the interlayer insulating layer 128 are provided so as to cover the transistor 160. Each of the source or drain electrode 130a and the source or drain electrode 130b is electrically connected to the metal compound region 124 through an opening formed in the interlayer insulating layer 126 and the interlayer insulating layer 128. That is, each of the source or drain electrode 130a and the source or drain electrode 130b is electrically connected to the high-concentration impurity region 120 and the impurity region 114 through the metal compound region 124. Note that the sidewall insulating layer 118 is not formed in some cases for integration of the transistor 160 or the like.

The transistor 162 in FIGS. 11A and 11B includes the source or drain electrode 142a and the source or drain electrode 142b which are provided over the interlayer insulating layer 128; the island-shaped oxide semiconductor layer 144 which is electrically connected to the source or drain electrode 142a and the source or drain electrode 142b; the gate insulating layer 146 which covers the source or drain electrode 142a, the source or drain electrode 142b, and the island-shaped oxide semiconductor layer 144; and the gate electrode 148a which is provided over the gate insulating layer 146 so as to overlap with the island-shaped oxide semiconductor layer 144.

Here, the source or drain electrode 142a is formed directly on the gate electrode 110, whereby the transistor 160 in the lower portion and the transistor 162 in the upper portion are electrically connected to each other. That is, the semiconductor device described in this embodiment has a structure in which the transistor 162 in the upper portion is formed above the transistor 160 in the lower portion, from which a portion over the top surface of the gate electrode 110 is removed, in the semiconductor device described in Embodiment 4.

Note that it is preferable that the oxide semiconductor layer 144 be purified by sufficient removal of impurities such as hydrogen or sufficient supply of oxygen. Specifically, the concentration of hydrogen in the oxide semiconductor layer 144 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the concentration of hydrogen in the oxide semiconductor layer 144 is measured by secondary ion mass spectrometry (SIMS). Thus, in the oxide semiconductor layer 144 in which the hydrogen concentration is sufficiently reduced so that the oxide semiconductor layer is purified and defect levels in the energy gap due to oxygen deficiency are reduced by sufficient supply of oxygen, the carrier density is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer of channel width) at room temperature is 100 zA/μm (1 zA (zeptoampere) is $1\times10^{-21}$ A) or less, preferably 10 zA/μm or less. With the use of such an i-type (intrinsic) or substantially i-type oxide semiconductor, the transistor 162 which has extremely excellent off-state current characteristics can be obtained.

The capacitor 164 includes the source or drain electrode 142a, the oxide semiconductor layer 144, the gate insulating layer 146, and the electrode 148b. That is, the source or drain electrode 142a functions as one electrode of the capacitor 164, and the electrode 148b functions as the other electrode of the capacitor 164.

Note that in the capacitor 164 in FIGS. 11A and 11B, the oxide semiconductor layer 144 and the gate insulating layer 146 are stacked, whereby insulation between the source or drain electrode 142a and the electrode 148b can be sufficiently secured.

Note that in the transistor 162 and the capacitor 164, end portions of the source or drain electrode 142a and the source or drain electrode 142b are preferably tapered. Here, the taper angle is greater than or equal to 30° and less than or equal to 60°, for example. Note that the taper angle is a tilt angle formed by a side surface and a bottom surface of a layer having a tapered shape (e.g., the source or drain electrode 142a) in the case where the layer is observed from a direction perpendicular to a cross section (a plane perpendicular to the surface of a substrate). The end portions of the source or drain electrode 142a and the source or drain electrode 142b are tapered, whereby coverage with the oxide semiconductor layer 144 can be improved and disconnection can be prevented.

Further, the interlayer insulating layer 150 is provided over the transistor 162 and the capacitor 164, and the interlayer insulating layer 152 is provided over the interlayer insulating layer 150.

<Method for Manufacturing Semiconductor Device>

Next, an example of a method for manufacturing the semiconductor device will be described. Hereinafter, steps performed after formation of the transistor 160 in the lower portion and a method for manufacturing the transistor 162 in the upper portion will be described with reference to FIGS. 12A to 12D. The transistor 160 in the lower portion can be manufactured by a method similar to that described in Embodiment 4, and description in Embodiment 4 can be referred to.

Figure 12A:
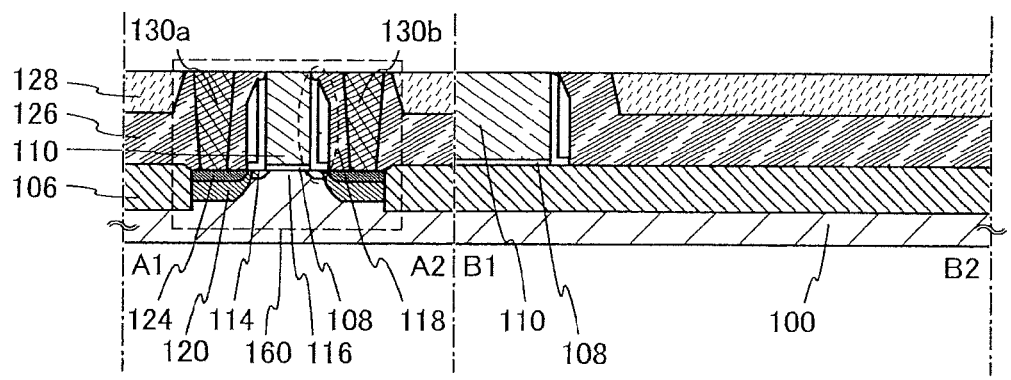
FIGS. 12A to 12D are cross-sectional views of a process of manufacturing a semiconductor device.

The transistor 160 in the lower portion is formed by the method described in Embodiment 4 first, and then a portion of the transistor 160 over the top surface of the gate electrode 110 is removed (see FIG. 12A). The portion of the transistor 160 over the top surface of the gate electrode 110 is removed by performing polishing treatment (e.g., CMP treatment) on the transistor 160 in the lower portion until the top surface of the gate electrode 110 is exposed. Thus, portions of the interlayer insulating layers 126 and 128 and the source and drain electrodes 130a and 130b over the gate electrode 110 are removed by the CMP treatment. At this time, the surface including the interlayer insulating layers 126 and 128 and the source and drain electrodes 130a and 130b is planarized, so that an electrode, a wiring, an insulating layer, a semiconductor layer, and the like can be favorably formed in later steps. In addition, the electrode 130c described in Embodiment 4 would be completely removed by the CMP treatment and thus does not need to be formed.

The top surface of the gate electrode 110 is exposed by the CMP treatment in this manner, whereby the gate electrode 110 and the source or drain electrode 142a can be directly in contact with each other; accordingly, the transistor 160 and the transistor 162 can be easily electrically connected to each other.

Figure 12B:
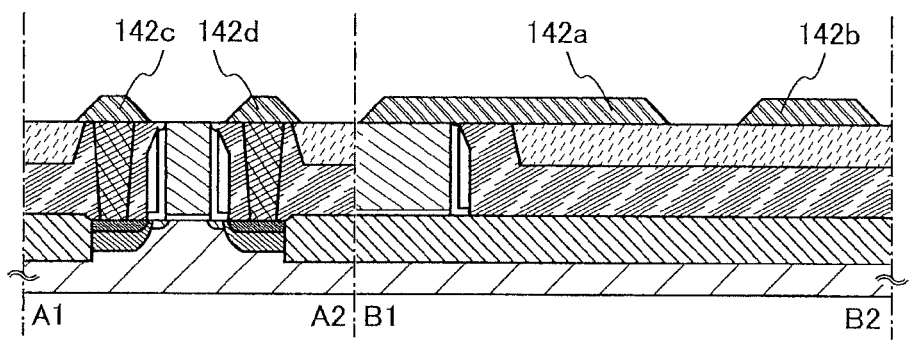

Next, a conductive layer is formed over the interlayer insulating layers 126 and 128 and etched selectively, so that the source or drain electrode 142a, the source or drain electrode 142b, the wiring 142c, and the wiring 142d are formed (see FIG. 12B). Here, the source or drain electrode 142a, the wiring 142c, and the wiring 142d are formed so as to be directly in contact with the gate electrode 110, the source or drain electrode 130a, and the source or drain electrode 130b, respectively.

Here, for the conductive layer used for forming the source or drain electrode 142a, the source or drain electrode 142b, the wiring 142c, and the wiring 142d, a material similar to that described in Embodiment 4 can be used and description in Embodiment 4 can be referred to. Etching of the conductive layer can also be performed in a manner similar to the method described in Embodiment 4, and description in Embodiment 4 can be referred to.

Further, as in the case of Embodiment 4, an insulating layer may be formed over the source or drain electrode 142a and the source or drain electrode 142b. By providing the insulating layer, parasitic capacitance formed between a gate electrode formed later and the source and drain electrodes 142a and 142b can be reduced.

Figure 12C:
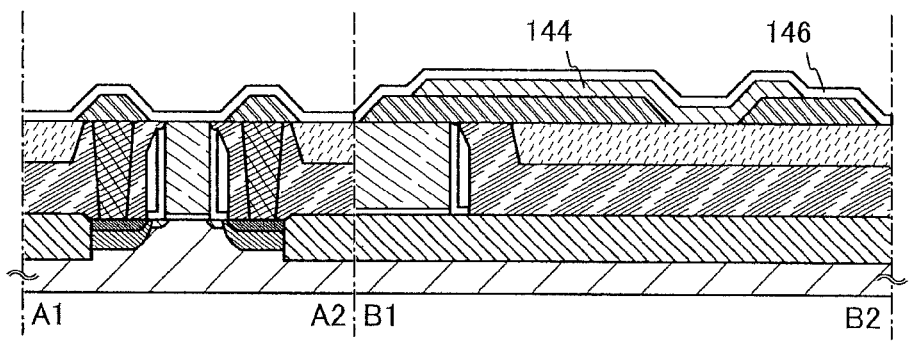

Next, an oxide semiconductor layer is formed so as to cover the source or drain electrode 142a, the source or drain electrode 142b, the wiring 142c, and the wiring 142d and the oxide semiconductor layer is selectively etched, so that the oxide semiconductor layer 144 is formed in contact with the source or drain electrode 142a and the source or drain electrode 142b (see FIG. 12C).

The oxide semiconductor layer can be formed using a material and a method similar to those described in Embodiment 4. Therefore, Embodiment 4 can be referred to for a material and a formation method of the oxide semiconductor layer.

The oxide semiconductor layer formed in this manner is processed into an island shape by a method such as etching using a mask, so that the island-shaped oxide semiconductor layer 144 is formed.

As the etching of the oxide semiconductor layer, either dry etching or wet etching may be employed. Needless to say, dry etching and wet etching can be used in combination. The etching conditions (such as an etching gas, an etchant, etching time, and temperature) are set as appropriate in accordance with the material so that the oxide semiconductor layer can be etched into a desired shape.

Further, the oxide semiconductor layer 144 is preferably subjected to heat treatment (first heat treatment) in a manner similar to that described in Embodiment 4. The first heat treatment can be performed by the method described in Embodiment 4, and Embodiment 4 can be referred to. Impurities are reduced by the first heat treatment so that the i-type (intrinsic) or substantially i-type oxide semiconductor layer 144 is obtained. Accordingly, a transistor having extremely excellent characteristics can be realized. Note that the first heat treatment may be performed before the oxide semiconductor layer is etched or after the oxide semiconductor layer is etched to be processed into an island shape.

Next, the gate insulating layer 146 is formed in contact with the oxide semiconductor layer 144 (see FIG. 12C).

The gate insulating layer 146 can be formed using a material and a method similar to those described in Embodiment 4. Therefore, Embodiment 4 can be referred to for a material and a formation method of the gate insulating layer 146.

After the gate insulating layer 146 is formed, second heat treatment is preferably performed in an inert gas atmosphere or an oxygen atmosphere in a manner similar to that described in Embodiment 4. The second heat treatment can be performed by the method described in Embodiment 4, and Embodiment 4 can be referred to. The second heat treatment can reduce variation in electric characteristics of the transistor. Moreover, in the case where the gate insulating layer 146 includes oxygen, oxygen is supplied to the oxide semiconductor layer 144 to compensate for oxygen deficiency in the oxide semiconductor layer 144, whereby an i-type (intrinsic) or substantially i-type oxide semiconductor layer can be formed.

Note that the second heat treatment is performed after the gate insulating layer 146 is formed in this embodiment; however, the timing of the second heat treatment is not particularly limited to this. For example, the second heat treatment may be performed after the gate electrode is formed. Furthermore, the first heat treatment and the second heat treatment may be successively performed, the first heat treatment may also serve as the second heat treatment, or the second heat treatment may also serve as the first heat treatment.

Figure 12D:
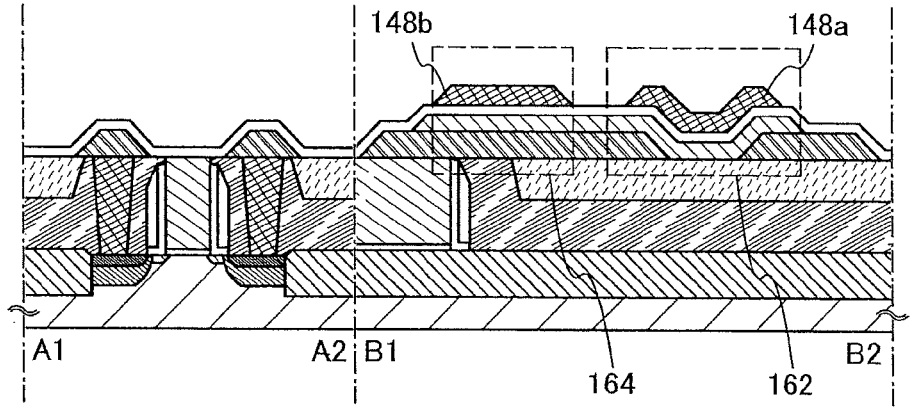

Next, over the gate insulating layer 146, the gate electrode 148*a* is formed in a region overlapping with the oxide semiconductor layer 144 and the electrode 148*b* is formed in a region overlapping with the source or drain electrode 142*a* (see FIG. 12D). The gate electrode 148*a* and the electrode 148*b* can be formed in such a manner that a conductive layer is formed over the gate insulating layer 146 and then etched selectively. The conductive layer to be the gate electrode 148*a* and the electrode 148*b* can be formed by a PVD method typified by a sputtering method or a CVD method such as a plasma CVD method. The details are similar to those of the source or drain electrode 142*a* or the like; thus, description thereof can be referred to.

Next, in a manner similar to that described in Embodiment 4, the interlayer insulating layer 150 and the interlayer insulating layer 152 are formed over the gate insulating layer 146, the gate electrode 148*a*, and the electrode 148*b*. The interlayer insulating layer 150 and the interlayer insulating layer 152 can be formed using materials and methods similar to those described in Embodiment 4. Therefore, Embodiment 4 can be referred to for materials and formation methods of the interlayer insulating layer 150 and the interlayer insulating layer 152.

Note that the interlayer insulating layer 152 is preferably formed so as to have a planarized surface. By forming the interlayer insulating layer 152 so as to have a planarized surface, an electrode, a wiring, or the like can be favorably formed over the interlayer insulating layer 152 even in the case where the semiconductor device is reduced in size, for example. The interlayer insulating layer 152 can be planarized by a method such as chemical mechanical polishing (CMP) treatment.

Through the above steps, the transistor 162 including the purified oxide semiconductor layer 144 is completed (see FIGS. 12A to 12D). The capacitor 164 is also completed.

The transistor 162 illustrated in FIG. 12D includes the oxide semiconductor layer 144; the source or drain electrode 142*a* and the source or drain electrode 142*b* which are electrically connected to the oxide semiconductor layer 144; the gate insulating layer 146 which covers the oxide semiconductor layer 144, the source or drain electrode 142*a*, and the source or drain electrode 142*b*; and the gate electrode 148*a* over the gate insulating layer 146. Further, the capacitor 164 includes the source or drain electrode 142*a*, the oxide semiconductor layer 144, the gate insulating layer 146 which covers the source or drain electrode 142*a*, and the electrode 148*b* over the gate insulating layer 146.

<Cross-Sectional View and Plan View of Semiconductor Device>

Next, a structure of a semiconductor device according to one embodiment of the disclosed invention, which is different from that in FIGS. 11A and 11B, and a manufacturing method thereof will be described with reference to FIGS. 25A and 25B and FIGS. 26A to 26D.

Figure 25A:
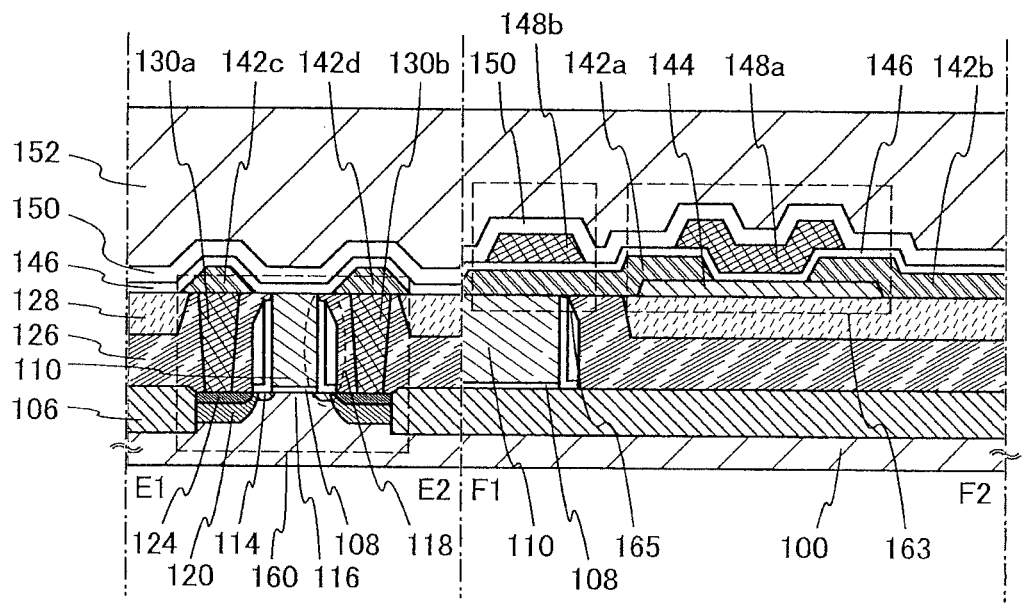
FIGS. 25A and 25B are a cross-sectional view and a plan view of a semiconductor device.
Figure 25B:
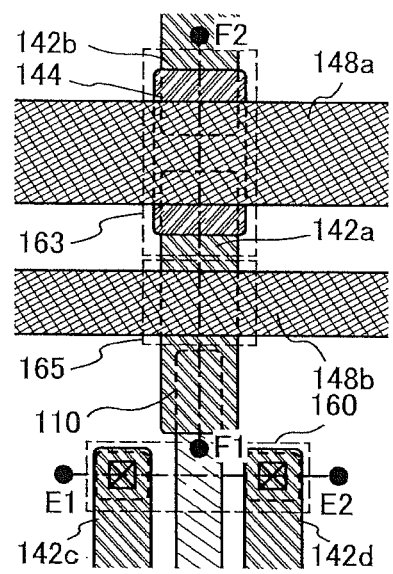

FIGS. 25A and 25B illustrate an example of a structure of a semiconductor device. FIG. 25A illustrates a cross section of the semiconductor device, and FIG. 25B illustrates a plan view of the semiconductor device. Here, FIG. 25A corresponds to a cross section along line E1-E2 and line F1-F2 in FIG. 25B. The semiconductor device illustrated in FIGS. 25A and 25B includes the transistor 160 including a material other than an oxide semiconductor in a lower portion, and a transistor 163 including an oxide semiconductor in an upper portion. The structure of the transistor 160 in the lower portion in FIGS. 25A and 25B is similar to that in FIGS. 11A and 11B and thus is not described in detail.

The oxide semiconductor layer 144, the source or drain electrode 142*a*, the source or drain electrode 142*b*, the gate insulating layer 146, and the gate electrode 148*a* are included in both the transistor 163 illustrated in FIGS. 25A and 25B and the transistor 162 illustrated in FIGS. 11A and 11B. A difference between the transistor 163 and the transistor 162 is positions where the oxide semiconductor layer 144 is connected to the source or drain electrode 142*a* and the source or drain electrode 142*b*. That is, in the transistor 163, upper portions of the oxide semiconductor layer 144 are in contact with the source or drain electrode 142*a* and the source or drain electrode 142*b*.

In FIGS. 25A and 25B, the oxide semiconductor layer 144 can have a uniform thickness by improving the planarity of the interlayer insulating layer 128 over which the oxide semiconductor layer 144 is formed; thus, the characteristics of the transistor 163 can be improved.

The source or drain electrode 142*a*, the gate insulating layer 146, and the electrode 148*b* are included in both a capacitor 165 illustrated in FIGS. 25A and 25B and the capacitor 164 illustrated in FIGS. 11A and 11B. A difference between the capacitor 165 and the capacitor 164 is that the capacitor 165 does not include the oxide semiconductor layer 144.

The capacitor 165 does not include the oxide semiconductor layer 144, whereby the capacitor 165 can have larger capacitance than the capacitor 164 in the case where the gate insulating layer 146 of the transistor 162 is formed using the same material and has the same thickness as the gate insulating layer 146 of the transistor 163.

Further, the interlayer insulating layer 150 is provided over the transistor 163 and the capacitor 165, and the interlayer insulating layer 152 is provided over the interlayer insulating layer 150.

<Method for Manufacturing Semiconductor Device>

Next, an example of a method for manufacturing the semiconductor device will be described. Hereinafter, a method for manufacturing the transistor 163 in the upper portion after formation of the transistor 160 in the lower portion will be described with reference to FIGS. 26A to 26D. The transistor in the lower portion can be manufactured by a method similar to that described in Embodiment 4, and description in Embodiment 4 can be referred to.

Figure 26A:
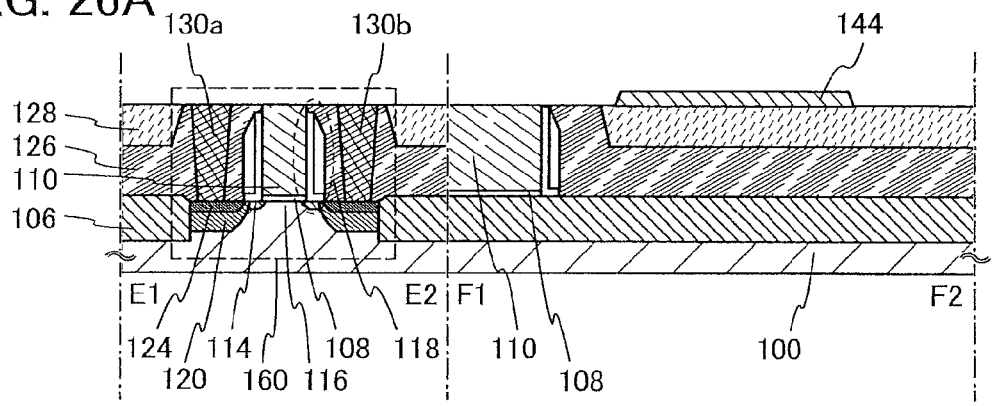
FIGS. 26A to 26D are cross-sectional views of a process of manufacturing a semiconductor device.

The transistor 160 in the lower portion is formed by the method described in Embodiment 4 first, and then a portion of the transistor 160 over a top surface of the gate electrode 110 is removed (see FIG. 26A). The portion of the transistor 160 over the top surface of the gate electrode 110 is removed by performing CMP treatment on the transistor 160 in the lower portion until the top surface of the gate electrode 110 is exposed. Thus, portions of the interlayer insulating layers 126 and 128 and the source and drain electrodes 130*a* and 130*b* over the gate electrode 110 are removed by the CMP treatment. At this time, by planarizing surfaces of the interlayer insulating layers 126 and 128 and the source and drain electrodes 130*a* and 130*b* over which an oxide semiconductor layer is formed later, the oxide semiconductor layer 144 can have a uniform thickness.

Next, an oxide semiconductor layer is formed over the interlayer insulating layers 126 and 128 and the source and drain electrodes 130*a* and 130*b*, which are planarized, and the oxide semiconductor layer is selectively etched, so that the oxide semiconductor layer 144 is formed (see FIG. 26A).

The oxide semiconductor layer can be formed using a material and a method similar to those described in Embodiment 4. Therefore, Embodiment 4 may be referred to for a material and a formation method of the oxide semiconductor layer.

The oxide semiconductor layer formed in this manner is processed into an island shape by a method such as etching using a mask, so that the island-shaped oxide semiconductor layer 144 is formed. Embodiment 4 may be referred to for a method for processing the oxide semiconductor layer.

Further, the oxide semiconductor layer 144 is preferably subjected to heat treatment (first heat treatment) in a manner similar to that described in Embodiment 4. The first heat treatment can be performed by the method described in Embodiment 4, and Embodiment 4 can be referred to Impurities are reduced by the first heat treatment so that the i-type (intrinsic) or substantially i-type oxide semiconductor layer 144 is obtained. Accordingly, a transistor having extremely excellent characteristics can be realized. Note that the first heat treatment may be performed before the oxide semiconductor layer is etched or after the oxide semiconductor layer is etched to be processed into an island shape.

Figure 26B:
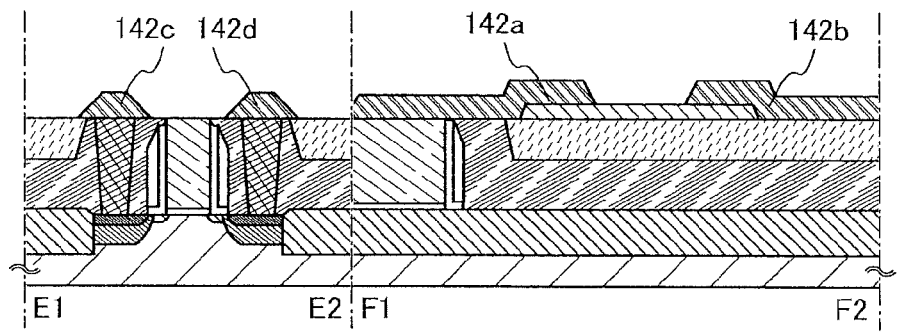

Next, a conductive layer is formed over the oxide semiconductor layer 144 and the like and etched selectively, so that the source or drain electrode 142*a*, the source or drain electrode 142*b*, and the wirings 142*c* and 142*d* are formed (see FIG. 26B). Here, the source or drain electrode 142*a*, the wiring 142*c*, and the wiring 142*d* are formed so as to be directly in contact with the gate electrode 110, the source or drain electrode 130*a*, and the source or drain electrode 130*b*, respectively.

Here, for the conductive layer used for forming the source or drain electrode 142*a*, the source or drain electrode 142*b*, the wiring 142*c*, and the wiring 142*d*, a material similar to that described in Embodiment 4 can be used and description in Embodiment 4 can be referred to. Etching of the conductive layer can also be performed in a manner similar to the method described in Embodiment 4, and description in Embodiment 4 can be referred to.

In the above manner, the top surface of the gate electrode 110 is exposed by removing portions of the interlayer insulating layers 126 and 128 over the gate electrode 110 by CMP treatment, whereby the gate electrode 110 and the source or drain electrode 142*a* can be directly in contact with each other; accordingly, the transistor 160 and the transistor 163 can be easily electrically connected to each other.

Figure 26C:
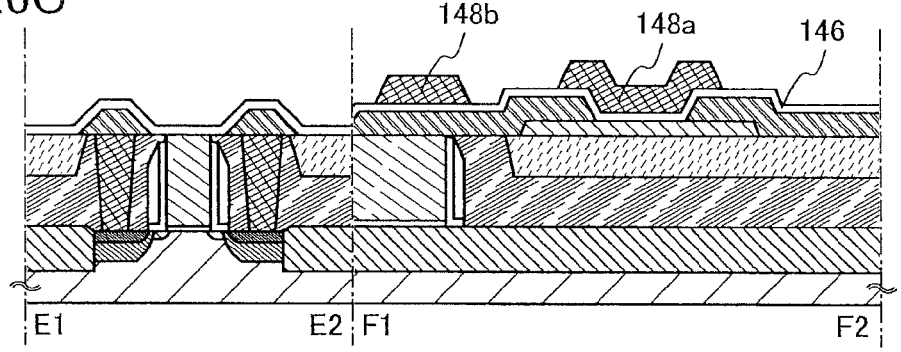

Next, the gate insulating layer 146 is framed in contact with the oxide semiconductor layer 144 (see FIG. 26C).

The gate insulating layer 146 can be formed using a material and a method similar to those described in Embodiment 4. Therefore, Embodiment 4 can be referred to for a material and a formation method of the gate insulating layer 146.

After the gate insulating layer 146 is formed, second heat treatment is preferably performed in an inert gas atmosphere or an oxygen atmosphere in a manner similar to that described in Embodiment 4. The second heat treatment can be performed by the method described in Embodiment 4, and Embodiment 4 can be referred to. The second heat treatment can reduce variation in electric characteristics of the transistor. Moreover, in the case where the gate insulating layer 146 includes oxygen, oxygen is supplied to the oxide semiconductor layer 144 to compensate for oxygen deficiency in the oxide semiconductor layer 144, whereby an i-type (intrinsic) or substantially i-type oxide semiconductor layer can be formed.

Note that the second heat treatment is performed after the gate insulating layer 146 is formed in this embodiment; however, the timing of the second heat treatment is not particularly limited to this. For example, the second heat treatment may be performed after the gate electrode 148*a* is formed. Furthermore, the first heat treatment and the second heat treatment may be successively performed, the first heat treatment may also serve as the second heat treatment, or the second heat treatment may also serve as the first heat treatment.

Next, over the gate insulating layer 146, the gate electrode 148*a* is formed in a region overlapping with the oxide semiconductor layer 144 and the electrode 148*b* is formed in a region overlapping with the source or drain electrode 142*a* (see FIG. 26C). The gate electrode 148*a* and the electrode 148*b* can be formed in such a manner that a conductive layer is formed over the gate insulating layer 146 and then etched selectively. The conductive layer to be the gate electrode 148*a* and the electrode 148*b* can be formed by a PVD method typified by a sputtering method or a CVD method such as a plasma CVD method. The details are similar to those of the source or drain electrode 142*a* or the like; thus, description thereof can be referred to.

Next, in a manner similar to that described in Embodiment 4, the interlayer insulating layer 150 and the interlayer insulating layer 152 are formed over the gate insulating layer 146, the gate electrode 148*a*, and the electrode 148*b*. The interlayer insulating layer 150 and the interlayer insulating layer 152 can be formed using materials and methods similar to those described in Embodiment 4. Therefore, Embodiment 4 can be referred to for materials and formation methods of the interlayer insulating layer 150 and the interlayer insulating layer 152.

Note that the interlayer insulating layer 152 is preferably formed so as to have a planarized surface. By forming the interlayer insulating layer 152 so as to have a planarized surface, an electrode, a wiring, or the like can be favorably formed over the interlayer insulating layer 152 even in the case where the semiconductor device is reduced in size, for example. The interlayer insulating layer 152 can be planarized by a method such as chemical mechanical polishing (CMP) treatment.

Figure 26D:
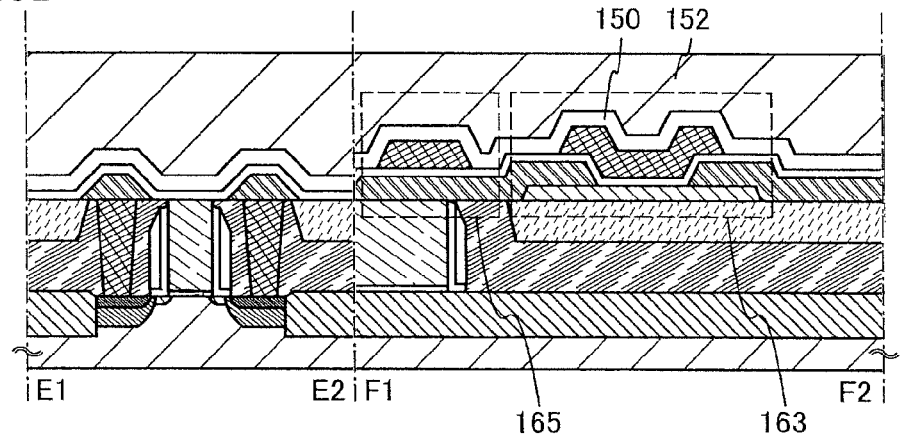

Through the above steps, the transistor 163 including the purified oxide semiconductor layer 144 is completed (see FIG. 26D). The capacitor 165 is also completed.

The transistor 163 illustrated in FIG. 26D includes the oxide semiconductor layer 144; the source and drain electrodes 142a and 142b which are electrically connected to the oxide semiconductor layer 144; the gate insulating layer 146 which covers the oxide semiconductor layer 144 and the source and drain electrodes 142a and 142b; and the gate electrode 148a over the gate insulating layer 146. Further, the capacitor 165 illustrated in FIG. 26D includes the source or drain electrode 142a, the gate insulating layer 146, and the electrode 148b over the gate insulating layer 146.

In the transistor 162 and the transistor 163 described in this embodiment, the oxide semiconductor layer 144 is purified and thus the hydrogen concentration thereof is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. The carrier density of the oxide semiconductor layer 144 is sufficiently low (e.g., lower than $1 \times 10^{12}$/cm$^3$, preferably lower than $1.45 \times 10^{10}$/cm$^3$) as compared to the carrier density of a general silicon wafer (approximately $1 \times 10^{14}$/cm$^3$). Accordingly, the off-state current is sufficiently small. For example, the off-state current (here, current per micrometer of channel width) of each of the transistor 162 and the transistor 163 at room temperature is 100 zA/μm (1 zA (zeptoampere) is $1 \times 10^{-21}$ A) or less, preferably 10 zA/μm or less.

With the use of the purified and intrinsic oxide semiconductor layer 144, the off-state current of a transistor can be sufficiently reduced. Further, with the use of such a transistor, a semiconductor device capable of retaining stored data for an extremely long time can be obtained.

As described above, the structures, methods, and the like described in this embodiment can be combined as appropriate with any of the structures, methods, and the like described in the other embodiments.

Embodiment 6

In this embodiment, a structure and a manufacturing method of a semiconductor device according to one embodiment of the disclosed invention, which are different from those of Embodiments 4 and 5, will be described with reference to FIGS. 13A and 13B, FIGS. 14A to 14D, and FIGS. 15A to 15C.

<Cross-Sectional Structure and Planar Structure of Semiconductor Device>

Figure 13A:
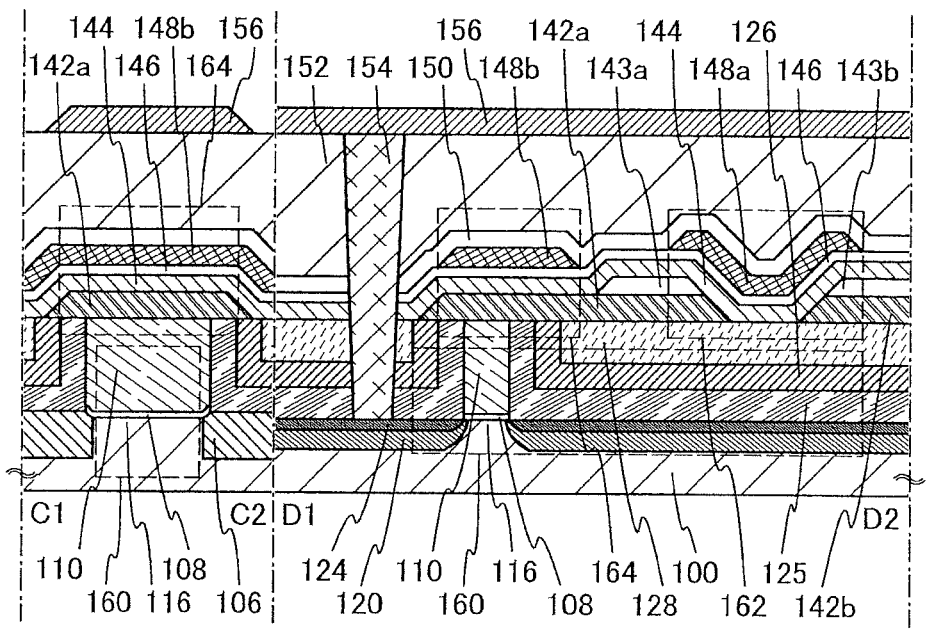
FIGS. 13A and 13B are a cross-sectional view and a plan view of a semiconductor device.
Figure 13B:
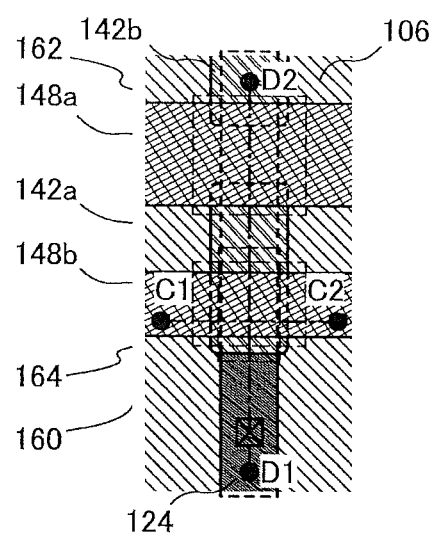

FIGS. 13A and 13B illustrate an example of a structure of a semiconductor device. FIG. 13A illustrates a cross section of the semiconductor device, and FIG. 13B illustrates a plan view of the semiconductor device. Here, FIG. 13A corresponds to a cross section along line C1-C2 and line D1-D2 in FIG. 13B. In the plan view of FIG. 13B, some of components, such as a source or drain electrode 154 and a wiring 156, are omitted to avoid complexity. The semiconductor device illustrated in FIGS. 13A and 13B includes the transistor 160 including a semiconductor material other than an oxide semiconductor in a lower portion, and the transistor 162 including an oxide semiconductor in an upper portion. A transistor including a semiconductor material other than an oxide semiconductor can operate at high speed easily. On the other hand, a transistor including an oxide semiconductor can hold charge for a long time owing to its characteristics.

Although both of the transistors are n-channel transistors here, it is needless to say that p-channel transistors can be used. Since the technical nature of the disclosed invention is to use an oxide semiconductor in the transistor 162 so that data can be stored, it is not necessary to limit a specific structure of a semiconductor device to the structure described here.

The semiconductor device in FIGS. 13A and 13B is different from the semiconductor devices described in the above embodiments in a planar layout of the semiconductor device. In this embodiment, the transistor 162 and the capacitor 164 are provided so as to overlap with the transistor 160. By employing such a planar layout, high integration is possible. For example, given that the minimum processing dimension is F, the area occupied by a memory cell can be 15 F$^2$ to 25 F$^2$.

The semiconductor device in FIGS. 13A and 13B is different from the semiconductor devices described in the above embodiments also in that the sidewall insulating layer 118 is not provided in the transistor 160. That is, the semiconductor device in FIGS. 13A and 13B does not include a sidewall insulating layer. Since a sidewall insulating layer is not formed, the impurity region 114 is not formed. Thus, in the case where the sidewall insulating layer is not provided, high integration is easy as compared to the case where the sidewall insulating layer 118 is provided. In addition, the manufacturing process can be simplified as compared to the case where the sidewall insulating layer 118 is provided.

The semiconductor device in FIGS. 13A and 13B is different from the semiconductor devices described in the above embodiments also in that an interlayer insulating layer 125 is provided in the transistor 160. That is, the semiconductor device in FIGS. 13A and 13B includes the interlayer insulating layer 125. By using an insulating layer including hydrogen as the interlayer insulating layer 125, hydrogen can be supplied to the transistor 160 and the characteristics of the transistor 160 can be improved. As the interlayer insulating layer 125, for example, a silicon nitride layer including hydrogen, which is formed by a plasma CVD method, is given. Further, by using an insulating layer in which hydrogen is sufficiently reduced as the interlayer insulating layer 126, hydrogen which might adversely affect the characteristics of the transistor 162 can be prevented from being included in the transistor 162. As the interlayer insulating layer 126, for example, a silicon nitride layer formed by a sputtering method is given. When such a structure is employed, the characteristics of the transistor 160 and the transistor 162 can be improved sufficiently.

The semiconductor device in FIGS. 13A and 13B is different from the semiconductor devices described in the above embodiments also in that an insulating layer 143a and an insulating layer 143b are provided in the transistor 162. That is, the semiconductor device in FIGS. 13A and 13B includes the insulating layer 143a and the insulating layer 143b. By thus providing the insulating layer 143a and the insulating layer 143b, so-called gate capacitance formed by the gate electrode 148a and the source or drain electrode 142a (or the gate electrode 148a and the source or drain electrode 142b) can be reduced and the operation speed of the transistor 162 can be increased.

Furthermore, the semiconductor device in FIGS. 13A and 13B is different from the semiconductor devices described in the above embodiments also in that the source or drain electrode 154 of the transistor 160 is provided in contact with the wiring 156.

Note that as in Embodiment 5, the source or drain electrode 142a is formed directly on the gate electrode 110, whereby the transistor 160 in the lower portion and the transistor 162 in the upper portion are electrically connected to each other. With such a structure, the integration degree is increased as compared to the case where an electrode and a wiring are provided additionally. In addition, the manufacturing process is simplified.

Although the structure including all the differences is described in this embodiment, a structure including any one of the differences may be employed.

<Method for Manufacturing Semiconductor Device>

Next, an example of a method for manufacturing the semiconductor device will be described. Hereinafter, steps performed after formation of the transistor 160 in the lower portion and a method for manufacturing the transistor 162 in the upper portion will be described with reference to FIGS. 14A to 14D and FIGS. 15A to 15C. The transistor 160 in the lower portion can be manufactured by a method similar to that described in Embodiment 4. Embodiment 4 can be referred to for the details. Note that the three interlayer insulating layers 125, 126, and 128 are formed so as to cover the transistor 160 in this embodiment (cf. FIG. 9G). In addition, the source or drain electrode 130a and the source or drain electrode 130b are not formed in the manufacturing process of the transistor 160 in this embodiment (cf. FIG. 9H); however, even the structure in which the source or drain electrode 130a and the source or drain electrode 130b are not formed is called the transistor 160 for convenience.

The transistor 160 in the lower portion is formed by the method described in Embodiment 4 first, and then a portion of the transistor 160 over a top surface of the gate electrode 110 is removed. For the removing step, polishing treatment such as chemical mechanical polishing (CMP) treatment may be used. Thus, portions of the interlayer insulating layer 125, the interlayer insulating layer 126, and the interlayer insulating layer 128 over the top surface of the gate electrode 110 are removed. Note that the surface subjected to polishing treatment is planarized sufficiently, whereby an electrode, a wiring, an insulating layer, a semiconductor layer, and the like can be favorably formed in later steps.

Figure 14A:
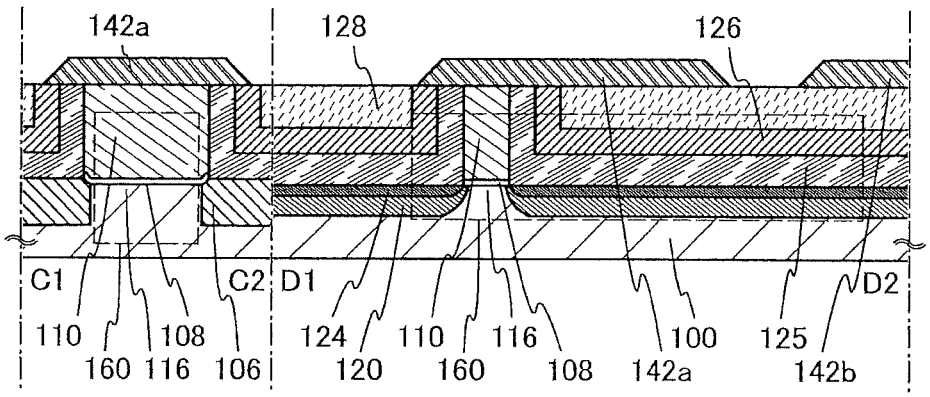
FIGS. 14A to 14D are cross-sectional views of a process of manufacturing a semiconductor device.

Then, a conductive layer is formed over the gate electrode 110, the interlayer insulating layer 125, the interlayer insulating layer 126, and the interlayer insulating layer 128, and the conductive layer is etched selectively, so that the source or drain electrode 142a and the source or drain electrode 142b are formed (see FIG. 14A). Here, the source or drain electrode 142a is formed so as to be directly in contact with the gate electrode 110.

The conductive layer used for forming the source or drain electrode 142a and the source or drain electrode 142b can be formed using a material similar to that described in Embodiment 4. Further, the conductive layer can be etched by a method similar to that described in Embodiment 4. Embodiment 4 can be referred to for the details.

Figure 14B:
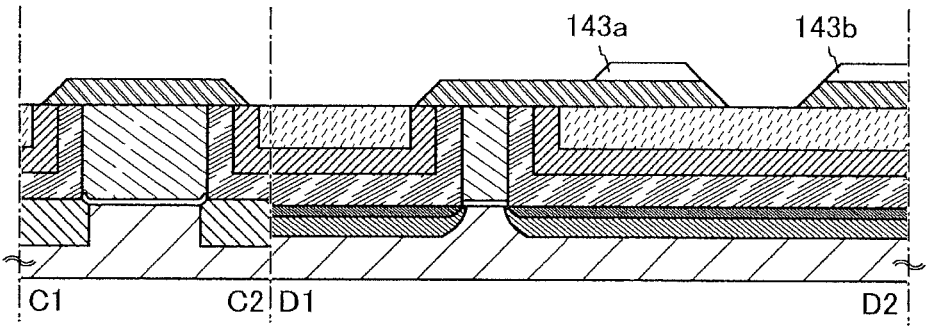

Next, an insulating layer is formed so as to cover the source or drain electrode 142a and the source or drain electrode 142b and etched selectively, so that the insulating layer 143a and the insulating layer 143b are formed over the source or drain electrode 142a and the source or drain electrode 142b, respectively (see FIG. 14B).

By providing the insulating layer 143a and the insulating layer 143b, parasitic capacitance formed between a gate electrode formed later and the source and drain electrodes 142a and 142b can be reduced.

Figure 14C:
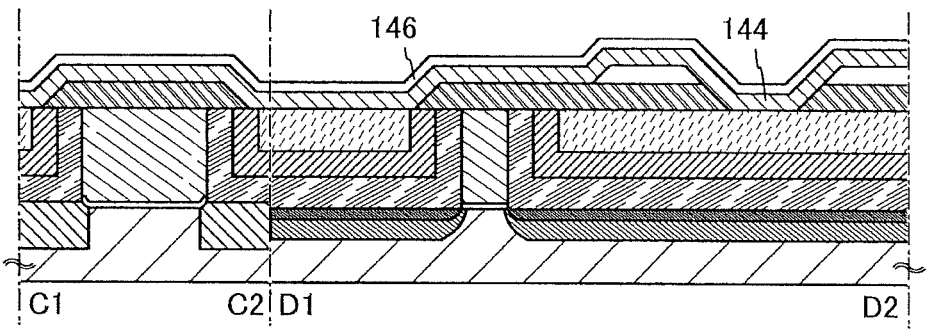

After that, the oxide semiconductor layer 144 is formed so as to cover the source or drain electrode 142a and the source or drain electrode 142b, and the gate insulating layer 146 is formed over the oxide semiconductor layer 144 (see FIG. 14C).

The oxide semiconductor layer 144 can be formed using the material and the method described in Embodiment 4. Further, the oxide semiconductor layer 144 is preferably subjected to heat treatment (first heat treatment). Embodiment 4 can be referred to for the details.

The gate insulating layer 146 can be formed using the material and the method described in Embodiment 4. After the gate insulating layer 146 is formed, heat treatment (second heat treatment) is preferably performed in an inert gas atmosphere or an oxygen atmosphere. Embodiment 4 can be referred to for the details.

Figure 14D:
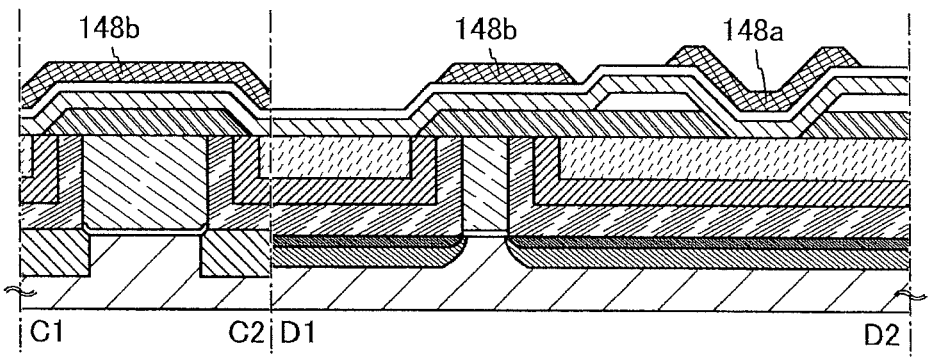

Then, over the gate insulating layer 146, the gate electrode 148a is formed in a region overlapping with a region of the transistor 162, which serves as a channel formation region, and the electrode 148b is formed in a region overlapping with the source or drain electrode 142a (see FIG. 14D).

The gate electrode 148a and the electrode 148b can be formed in such a manner that a conductive layer is formed over the gate insulating layer 146 and then etched selectively. The conductive layer to be the gate electrode 148a and the electrode 148b can be formed by a PVD method typified by a sputtering method or a CVD method such as a plasma CVD method. The details are similar to those of the source or drain electrode 142a or the like; thus, the description thereof can be referred to.

Figure 15A:
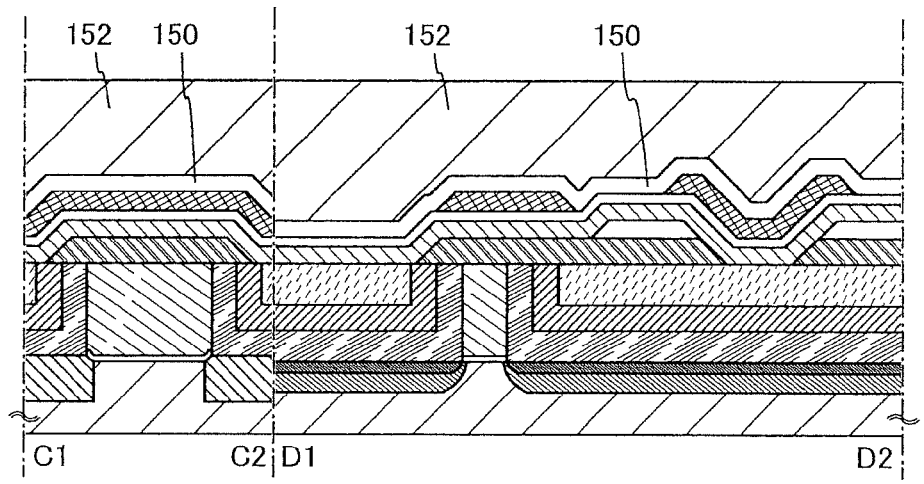
FIGS. 15A to 15C are cross-sectional views of a process of manufacturing a semiconductor device.

Next, the interlayer insulating layer 150 and the interlayer insulating layer 152 are formed over the gate insulating layer 146, the gate electrode 148a, and the electrode 148b (see FIG. 15A). The interlayer insulating layer 150 and the interlayer insulating layer 152 can be formed using the materials and the methods described in Embodiment 4. Embodiment 4 can be referred to for the details.

Note that the interlayer insulating layer 152 is preferably formed so as to have a planarized surface. By forming the interlayer insulating layer 152 so as to have a planarized surface, an electrode, a wiring, or the like can be favorably formed over the interlayer insulating layer 152 even in the case where the semiconductor device is reduced in size, for example. The interlayer insulating layer 152 can be planarized by a method such as chemical mechanical polishing (CMP) treatment.

Figure 15B:
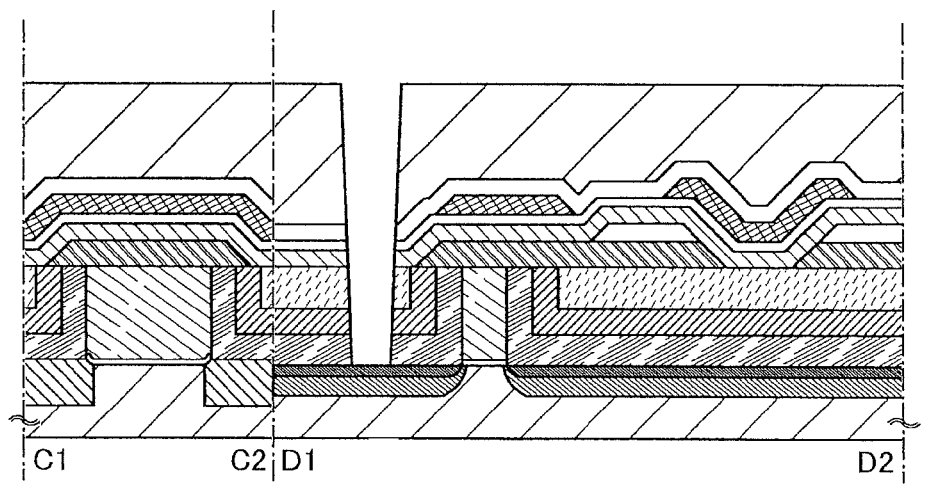
Figure 15C:
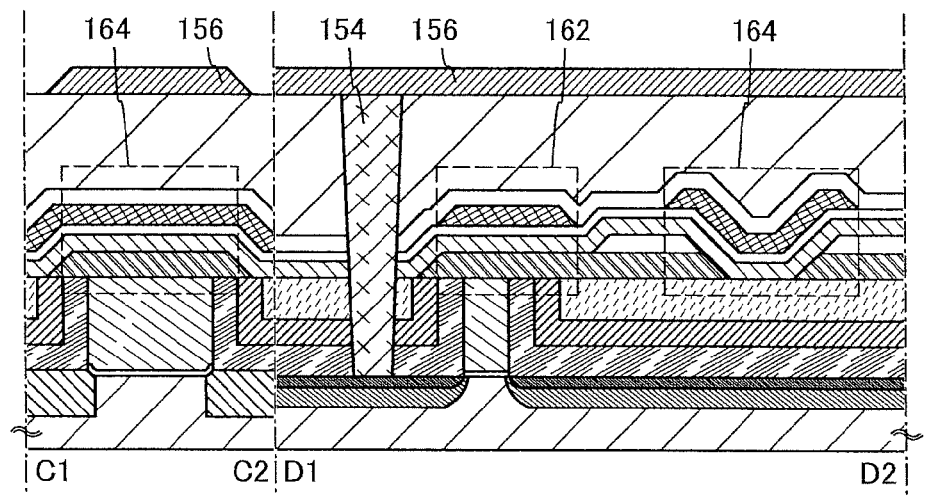

After that, the interlayer insulating layer 125, the interlayer insulating layer 126, the interlayer insulating layer 128, the oxide semiconductor layer 144, the gate insulating layer 146, the interlayer insulating layer 150, and the interlayer insulating layer 152 are selectively etched, so that an opening that reaches the metal compound region 124 of the transistor 160 is formed (see FIG. 15B). As the etching, either dry etching or wet etching may be used; in terms of microfabrication, dry etching is preferably used.

The source or drain electrode 154 is formed so as to be embedded in the opening. Then, the wiring 156 is formed to be connected to the source or drain electrode 154 (see FIG. 15C).

The source or drain electrode 154 can be formed in such a manner, for example, that a conductive layer is formed in a region including the opening by a PVD method, a CVD method, or the like and then part of the conductive layer is removed by etching treatment, CMP treatment, or the like. Specifically, it is possible to employ a method, for example, in which a thin titanium film is formed in a region including the opening by a PVD method, a thin titanium nitride film is formed by a CVD method, and then a tungsten film is formed so as to be embedded in the opening. Here, the titanium film formed by a PVD method has a function of reducing an oxide film (such as a natural oxide film) formed on a surface over which the titanium film is formed, thereby lowering the contact resistance with a lower electrode or the like (the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

The wiring 156 can be formed in such a manner that a conductive layer is formed in contact with the source or drain electrode 154 and then etched selectively. The conductive layer can be formed by a PVD method typified by a sputtering method or a CVD method such as a plasma CVD method. The details are similar to those of the source or drain electrode 142a or the like.

Through the above steps, the semiconductor device including the transistor 160, the transistor 162, and the capacitor 164 is completed.

Figure 16A:
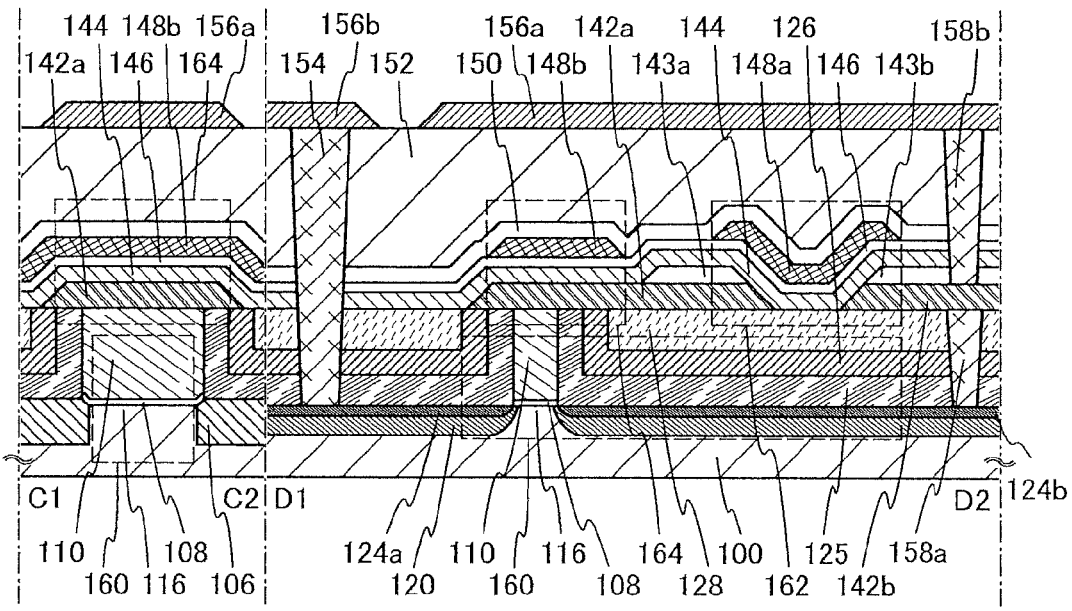
FIGS. 16A and 16B are a cross-sectional view and a plan view of a semiconductor device.
Figure 16B:
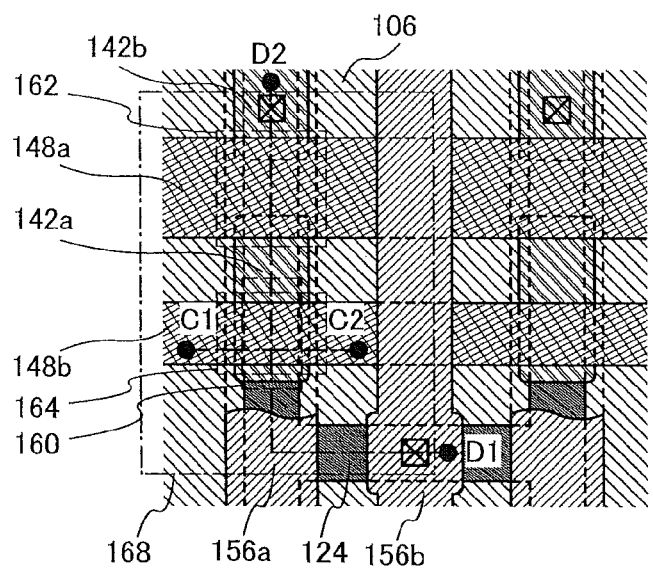

FIGS. 16A and 16B are a cross-sectional view and a plan view of the semiconductor device (corresponding to the semiconductor device in FIGS. 13A and 13B) described in Embodiment 3. Here, FIG. 16A corresponds to a cross section along line C1-C2 and line D1-D2 in FIG. 16B. In the plan view of FIG. 16B, some of components, such as the source or drain electrode 154 are omitted to avoid complexity. Further, part of a wiring 156a is indicated by a dashed line. Furthermore, in FIG. 16B, not only a memory cell 168 including the transistor 160, the transistor 162, and the capacitor 164 but also a memory cell which is adjacent to the memory cell 168 is illustrated.

As in the semiconductor device illustrated in FIGS. 13A and 13B, the semiconductor device illustrated in FIGS. 16A and 16B includes the transistor 160 including a semiconductor material other than an oxide semiconductor in a lower portion and the transistor 162 including an oxide semiconductor in an upper portion. A transistor including a semiconductor material other than an oxide semiconductor can easily operate at high speed. On the other hand, a transistor including an oxide semiconductor can hold electric charge for a long time owing to its characteristics.

Although all the transistors are n-channel transistors here, it is needless to say that p-channel transistors can be used. Since the technical nature of the disclosed invention is to use an oxide semiconductor in the transistor 162 so that data can be stored, it is not necessary to limit a specific structure of a semiconductor device to the structure described here.

In the semiconductor device illustrated in FIGS. 16A and 16B, the wiring 156a and a wiring 156b are formed over the interlayer insulating layer 152, which is different from the semiconductor device illustrated in FIGS. 13A and 13B. The wiring 156a is connected to the source or drain electrode 142b through an electrode 158b and to a metal compound region 124b through the source or drain electrode 158a. Further, the wiring 156b is connected to a metal compound region 124a through the source or drain electrode 154.

Here, the source or drain electrode 158a may be formed after formation of the interlayer insulating layer 128 in such a manner that the interlayer insulating layer 128, the interlayer insulating layer 126, and the interlayer insulating layer 125 are selectively etched to form an opening, a conductive layer is formed, and the conductive layer is selectively etched, which is a manner similar to that for forming the source or drain electrode 154. The source or drain electrode 158a thus formed is directly in contact with the source or drain electrode 142b.

The electrode 158b can be formed after formation of the interlayer insulating layer 152 in such a manner that the interlayer insulating layer 152, the interlayer insulating layer 150, the gate insulating layer 146, the oxide semiconductor layer 144, and the insulating layer 143b are selectively etched to form an opening, a conductive layer is formed, and the conductive layer is selectively etched, which is a manner similar to that for forming the source or drain electrode 154. Note that the source or drain electrode 154 and the electrode 158b may be formed in the same step or in different steps. Further, the source or drain electrode 154 may be formed to have a structure similar to that of the source or drain electrode 158a, that of the source or drain electrode 142b, or that of the electrode 158b.

Here, the transistor 160, the transistor 162, and the capacitor 164 included in the memory cell 168 of the semiconductor device illustrated in FIGS. 16A and 16B correspond to the first transistor, the second transistor, and the capacitor included in the memory cell 1200 described in Embodiment 3, respectively. In addition, the wiring 156a, the wiring 156b, the gate electrode 148a, and the electrode 148b illustrated in FIGS. 16A and 16B correspond to the bit line BL, the source line SL, the signal line S, and the word line WL described in Embodiment 3, respectively.

As in Embodiment 3, in the memory cell 168 of the semiconductor device illustrated in FIGS. 16A and 16B, the wiring 156a corresponding to the bit line BL also function as a wiring supplying a potential to a floating gate portion of the memory cell 168, so that the number of wirings per memory cell can be reduced. Thus, the area of memory cells can be reduced and memory capacity per unit area of the semiconductor device can be increased.

Further, as illustrated in FIGS. 16A and 16B, the wiring 156b corresponding to the source line SL is connected to not only the memory cell 168 but also the memory cell which is adjacent to the memory cell 168, so that the number of the source lines SL can be reduced approximately by half. Thus, the area of memory cells can be reduced and memory capacity per unit area of the semiconductor device can be increased.

Figure 17:
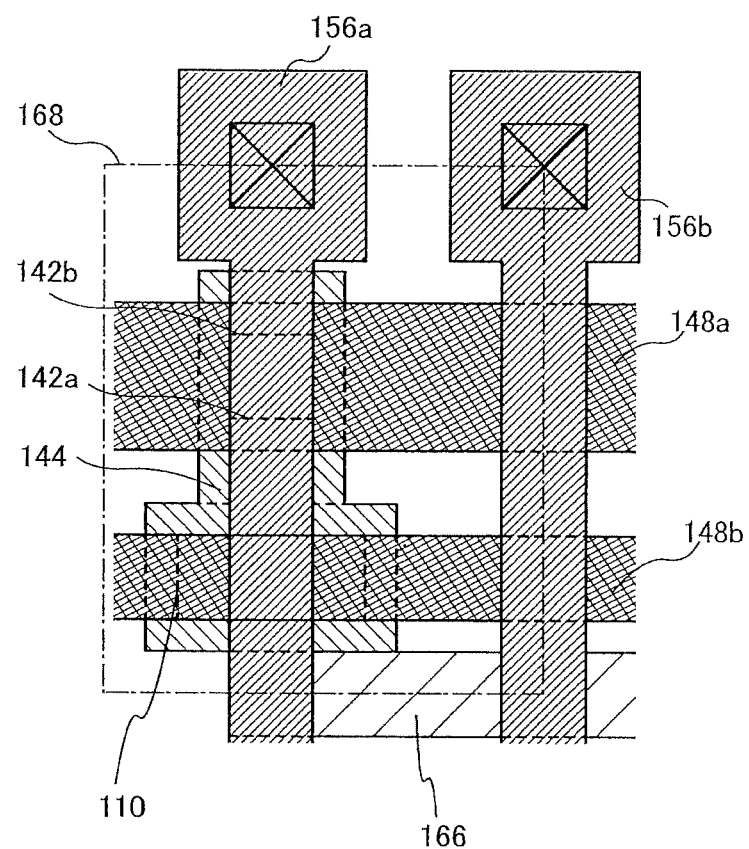
FIG. 17 is a plan view of a semiconductor device.

As for a planar layout of the semiconductor device, for example, a planar layout illustrated in FIG. 17 may be employed as well as the planar layout illustrated in FIG. 16B. The planar layout of the semiconductor device illustrated in FIG. 17 is an example of the case where an SOI substrate is used as the substrate 100 including a semiconductor material.

Since the SOI substrate is used as the substrate 100 including a semiconductor material in the semiconductor device illustrated in FIG. 17, a semiconductor layer 166 is patterned into an island shape. In addition, the oxide semiconductor layer 144 is patterned into an island shape.

Note that the semiconductor layer 166 is formed so as to overlap with part of the wiring 156a and part of the wiring 156b, the source or drain electrode 142a is formed so as to overlap with part of the oxide semiconductor layer 144, and the source or drain electrode 142b is formed so as to overlap with part of the wiring 156a.

With such planar layouts, the area of memory cells of the semiconductor device can be reduced and memory capacity per unit area of the semiconductor device can be increased.

In the semiconductor device described in this embodiment, for example, the transistor 162 and the capacitor 164 overlap with the transistor 160, the transistor 160 does not include a sidewall insulating layer, the source or drain electrode 142a is formed directly on the gate electrode 110; therefore, high integration is possible. Further, the manufacturing process is simplified.

Further, in the semiconductor device described in this embodiment, an insulating layer containing hydrogen and an insulating layer with a reduced hydrogen concentration are used as the interlayer insulating layer 125 and the interlayer insulating layer 126, respectively; thus, characteristics of the transistors 160 and 162 are improved. Owing to the insulating layers 143a and 143b, so-called gate capacitance is reduced and thus, an operating speed of the transistor 162 is increased.

The above features described in this embodiment make it possible to provide a semiconductor device having significantly excellent characteristics.

As described above, the structures, methods, and the like described in this embodiment can be combined as appropriate with any of the structures, methods, and the like described in the other embodiments.

Embodiment 7

In this embodiment, the cases where the semiconductor device described in any of the above embodiments is applied to an electronic device will be described with reference to FIGS. 18A to 18F. In this embodiment, the case where the above-described semiconductor device is applied to an electronic device such as a computer, a mobile phone (also referred to as a mobile telephone or a mobile telephone device), a portable information terminal (including a portable game machine, an audio reproducing device, and the like), a digital camera, a digital video camera, electronic paper, or a television device (also referred to as a television or a television receiver).

Figure 18A:
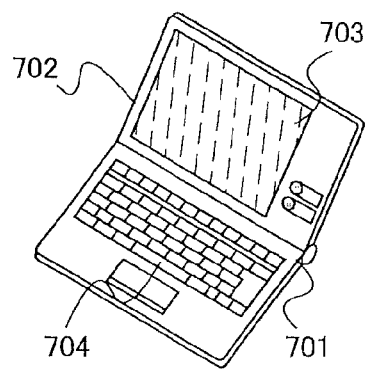
FIGS. 18A to 18F are each an electronic device including a semiconductor device.

FIG. 18A is a laptop computer including a housing 701, a housing 702, a display portion 703, a keyboard 704, and the like. The semiconductor devices described in any of the above embodiments are provided in the housing 701 and the housing 702. Therefore, the laptop computer can perform writing and reading data at high speed, store data for a long time, and have sufficiently low power consumption.

Figure 18D:
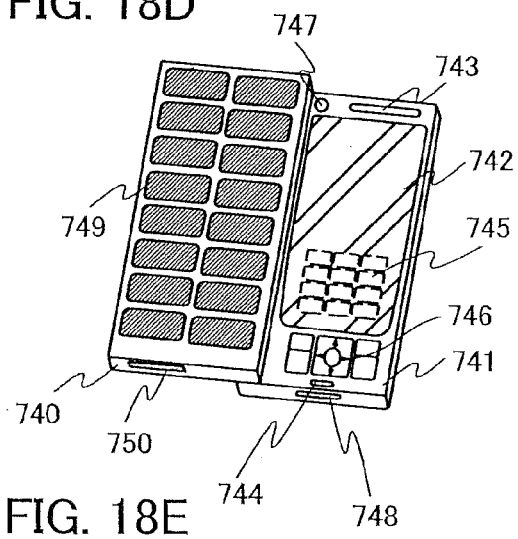
Figure 18B:
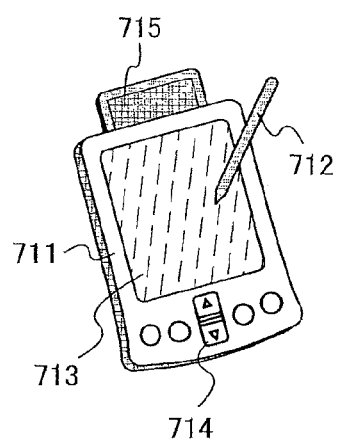

FIG. 18B is a portable information terminal (personal digital assistance (PDA)). A main body 711 is provided with a display portion 713, an external interface 715, operation buttons 714, and the like. Further, a stylus 712 for operating the portable information terminal or the like is also provided. The semiconductor device described in any of the above embodiments is provided in the main body 711. Therefore, the portable information terminal can perform writing and reading data at high speed, store data for a long time, and have sufficiently low power consumption.

Figure 18E:
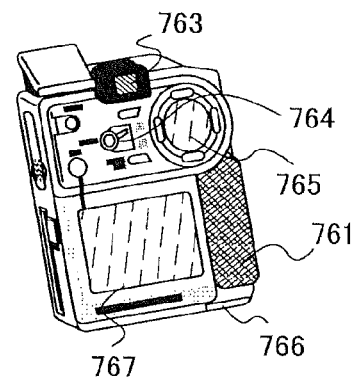
Figure 18C:
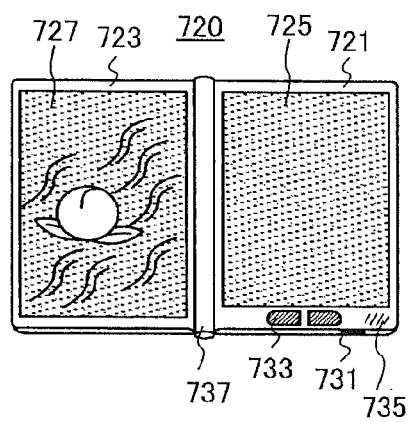

FIG. 18C is an e-book reader 720 mounting electronic paper. The e-book reader 720 has two housings of a housing 721 and a housing 723. The housing 721 and the housing 723 are provided with a display portion 725 and a display portion 727, respectively. The housing 721 and the housing 723 are connected by a hinge 737 and can be opened and closed with the hinge 737 as an axis. Further, the housing 721 is provided with a power switch 731, operation keys 733, a speaker 735, and the like. At least one of the housing 721 and the housing 723 is provided with the semiconductor device described in any of the above embodiments. Therefore, the e-book reader can perform writing and reading data at high speed, store data for a long time, and have sufficiently low power consumption.

FIG. 18D is a mobile phone including two housings of a housing 740 and a housing 741. Further, the housing 740 and the housing 741 in a state where they are developed as illustrated in FIG. 18D can shift by sliding so that one is lapped over the other; therefore, the size of the mobile phone can be reduced, which makes the mobile phone suitable for being carried. The housing 741 is provided with a display panel 742, a speaker 743, a microphone 744, a pointing device 746, a camera lens 747, an external connection terminal 748, and the like. The housing 740 is provided with a solar cell 749 that charges the mobile phone, an external memory slot 750, and the like. The display panel 742 has a touch panel function. A plurality of operation keys 745 which are displayed as images is illustrated by dashed lines in FIG. 18D. Further, an antenna is incorporated in the housing 741. At least one of the housing 740 and the housing 741 is provided with the semiconductor device described in any of the above embodiments. Therefore, the mobile phone can perform writing and reading data at high speed, store data for a long time, and have sufficiently low power consumption.

FIG. 18E is a digital camera including a main body 761, a display portion 767, an eyepiece 763, an operation switch 764, a display portion 765, a battery 766, and the like. The semiconductor device described in any of the above embodiments is provided in the main body 761. Therefore, the digital camera can perform writing and reading data at high speed, store data for a long time, and have sufficiently low power consumption.

Figure 18F:
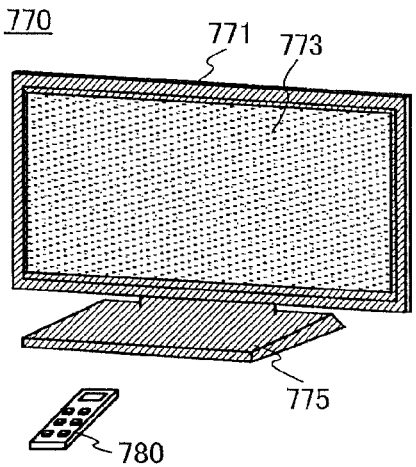

FIG. 18F is a television device 770 including a housing 771, a display portion 773, a stand 775, and the like. The television device 770 can be operated by an operation switch of the housing 771 or a separate remote controller 780. The semiconductor devices described in any of the above embodiments are provided for the housing 771 and the remote controller 780. Therefore, the television device can perform writing and reading data at high speed, store data for a long time, and have sufficiently low power consumption.

Thus, the semiconductor device according to any of the above embodiments is provided for the electronic devices described in this embodiment. Accordingly, electronic devices with low power consumption can be realized.

Example 1

The number of times a semiconductor device according to one embodiment of the disclosed invention can rewrite data was examined. In this example, the examination results will be described with reference to FIG. 19.

A semiconductor device used for the examination is the semiconductor device having the circuit configuration in FIG. 1A-1. Here, an oxide semiconductor was used for a transistor corresponding to the transistor 162, and a capacitor with a capacitance value of 0.33 pF was used as a capacitor corresponding to the capacitor 164.

The examination was performed by comparing the initial memory window width and the memory window width at the time after storing and writing data were repeated predetermined times. Data was stored and written by applying 0 V or 5 V to a wiring corresponding to the third wiring in FIG. 1A-1 and applying 0 V or 5 V to a wiring corresponding to the fourth wiring in FIG. 1A-1. When the potential of the wiring corresponding to the fourth wiring is 0 V, the transistor (writing transistor) corresponding to the transistor 162 is off; thus, a potential supplied to a floating gate portion FG is held. When the potential of the wiring corresponding to the fourth wiring is 5 V, the transistor corresponding to the transistor 162 is on; thus, a potential of the wiring corresponding to the third wiring is supplied to the floating gate portion FG.

The memory window width is one of indicators of the characteristics of a memory device. Here, the memory window width represents the shift amount ΔVcg in curves (Vcg–Id curves) between different memory states, which show the relation between the potential Vcg of a wiring corresponding to the fifth wiring and a drain current Id of a transistor (reading transistor) corresponding to the transistor 160. The different memory states mean a state where 0 V is applied to a floating gate portion FG (hereinafter referred to as a Low state) and a state where 5 V is applied to a floating gate portion FG (hereinafter referred to as a High state). That is, the memory window width can be checked by sweeping the potential Vcg in the Low state and in the High state. Here, the potential Vcg was swept in a range of higher than or equal to −2 V and lower than or equal to 5 V in the Low state, and the potential Vcg was swept in a range of higher than or equal to −7 V and lower than or equal to 0 V in the High state. In both cases, the potential Vds=1 V was satisfied.

Figure 19:
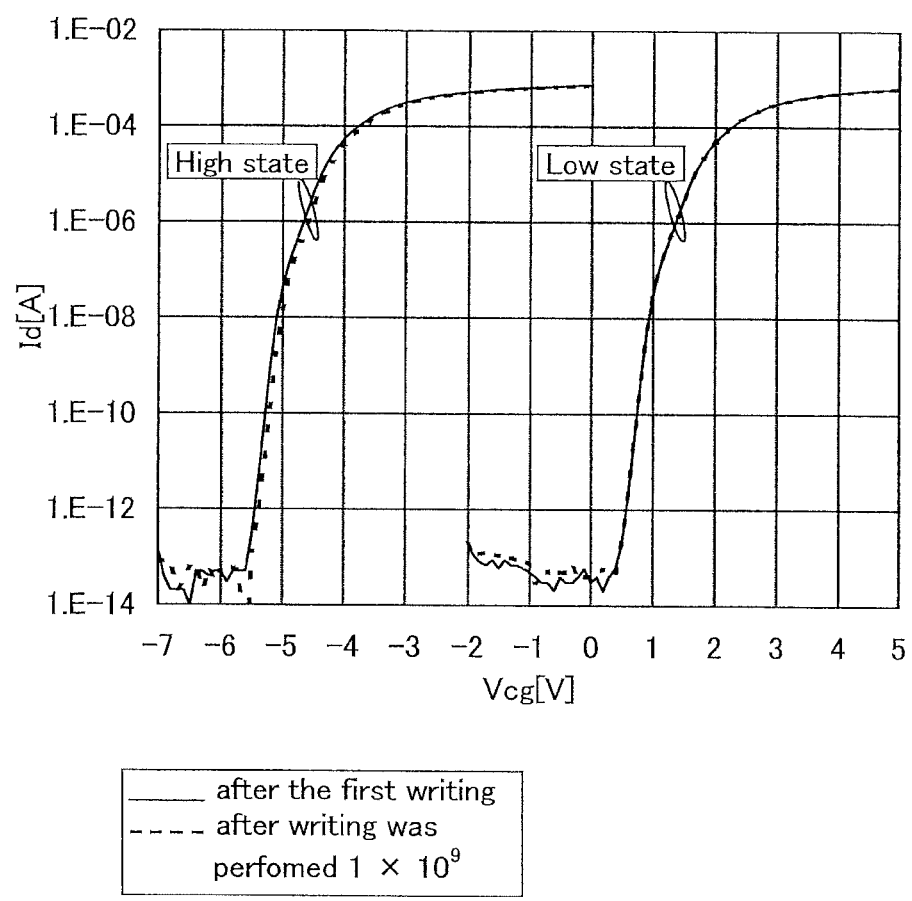
FIG. 19 is a graph showing measurement results of a memory window width.

FIG. 19 shows the initial memory window width and the examination results of the memory window width at the time after writing was performed $1 \times 10^9$ times. Note that in FIG. 19, the horizontal axis shows Vcg (V) and the vertical axis shows Id (A). Solid lines represent characteristic curves after the first writing, and dashed lines represent characteristic curves after writing was performed $1 \times 10^9$ times. In both the solid lines and the dashed lines, the left curves are the characteristic curves in the High state and the right curves are the characteristic curves in the Low state. According to FIG. 19, the memory window width was not changed after data was written $1 \times 10^9$ times, which means that at least during the period, the semiconductor device does not deteriorate.

As described above, in a semiconductor device according to one embodiment of the disclosed invention, characteristics are not changed even after data is stored and written $1 \times 10^9$ times and resistance against rewriting is very high. That is, it can be said that according to one embodiment of the disclosed invention, a significantly reliable semiconductor device can be realized.

Example 2

In this example, results obtained by measuring the off-state current of a transistor including a purified oxide semiconductor will be described.

Figure 20:
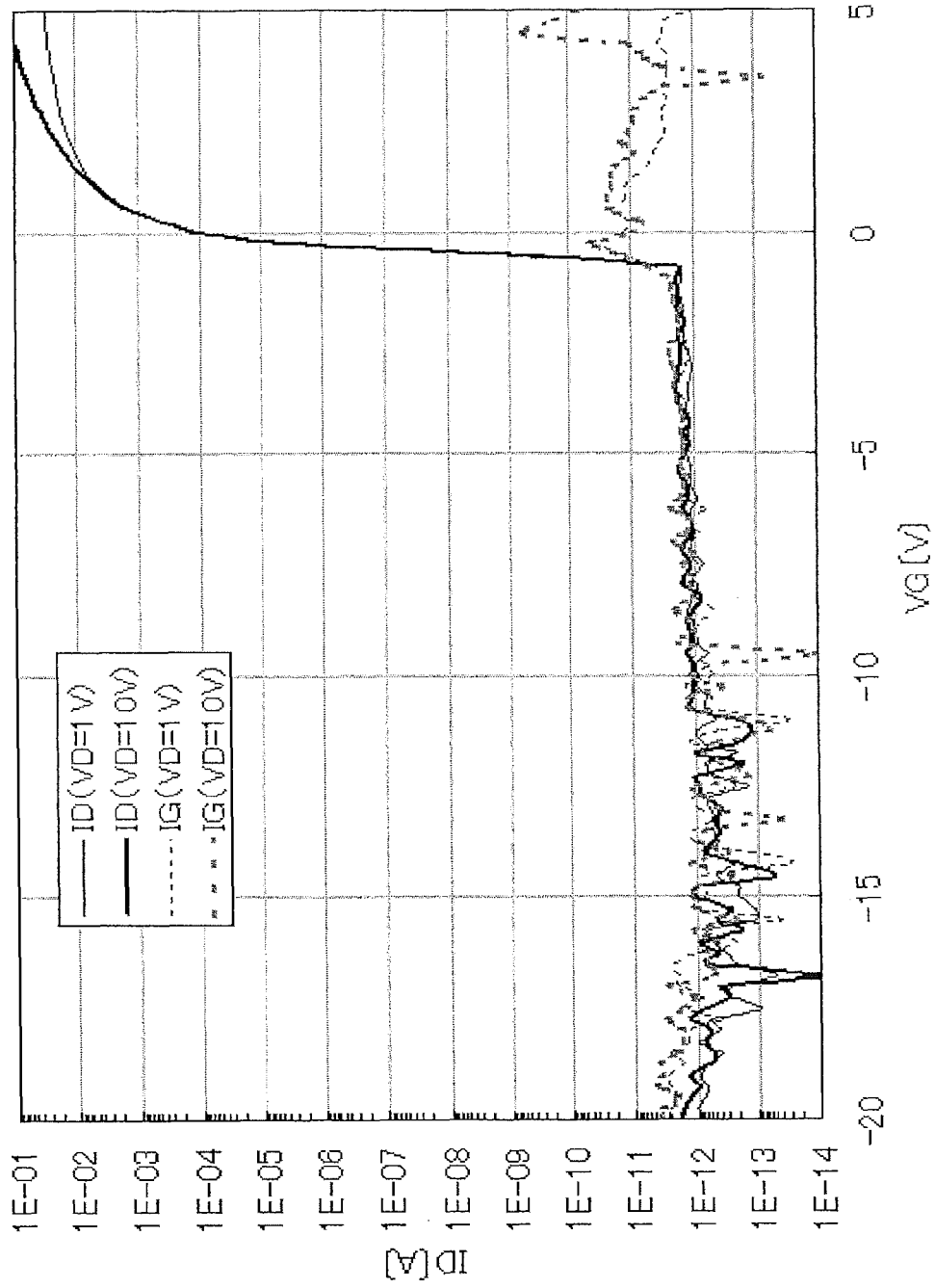
FIG. 20 is a graph showing the characteristics of a transistor including an oxide semiconductor.

In this example, a transistor including a purified oxide semiconductor was formed in accordance with Embodiment 4. First, a transistor with a channel width W of 1 m, which was sufficiently wide, was prepared in consideration of the very small off-state current of a transistor including a purified oxide semiconductor, and the off-state current was measured. FIG. 20 shows the results obtained by measurement of the off-state current of the transistor with a channel width W of 1 m. In FIG. 20, the horizontal axis shows a gate voltage VG and the vertical axis shows a drain current ID. In the case where the drain voltage VD is +1 V or +10 V and the gate voltage VG is within the range of −5 V to −20 V, the off-state current of the thin film transistor was found to be smaller than or equal to $1 \times 10^{-13}$ A which is the detection limit. Moreover, it was found that the off current density of the transistor is smaller than or equal to 1 aA/μm ($1 \times 10^{-18}$ A/μm).

Next will be described the results obtained by more accurately measuring the off-state current of a thin film transistor including a purified oxide semiconductor. As described above, the off-state current of the transistor including a purified oxide semiconductor was found to be smaller than or equal to $1 \times 10^{-13}$ A which is the measurement limit of measurement equipment. Here, the results obtained by measuring more accurate off-state current (the value smaller than or equal to the detection limit of measurement equipment in the above measurement), with the use of an element for characteristic evaluation, will be described.

First, the element for characteristic evaluation which was used in a method for measuring current will be described with reference to FIG. 21.

Figure 21:
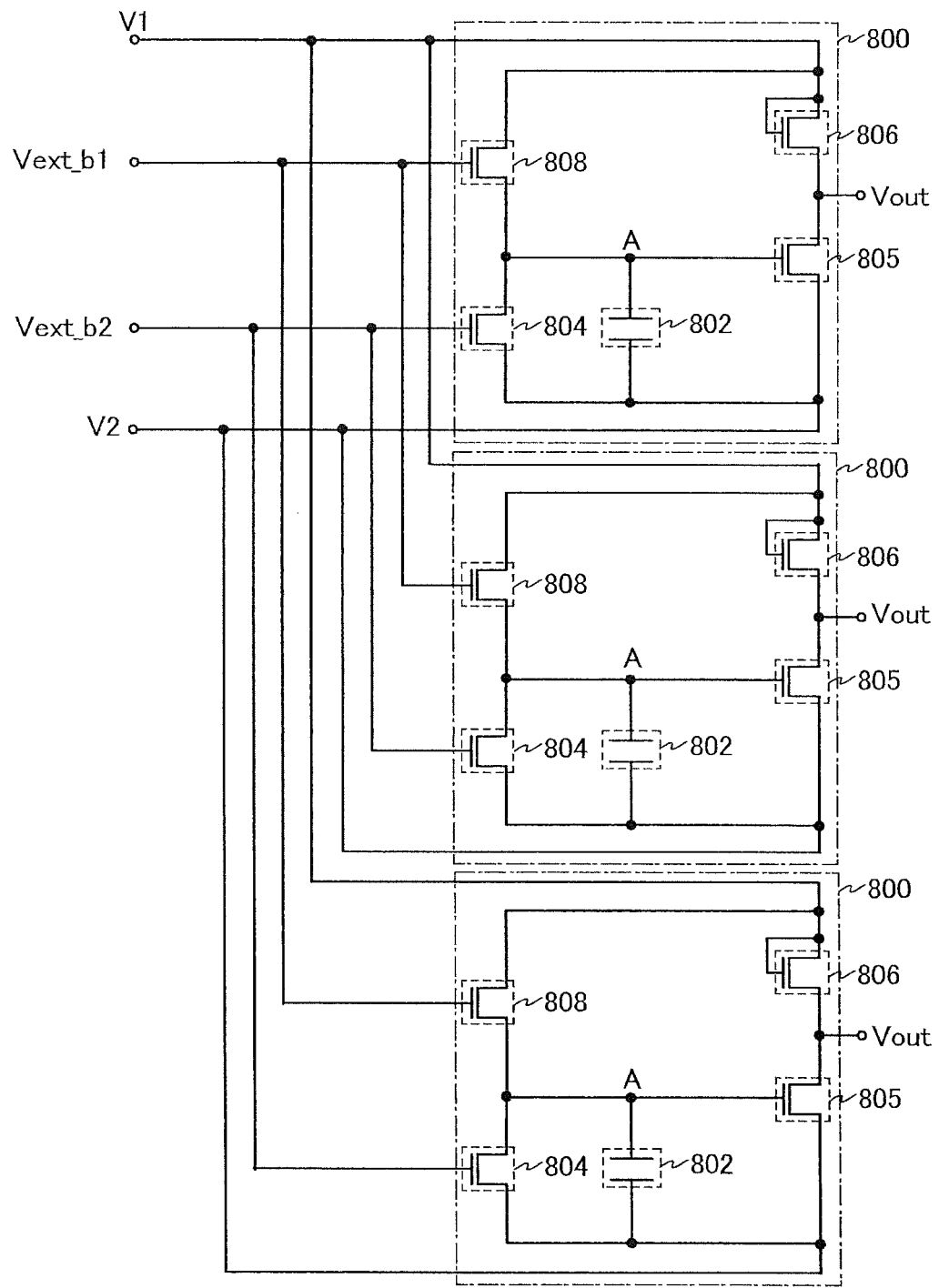
FIG. 21 is a circuit diagram for evaluating the characteristics of a transistor including an oxide semiconductor.

In the element for characteristic evaluation in FIG. 21, three measurement systems 800 are connected in parallel. The measurement system 800 includes a capacitor 802, a transistor 804, a transistor 805, a transistor 806, and a transistor 808. A transistor manufactured in accordance with Embodiment 4 was used as each of the transistors 804 and 808.

In the measurement system 800, one of a source terminal and a drain terminal of the transistor 804, one of terminals of the capacitor 802, and one of a source terminal and a drain terminal of the transistor 805 are electrically connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are electrically connected to one another. The other of the source terminal and the drain terminal of the transistor 808, one of a source terminal and a drain terminal of the transistor 806, and a gate terminal of the transistor 806 are electrically connected to a power source (for supplying V1). The other of the source terminal and the drain terminal of the transistor 805 and the other of the source terminal and the drain terminal of the transistor 806 are electrically connected to each other to output a potential Vout.

A potential Vext_b2 for controlling an on state and an off state of the transistor 804 is supplied to a gate terminal of the transistor 804. A potential Vext_b1 for controlling an on state and an off state of the transistor 808 is supplied to a gate terminal of the transistor 808. A potential Vout is output from the output terminal.

Next, a method for measuring current with the use of the measurement system will be described.

First, an initialization period in which a potential difference is applied to measure the off-state current will be described briefly. In the initialization period, the potential Vext_b1 for turning on the transistor 808 is input to the gate terminal of the transistor 808, and a potential V1 is supplied to a node A that is a node electrically connected to the other of the source terminal and the drain terminal of the transistor 804 (that is, the node electrically connected to one of the source terminal and the drain terminal of the transistor 808, the other of the terminals of the capacitor 802, and the gate terminal of the transistor 805). Here, the potential V1 is, for example, a high potential. The transistor 804 is off.

After that, the potential Vext_b1 for turning off the transistor 808 is input to the gate terminal of the transistor 808, so that the transistor 808 is turned off. After the transistor 808 is turned off, the potential V1 is set to low. The transistor 804 is still off. The potential V2 is the same potential as the potential V1. Thus, the initialization period is completed. In a state where the initialization period is completed, a potential difference is generated between the node A and one of a source terminal and a drain terminal of the transistor 804, and a potential difference is also generated between the node A and the other of the source terminal and the drain terminal of the transistor 808. Therefore, electric charge flows slightly through the transistor 804 and the transistor 808. In other words, an off-state current is generated.

Next, a measurement period of the off-state current will be described briefly. In the measurement period, the potential of one of the source terminal and the drain terminal of the transistor 804 (that is, the potential V2) and the potential of the other of the source terminal and the drain terminal of the transistor 808 (that is, the potential V1) are set to low and fixed. On the other hand, the potential of the node A is not fixed (the node A is in a floating state) in the measurement period. Accordingly, electric charge flows through the transistor 804 and the amount of electric charge held at the node A is changed as time goes by. Further, as the amount of electric charge held at the node A is changed, the potential of the node A varies. That is to say, the output potential Vout of the output terminal also varies.

Figure 22:
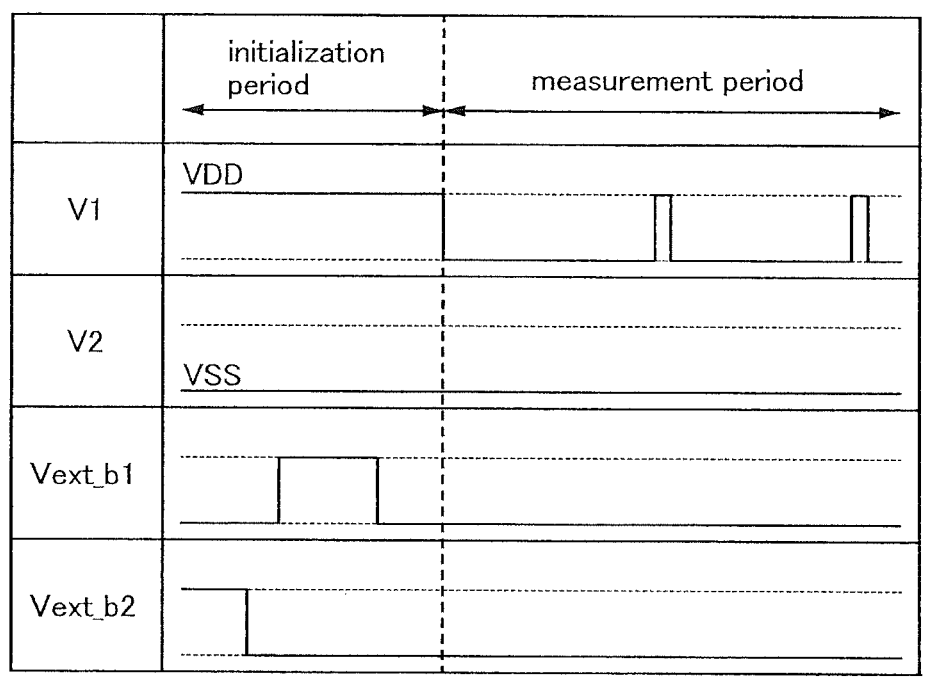
FIG. 22 is a timing chart for evaluating the characteristics of a transistor including an oxide semiconductor.

FIG. 22 shows details (timing chart) of the relation between potentials in the initialization period in which the potential difference is generated and in the following measurement period.

In the initialization period, first, the potential Vext_b2 is set to a potential (high potential) at which the transistor 804 is turned on. Thus, the potential of the node A comes to be V2, that is, a low potential (VSS). After that, the potential Vext_b2 is set to a potential (low potential) at which the transistor 804 is turned off, whereby the transistor 804 is turned off. Then, the potential Vext_b1 is set to a potential (high potential) at which the transistor 808 is turned on. Thus, the potential of the node A comes to be V1, that is, a high potential (VDD). After that, the potential Vext_b1 is set to a potential at which the transistor 808 is turned off. Accordingly, the node A is brought into a floating state and the initialization period is completed.

In the following measurement period, the potential V1 and the potential V2 are individually set to potentials at which electric charge flows to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set to be short so that the measurement is not influenced.

When a potential difference is generated as described above to start the measurement period, the amount of electric charge held at the node A is changed as time goes by and accordingly, the potential of the node A varies. This means that the potential of the gate terminal of the transistor 805 varies and thus, the output potential Vout of the output terminal also varies with the lapse of time.

A method for calculating the off-state current based on the obtained output potential Vout will be described below.

The relation between the potential $V_A$ of the node A and the output potential Vout is obtained in advance before the off-state current is calculated. Thus, the potential $V_A$ of the node A can be obtained based on the output potential Vout. From the relation described above, the potential $V_A$ of the node A can be expressed by the following equation as a function of the output potential Vout.

$$V_A = F(Vout) \quad \text{[Equation 1]}$$

Electric charge $Q_A$ of the node A is expressed by the following equation, using the potential $V_A$ of the node A, capacitance $C_A$ electrically connected to the node A, and a constant (const). Here, the capacitance $C_A$ electrically connected to the node A is the sum of capacitance of the capacitor 802 and the other capacitance.

$$Q_A = C_A V_A + \text{const} \quad \text{[Equation 2]}$$

Since a current $I_A$ of the node A is the time derivative of electric charge flowing to the node A (or electric charge flowing from the node A), the current $I_A$ of the node A is expressed by the following equation.

$$I_A \equiv \frac{\Delta Q_A}{\Delta t} = \frac{C_A \Delta F(Vout)}{\Delta t} \quad \text{[Equation 3]}$$

Thus, the current $I_A$ of the node A can be obtained based on the capacitor having the capacitance $C_A$ electrically connected to the node A and the output potential Vout of the output terminal.

By the method described above, a leakage current (off-state current) flowing between the source and the drain of the transistor which is off can be calculated.

In this example, the transistor 804 and the transistor 808 were manufactured using a purified oxide semiconductor. The ratio of the channel length (L) to the channel width (W) of the transistors was L/W=1/5. In the measurement systems 800 arranged in parallel, capacitance values of capacitors 802 were 100 fF, 1 pF, and 3 pF, respectively.

Note that the measurement according to this example, VDD was 5 V and VSS was 0 V. In the measurement period, the potential V1 was basically set to VSS and set to VDD only in a period of 100 msec every 10 to 300 seconds, and Vout was measured. Further, Δt used in calculation of the current I flowing through an element was approximately 30,000 seconds.

Figure 23:
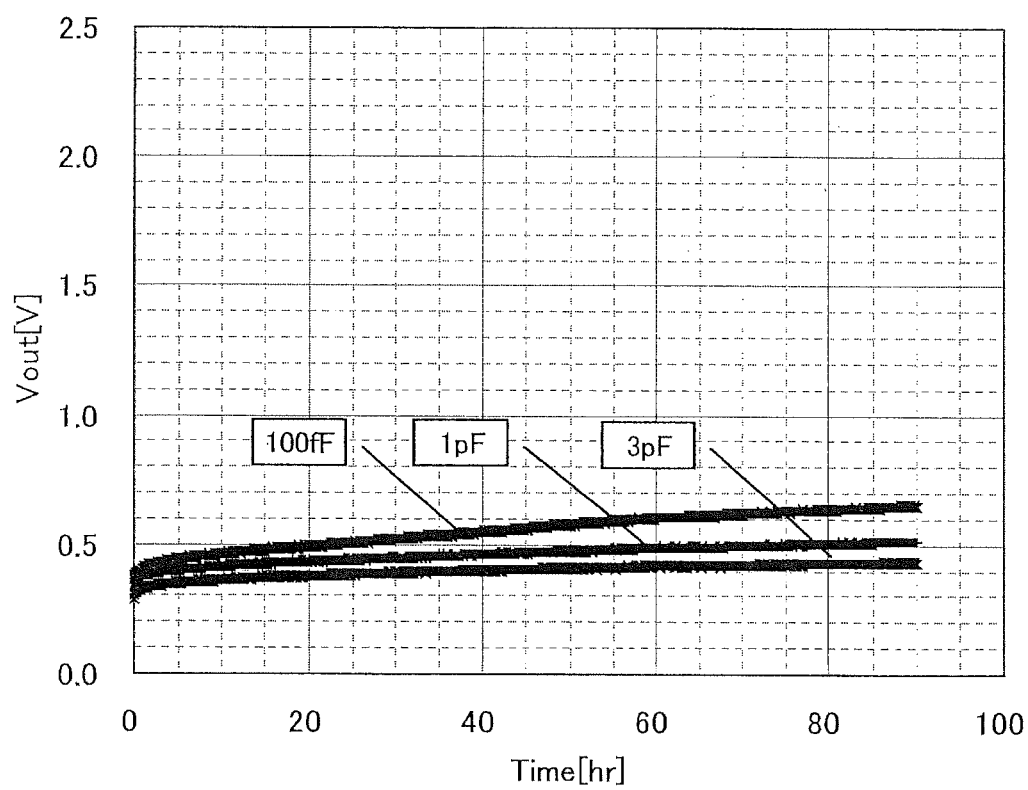
FIG. 23 is a graph showing the characteristics of a transistor including an oxide semiconductor.

FIG. 23 shows the relation between the output potential Vout and elapsed time Time in the current measurement. According to FIG. 23, the potential varies as time goes by.

Figure 24:
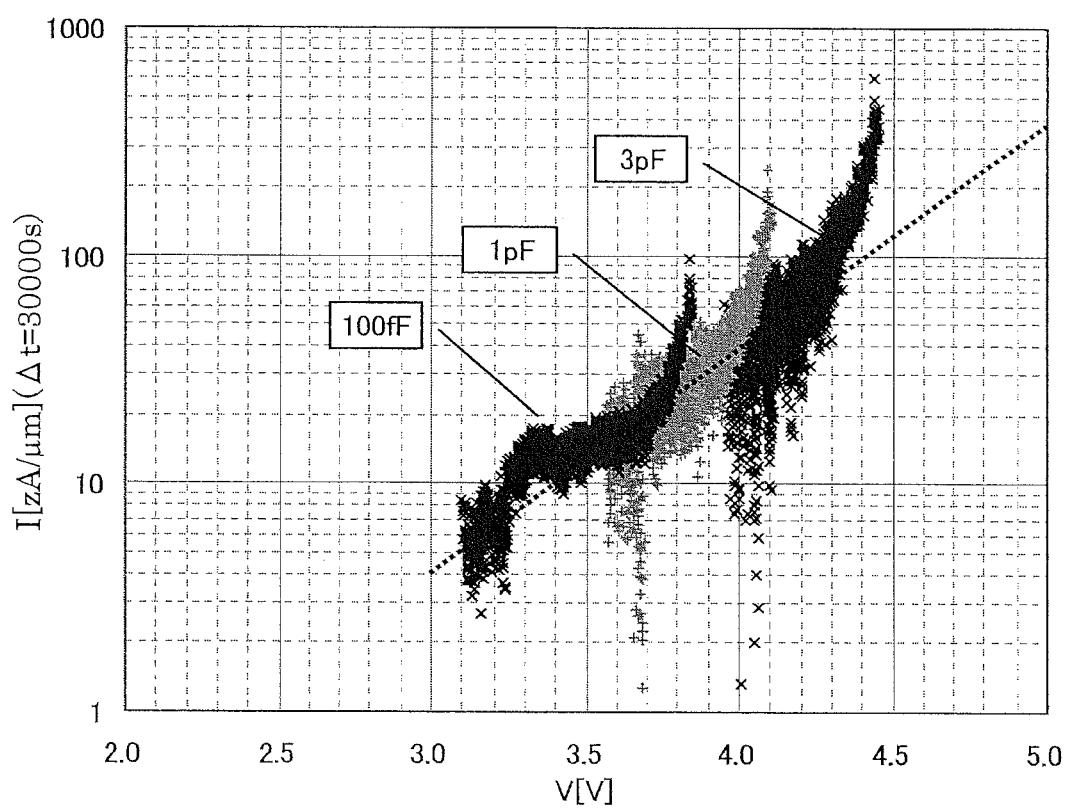
FIG. 24 is a graph showing the characteristics of a transistor including an oxide semiconductor.

FIG. 24 shows the off-state current calculated based on the above current measurement. Note that FIG. 24 shows the relation between a source-drain voltage V and an off-state current I. According to FIG. 24, an off-state current was approximately 40 zA/μm, when the source-drain voltage was 4 V. When the source-drain voltage was 3.1 V, the off-state current was smaller than or equal to 10 zA/μm. Note that 1 zA is equivalent to $10^{-21}$ A.

According to this example, it was confirmed that the off-state current can be sufficiently small in a transistor including a purified oxide semiconductor.

This application is based on Japanese Patent Application serial no. 2009-298891 filed with Japan Patent Office on Dec. 28, 2009, Japanese Patent Application serial no. 2010-007519 filed with Japan Patent Office on Jan. 15, 2010, and Japanese Patent Application serial no. 2010-160946 filed with Japan Patent Office on Jul. 15, 2010, the entire contents of which are hereby incorporated by reference.

The invention claimed is:
1. A semiconductor device comprising:
a first transistor;
a second transistor; and
a capacitor,
wherein an interlayer insulating layer is provided over the first transistor,
wherein the second transistor is provided over the interlayer insulating layer,
wherein a first electrode of the second transistor is electrically connected to a gate of the first transistor,
wherein a second electrode of the second transistor is electrically connected to a first electrode of the first transistor through a conductive film provided in an opening of the interlayer insulating layer,
wherein the capacitor is electrically connected to the gate of the first transistor, and
wherein the second transistor comprises:
an oxide semiconductor layer comprising indium, zinc, and oxide;
a gate insulating layer over the oxide semiconductor layer; and
a gate electrode over the gate insulating layer.

2. The semiconductor device according to claim 1, wherein the oxide semiconductor layer of the second transistor is provided over the first electrode of the second transistor and the second electrode of the second transistor.

3. The semiconductor device according to claim 1, wherein the first electrode of the second transistor is on and in direct contact with the gate of the first transistor.

4. The semiconductor device according to claim 1, wherein the oxide semiconductor layer comprises gallium.

5. The semiconductor device according to claim 1, wherein the gate of the first transistor and the second electrode of the capacitor overlap with each other.

6. The semiconductor device according to claim 1,
wherein the capacitor comprises:
a first electrode;
an insulating layer over the first electrode; and
a second electrode over the gate insulating layer,
wherein the first electrode of the capacitor is the first electrode of the second transistor, and
wherein the insulating layer of the capacitor is the gate insulating layer of the second transistor.

7. The semiconductor device according to claim 6, wherein the capacitor comprises the oxide semiconductor layer of the second transistor between the first electrode of the capacitor and the insulating layer of the capacitor.

8. The semiconductor device according to claim 1, wherein the gate electrode of the second transistor overlaps with the first electrode of the second transistor and the second electrode of the second transistor.

9. A semiconductor device comprising:
a first transistor;
a second transistor; and
a capacitor,
wherein an interlayer insulating layer is provided over the first transistor,
wherein the second transistor is provided over the interlayer insulating layer,
wherein a first electrode of the second transistor is electrically connected to a gate of the first transistor,
wherein a second electrode of the second transistor is electrically connected to a first electrode of the first transistor through a conductive film provided in an opening of the interlayer insulating layer,
wherein the capacitor is electrically connected to the gate of the first transistor,
wherein a channel formation region of the first transistor is provided in a semiconductor substrate, and
wherein the second transistor comprises:
an oxide semiconductor layer comprising indium, zinc, and oxide;
a gate insulating layer over the oxide semiconductor layer; and
a gate electrode over the gate insulating layer.

10. The semiconductor device according to claim 9, wherein the oxide semiconductor layer of the second transistor is provided over the first electrode of the second transistor and the second electrode of the second transistor.

11. The semiconductor device according to claim 9, wherein the first electrode of the second transistor is on and in direct contact with the gate of the first transistor.

12. The semiconductor device according to claim 9, wherein the oxide semiconductor layer comprises gallium.

13. The semiconductor device according to claim 9, wherein the gate of the first transistor and the second electrode of the capacitor overlap with each other.

14. The semiconductor device according to claim 9,
wherein the capacitor comprises:
a first electrode;
an insulating layer over the first electrode; and
a second electrode over the gate insulating layer,
wherein the first electrode of the capacitor is the first electrode of the second transistor, and
wherein the insulating layer of the capacitor is the gate insulating layer of the second transistor.

15. The semiconductor device according to claim 14, wherein the capacitor comprises the oxide semiconductor layer of the second transistor between the first electrode of the capacitor and the insulating layer of the capacitor.

16. The semiconductor device according to claim 9, wherein the gate electrode of the second transistor overlaps with the first electrode of the second transistor and the second electrode of the second transistor.

17. The semiconductor device according to claim 9, wherein the semiconductor substrate is a silicon substrate.

18. A semiconductor device comprising:
a first memory cell and a second memory cell adjacent to each other, each comprising:
a first transistor;
a second transistor; and
a capacitor,
wherein an interlayer insulating layer is provided over the first transistor,
wherein the second transistor is provided over the interlayer insulating layer,
wherein a first electrode of the second transistor is electrically connected to a gate of the first transistor,
wherein a second electrode of the second transistor is electrically connected to a first electrode of the first transistor through a conductive film provided in an opening of the interlayer insulating layer,
wherein the capacitor is electrically connected to the gate of the first transistor, and
wherein the second transistor comprises:
an oxide semiconductor layer comprising indium, zinc, and oxide;
a gate insulating layer over the oxide semiconductor layer; and
a gate electrode over the gate insulating layer, and wherein the second electrode of the first transistor is shared among the first memory cell and the second memory cell.

19. The semiconductor device according to claim 18, wherein the oxide semiconductor layer of the second transistor is provided over the first electrode of the second transistor and the second electrode of the second transistor.

20. The semiconductor device according to claim 18, wherein the first electrode of the second transistor is on and in direct contact with the gate of the first transistor.

21. The semiconductor device according to claim 18, wherein the oxide semiconductor layer comprises gallium.

22. The semiconductor device according to claim 18, wherein the gate of the first transistor and the second electrode of the capacitor overlap with each other.

23. The semiconductor device according to claim 18, wherein the capacitor comprises:
   a first electrode;
   an insulating layer over the first electrode; and
   a second electrode over the gate insulating layer,
   wherein the first electrode of the capacitor is the first electrode of the second transistor, and
   wherein the insulating layer of the capacitor is the gate insulating layer of the second transistor.

24. The semiconductor device according to claim 23, wherein the capacitor comprises the oxide semiconductor layer of the second transistor between the first electrode of the capacitor and the insulating layer of the capacitor.

25. The semiconductor device according to claim 18, wherein the gate electrode of the second transistor overlaps with the first electrode of the second transistor and the second electrode of the second transistor.

26. The semiconductor device according to claim 18, wherein a channel formation region of the first transistor is provided in a semiconductor substrate.

27. The semiconductor device according to claim 26, wherein the semiconductor substrate is a silicon substrate.

* * * * *